(12) United States Patent
Gibson et al.

(10) Patent No.: US 9,843,176 B2
(45) Date of Patent: Dec. 12, 2017

(54) INSTALLATION FIXTURE FOR INSTALLING DEVICES ON POWER LINES

(71) Applicant: SMART WIRES INC., Union City, CA (US)

(72) Inventors: Woody J. Gibson, San Francisco, CA (US); Michael L. Timmer, Kinderhook, IL (US); David L. Ayers, Hayes, VA (US); Julie A. Couillard, San Francisco, CA (US)

(73) Assignee: SMART WIRES INC., Union City, CA (US)

( * ) Notice: Subject to any disclaimer, the term of this patent is extended or adjusted under 35 U.S.C. 154(b) by 0 days.

(21) Appl. No.: 14/732,992

(22) Filed: Jun. 8, 2015

(65) Prior Publication Data
US 2015/0270689 A1    Sep. 24, 2015

Related U.S. Application Data

(63) Continuation of application No. PCT/US2013/075608, filed on Dec. 17, 2013.
(Continued)

(51) Int. Cl.
*H02G 1/00* (2006.01)
*H02G 1/02* (2006.01)
(Continued)

(52) U.S. Cl.
CPC ............. *H02G 1/02* (2013.01); *G01R 15/183* (2013.01); *H02G 1/04* (2013.01); *H02J 11/00* (2013.01); *G01R 15/146* (2013.01); *H02G 7/14* (2013.01); *Y10T 29/4902* (2015.01); *Y10T 29/53265* (2015.01)

(58) Field of Classification Search
CPC ............. H02G 1/00–1/16; H02G 7/14; G01R 15/14–15/26; G01R 15/183; G01R 15/146; H02J 11/00
USPC ......... 29/745, 748, 729, 760, 828, 862, 857, 29/874, 876
See application file for complete search history.

(56) References Cited

U.S. PATENT DOCUMENTS 1,672,476 A * 6/1928 Tipsord .................... H02G 1/02
174/5 R
1,872,605 A    8/1932 Pohlhausen
(Continued)

FOREIGN PATENT DOCUMENTS

FR    2798783 A1    3/2001
WO    2014035881 A1    3/2014

*Primary Examiner* — Peter DungBa Vo
*Assistant Examiner* — Kaying Kue
(74) *Attorney, Agent, or Firm* — Marsh Fischmann & Breyfogle LLP

(57) ABSTRACT

An installation fixture for installing a device on a power line is disclosed. The fixture includes a lower cradle that may receive one part of the device, an upper cradle that may receive another part of the device, and a base. The installation fixture may be installed on a worker carrier for a boom truck or the like. The orientation of the lower cradle may be adjusted relative to the base to facilitate the installation on the power line. The upper cradle may be moved between an open position (where the parts may be loaded into the fixture) and a closed position (where the power line is captured between the two parts of the device) and at which time that parts can be secured together.

30 Claims, 49 Drawing Sheets

Related U.S. Application Data

(60) Provisional application No. 61/738,900, filed on Dec. 18, 2012.

(51) Int. Cl.
  *H02G 1/04* (2006.01)
  *G01R 15/18* (2006.01)
  *H02J 11/00* (2006.01)
  *H02G 7/14* (2006.01)
  *G01R 15/14* (2006.01)

(56) References Cited

U.S. PATENT DOCUMENTS

| | | | | |
|---|---|---|---|---|
| 2,414,136 A | | 1/1947 | Bodendieck | |
| 2,946,559 A | * | 7/1960 | Pickett | B65H 57/14 254/134.3 PA |
| 3,810,289 A | * | 5/1974 | Hannabery | H01R 43/00 29/56.6 |
| 3,816,897 A | * | 6/1974 | Long | H01R 43/01 29/56.6 |
| 3,999,269 A | * | 12/1976 | Holt | H01R 43/01 29/564.2 |
| 4,005,516 A | * | 2/1977 | Bakermans | H01R 43/015 29/749 |
| 4,025,998 A | * | 5/1977 | Eppler | H02G 1/005 29/566.4 |
| 4,030,702 A | * | 6/1977 | Ware | G02B 6/4464 254/134.4 |
| 4,122,599 A | * | 10/1978 | Lunycz | H05K 13/0447 29/267 |
| 4,323,225 A | * | 4/1982 | Saita | H01J 9/247 269/254 CS |
| 4,386,461 A | * | 6/1983 | Plummer | H01R 43/015 29/749 |
| 4,402,122 A | * | 9/1983 | Hawkins | B25B 31/00 29/243.56 |
| 4,627,314 A | * | 12/1986 | Wiebe | H02G 1/1212 81/9.43 |
| 4,630,362 A | * | 12/1986 | Bauer | H01R 43/0484 227/103 |
| 4,829,298 A | * | 5/1989 | Fernandes | G01K 1/024 340/870.16 |
| 5,012,666 A | * | 5/1991 | Chen | H01R 43/042 29/751 |
| 5,103,554 A | * | 4/1992 | Homefeld | H02G 1/14 248/61 |
| 5,103,739 A | * | 4/1992 | Sawada | H02G 1/02 104/112 |
| 5,228,325 A | * | 7/1993 | Wiebe | B25B 7/04 29/751 |
| 5,257,775 A | * | 11/1993 | Burns | E04B 9/006 269/102 |
| 5,348,274 A | * | 9/1994 | Breen | H02G 1/00 269/3 |
| 5,361,509 A | * | 11/1994 | Wheeler, Sr. | B25H 7/00 269/904 |
| 5,371,942 A | * | 12/1994 | Gold | B60R 16/0207 29/771 |
| 5,412,862 A | * | 5/1995 | Comerci | H01R 43/015 29/751 |
| 5,500,998 A | * | 3/1996 | Schmode | H01R 43/0421 29/566.4 |
| 5,533,255 A | * | 7/1996 | Perugini | H01R 43/002 29/278 |
| 5,649,357 A | * | 7/1997 | Chapman | H01R 43/01 29/750 |
| 5,737,830 A | * | 4/1998 | Yeomans | H01R 43/055 29/33 M |
| 5,896,644 A | * | 4/1999 | Lucenta | H01R 43/28 29/564.4 |
| 6,091,670 A | * | 7/2000 | Oliver | G01V 1/201 367/20 |
| 6,219,907 B1 | * | 4/2001 | Frye | H02G 3/0487 174/5 R |
| 6,292,436 B1 | * | 9/2001 | Rau | G01V 1/3826 114/245 |
| 6,386,512 B1 | * | 5/2002 | Pecot | B65H 51/10 254/134.4 |
| 6,401,325 B1 | * | 6/2002 | Fidtje | H01R 4/4845 29/566.4 |
| 6,517,052 B1 | * | 2/2003 | Lake | H02G 1/06 254/134.3 PA |
| 6,691,402 B2 | * | 2/2004 | Chang | B25B 5/08 29/748 |
| 6,729,606 B1 | * | 5/2004 | Durin | B65H 57/14 242/615.2 |
| 6,915,828 B2 | * | 7/2005 | Takeuchi | B26F 1/02 156/251 |
| 7,007,929 B2 | * | 3/2006 | Kwon | H02G 1/04 226/190 |
| 7,105,952 B2 | | 9/2006 | Divan et al. | |
| 7,237,426 B2 | * | 7/2007 | Baker | H01R 43/042 29/751 |
| 7,256,350 B2 | * | 8/2007 | Stagi | H02G 1/14 174/92 |
| 7,518,529 B2 | * | 4/2009 | O'Sullivan | G01R 15/142 324/126 |
| 7,823,271 B2 | * | 11/2010 | Xie | H01R 43/048 29/237 |
| 7,835,128 B2 | | 11/2010 | Divan et al. | |
| 8,052,098 B1 | * | 11/2011 | Kowaleski | E04D 15/00 248/237 |
| 8,356,402 B2 | * | 1/2013 | Xie | B25B 27/10 29/237 |
| 8,760,151 B2 | * | 6/2014 | McBee | H01F 27/06 324/117 R |
| 8,816,527 B1 | * | 8/2014 | Ramsay | H02J 3/26 307/14 |
| 9,172,246 B2 | * | 10/2015 | Ramsay | H02J 3/26 |
| 9,182,429 B2 | * | 11/2015 | Saxby | G01R 21/00 |
| 9,217,762 B2 | * | 12/2015 | Kreikebaum | G01R 15/202 |
| D769,110 S | * | 10/2016 | Altemus | D8/394 |
| 9,535,097 B2 | * | 1/2017 | Davis | G01R 15/142 |
| 2004/0168816 A1 | * | 9/2004 | Kwon | H02G 1/02 174/40 CC |
| 2006/0248711 A1 | * | 11/2006 | Lu | H05K 5/0013 29/760 |
| 2007/0240301 A1 | * | 10/2007 | Johnson | H01R 4/5083 29/748 |
| 2007/0285201 A1 | * | 12/2007 | Zumoto | H01F 38/30 336/107 |
| 2008/0246507 A1 | | 10/2008 | Gunn et al. | |
| 2009/0188349 A1 | * | 7/2009 | Hanning | H02G 1/1241 81/9.43 |
| 2011/0154651 A1 | * | 6/2011 | Liu | H01R 9/05 29/750 |
| 2012/0090145 A1 | * | 4/2012 | Montena | G02B 6/4465 29/428 |
| 2012/0268106 A1 | * | 10/2012 | Blake, Jr. | G01R 15/186 324/127 |
| 2013/0063140 A1 | * | 3/2013 | Nagai | G01R 15/186 324/244 |
| 2013/0187636 A1 | * | 7/2013 | Kast | G01R 21/00 324/127 |
| 2013/0219709 A1 | * | 8/2013 | Chiang | G06K 13/0806 29/758 |
| 2014/0176164 A1 | * | 6/2014 | Davis | A46B 9/028 324/709 |

\* cited by examiner

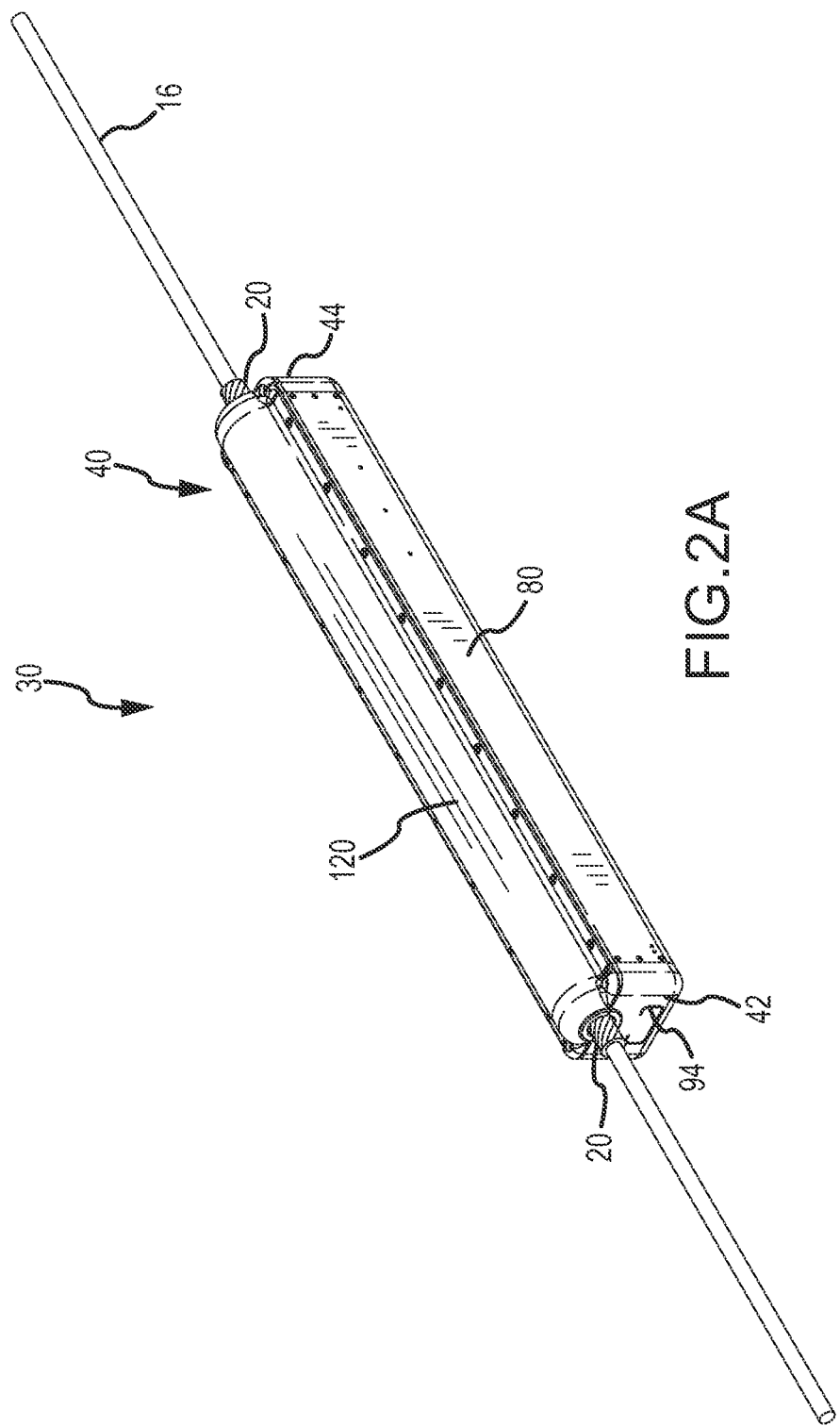

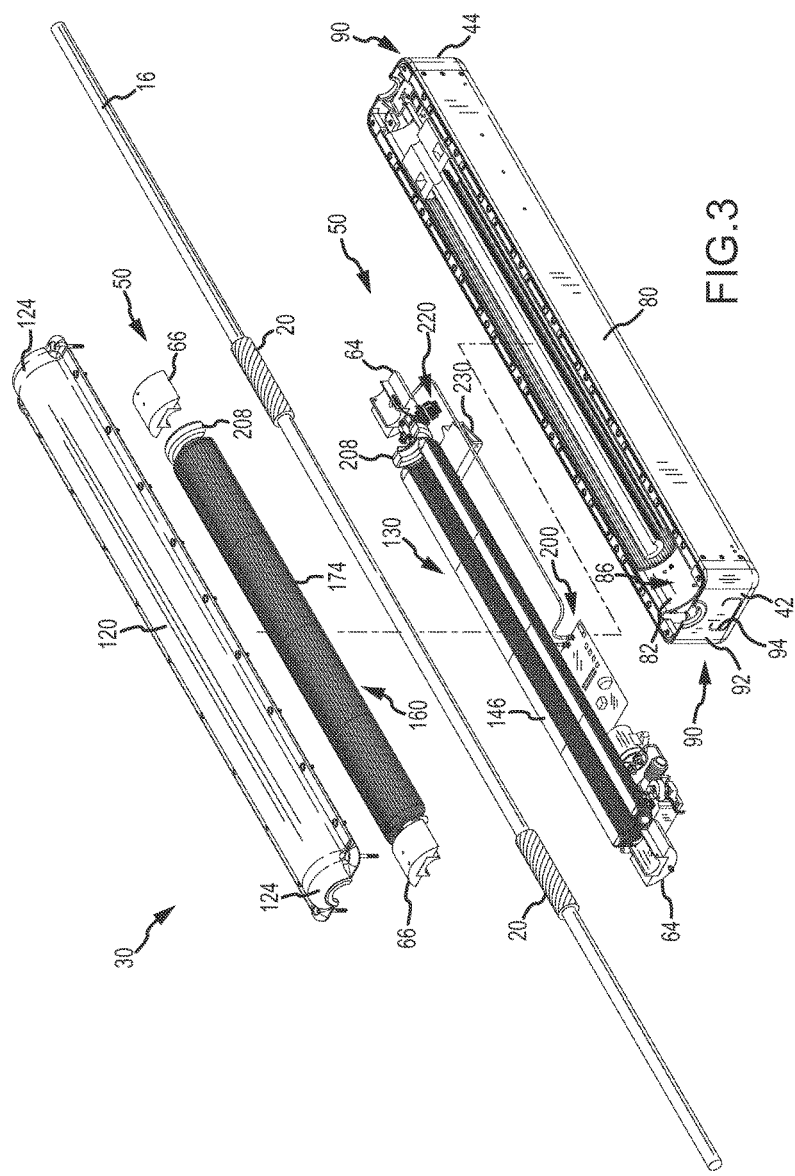

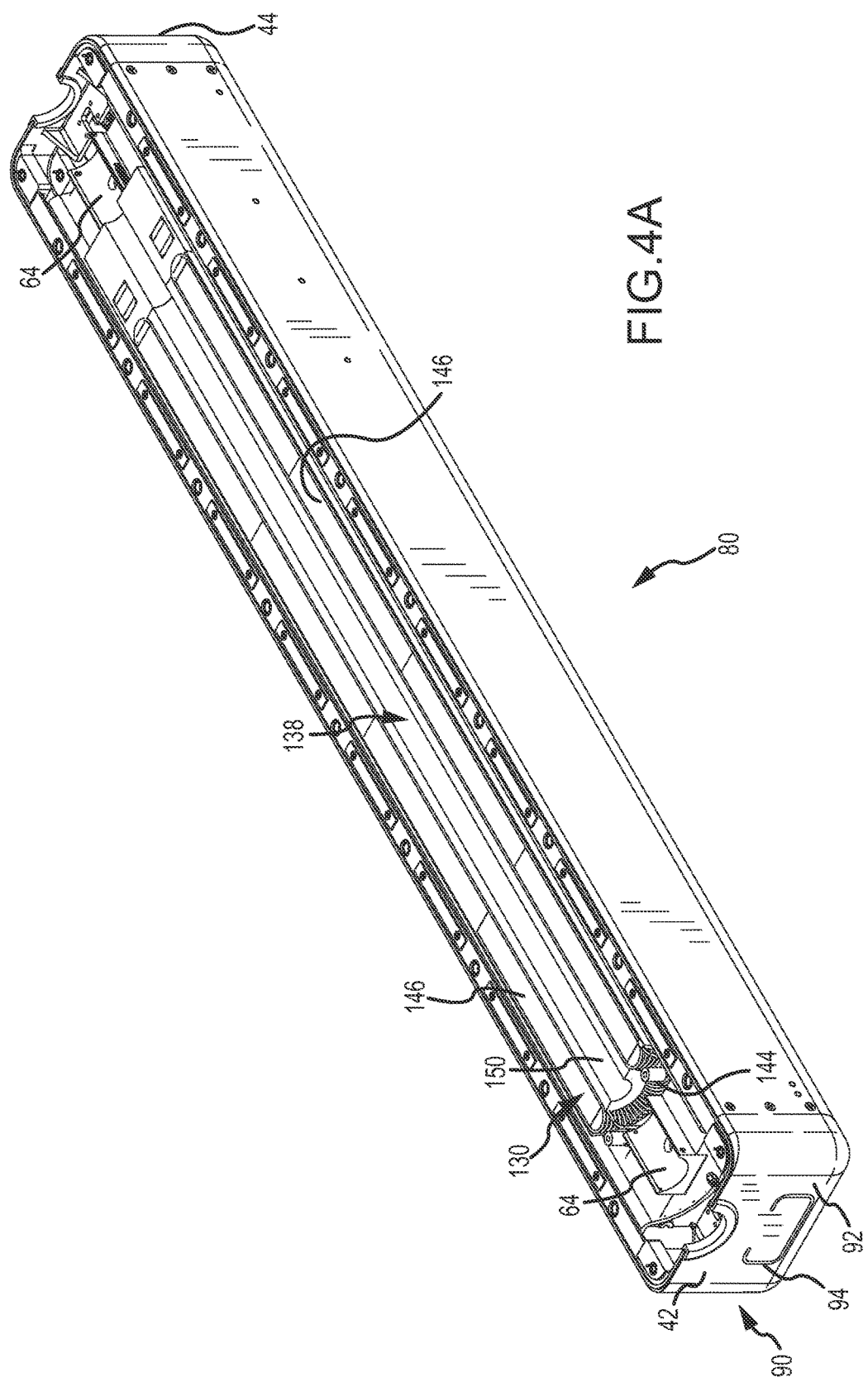

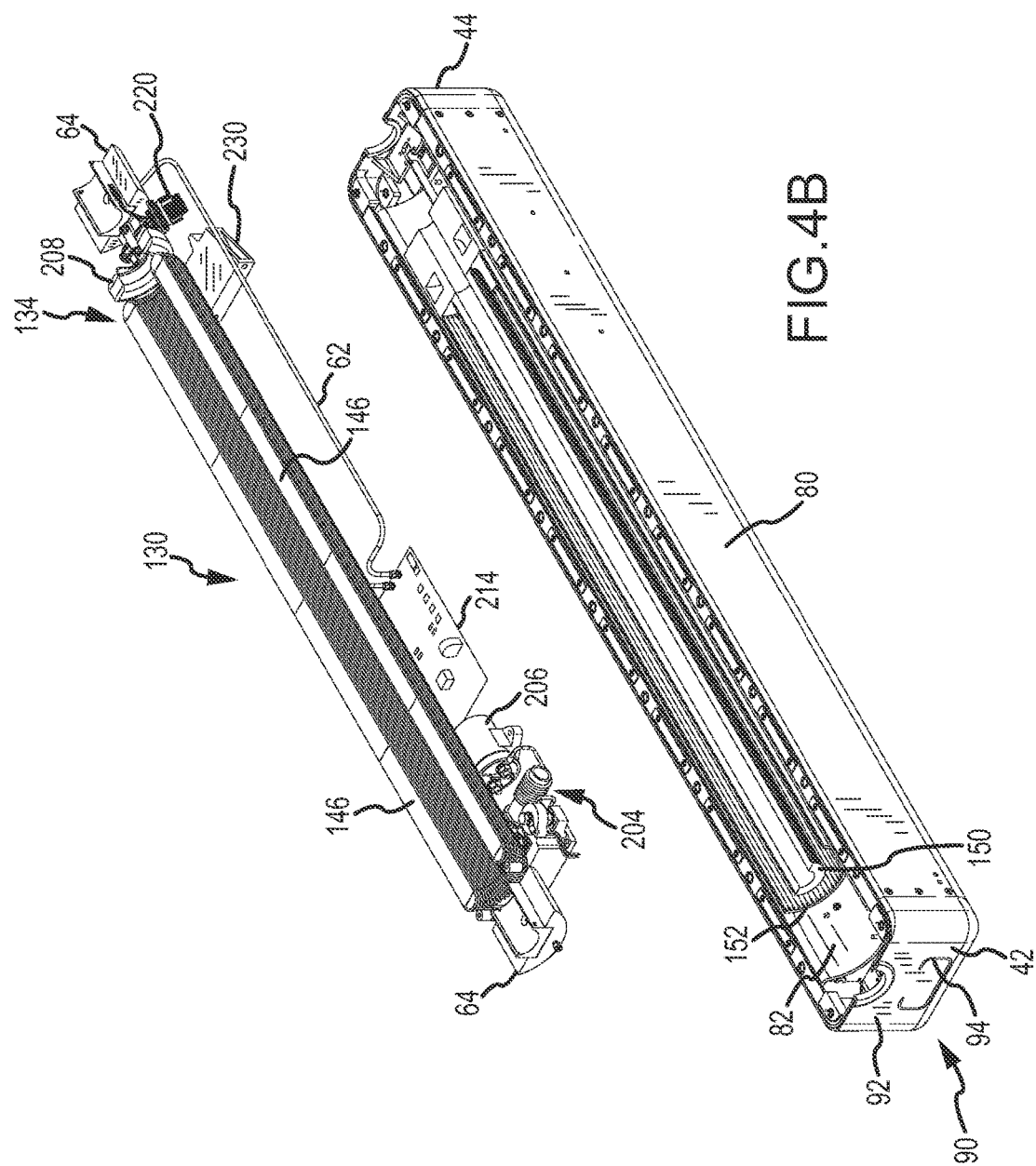

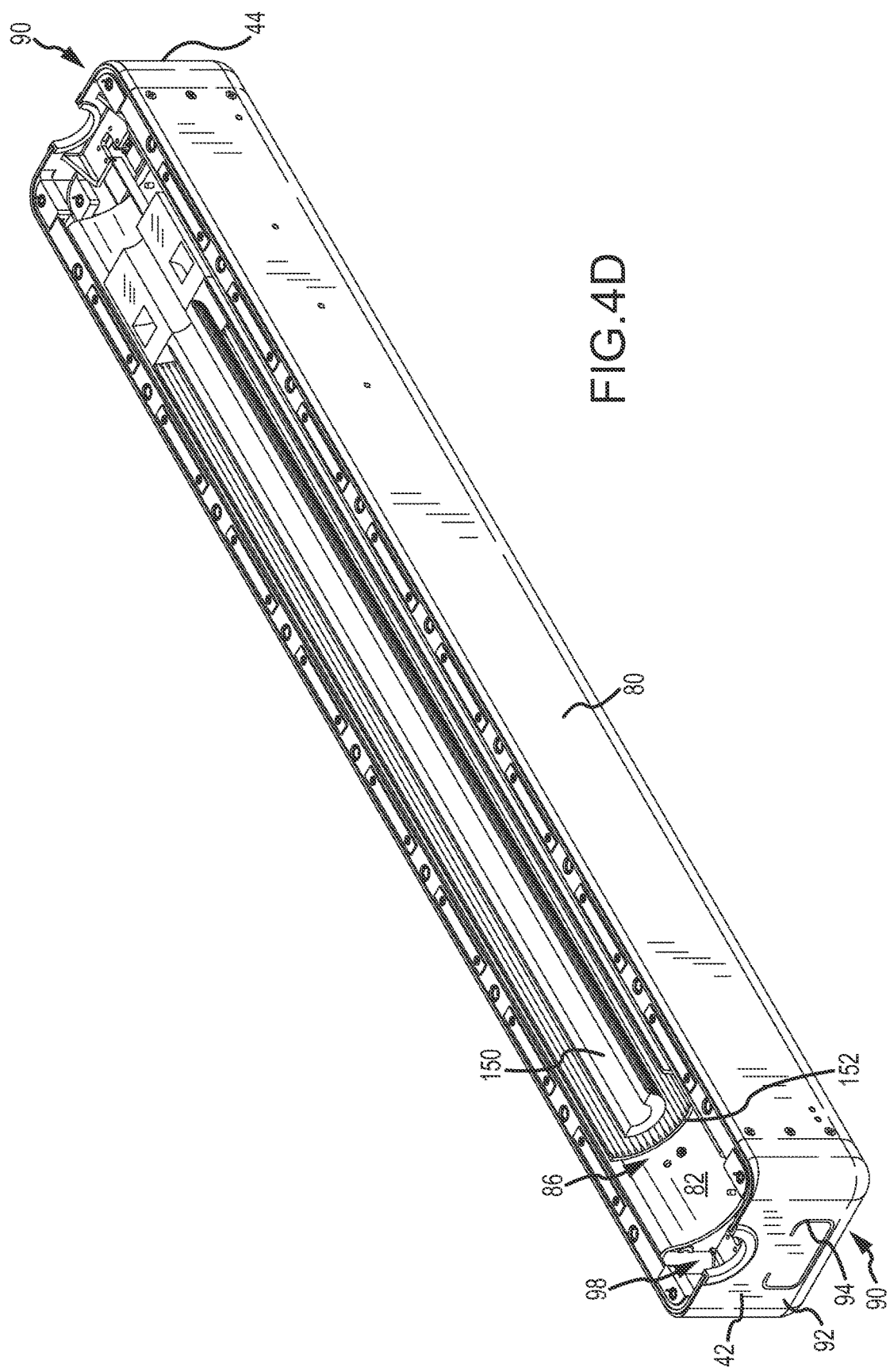

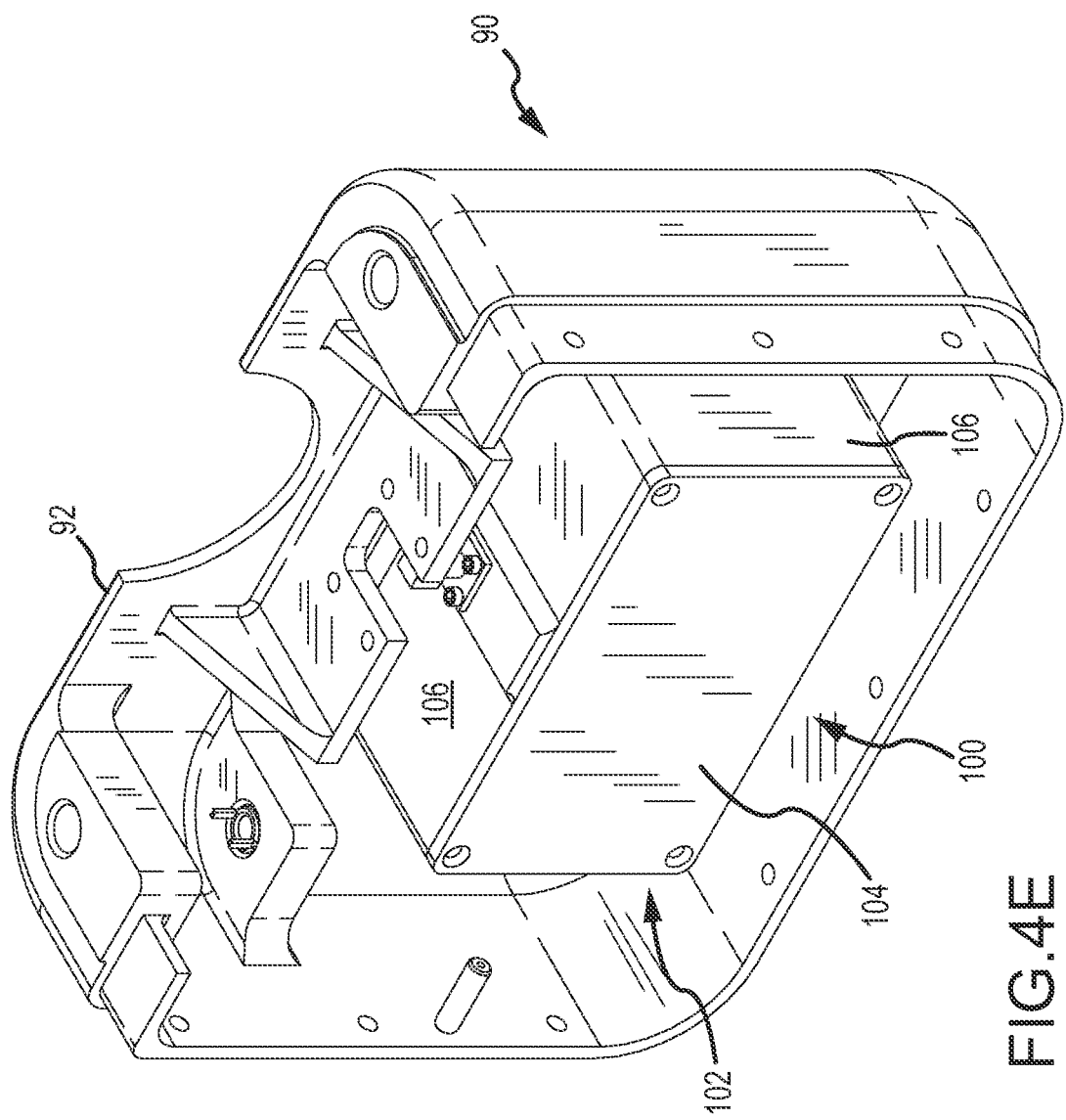

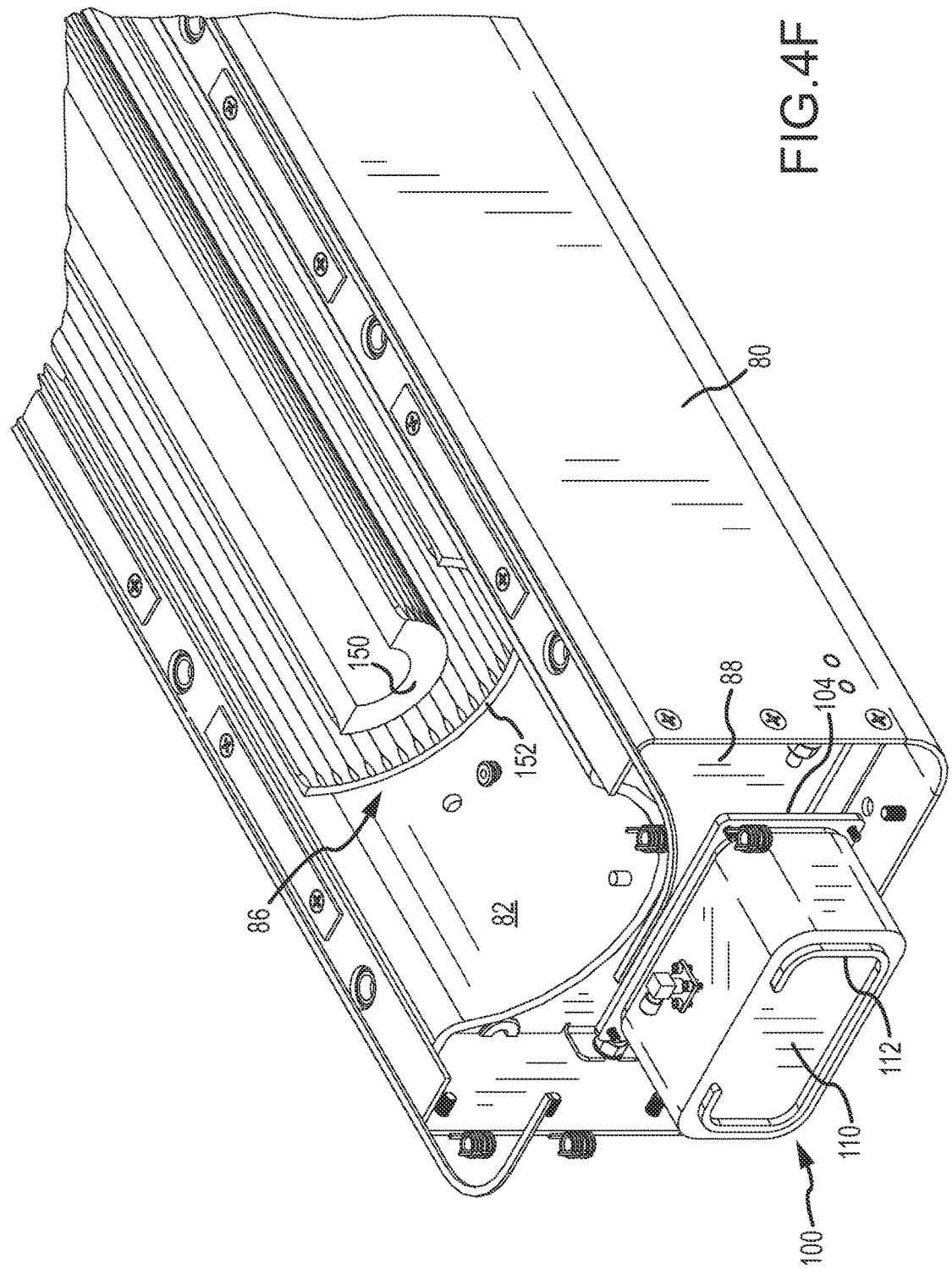

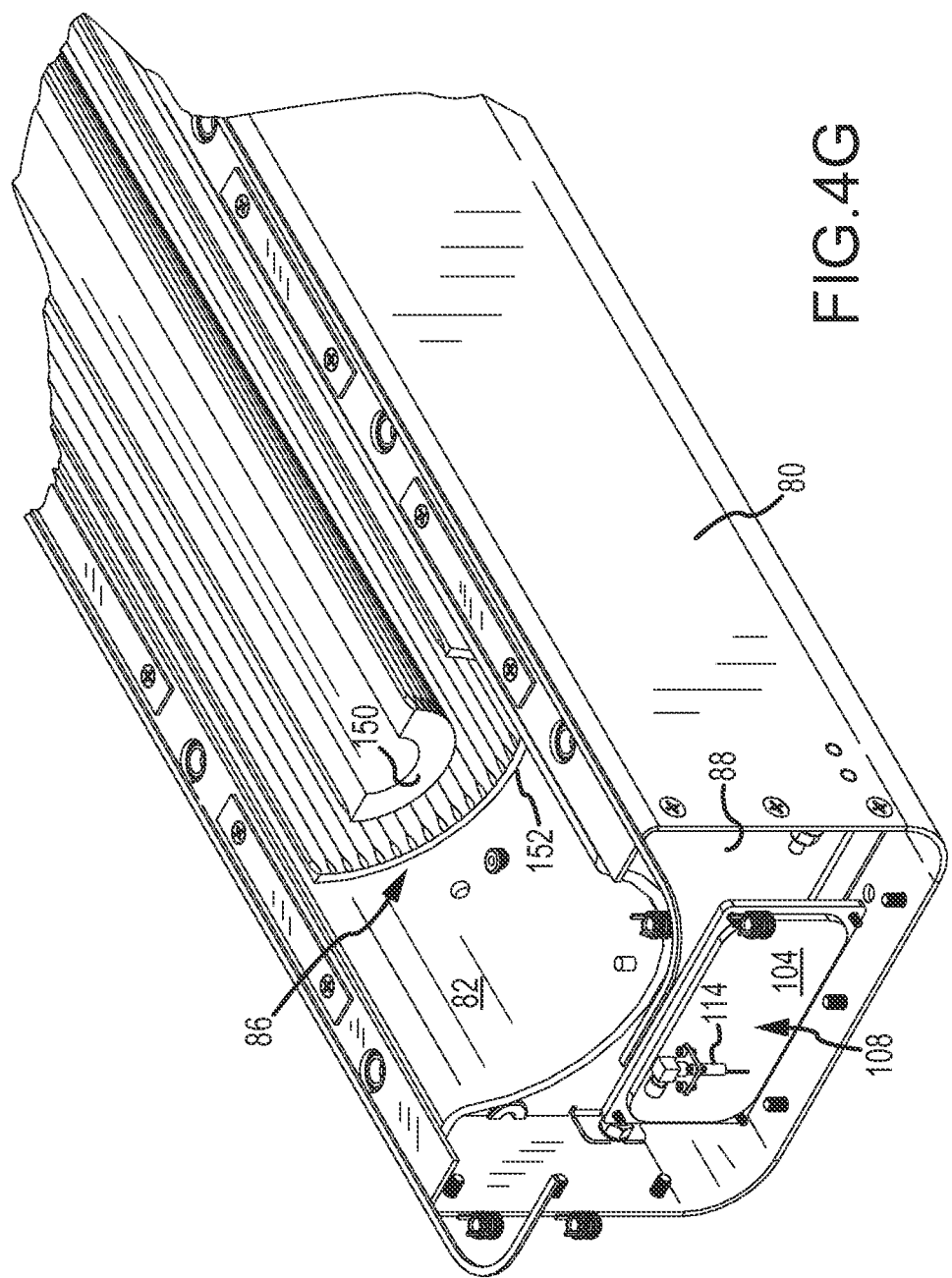

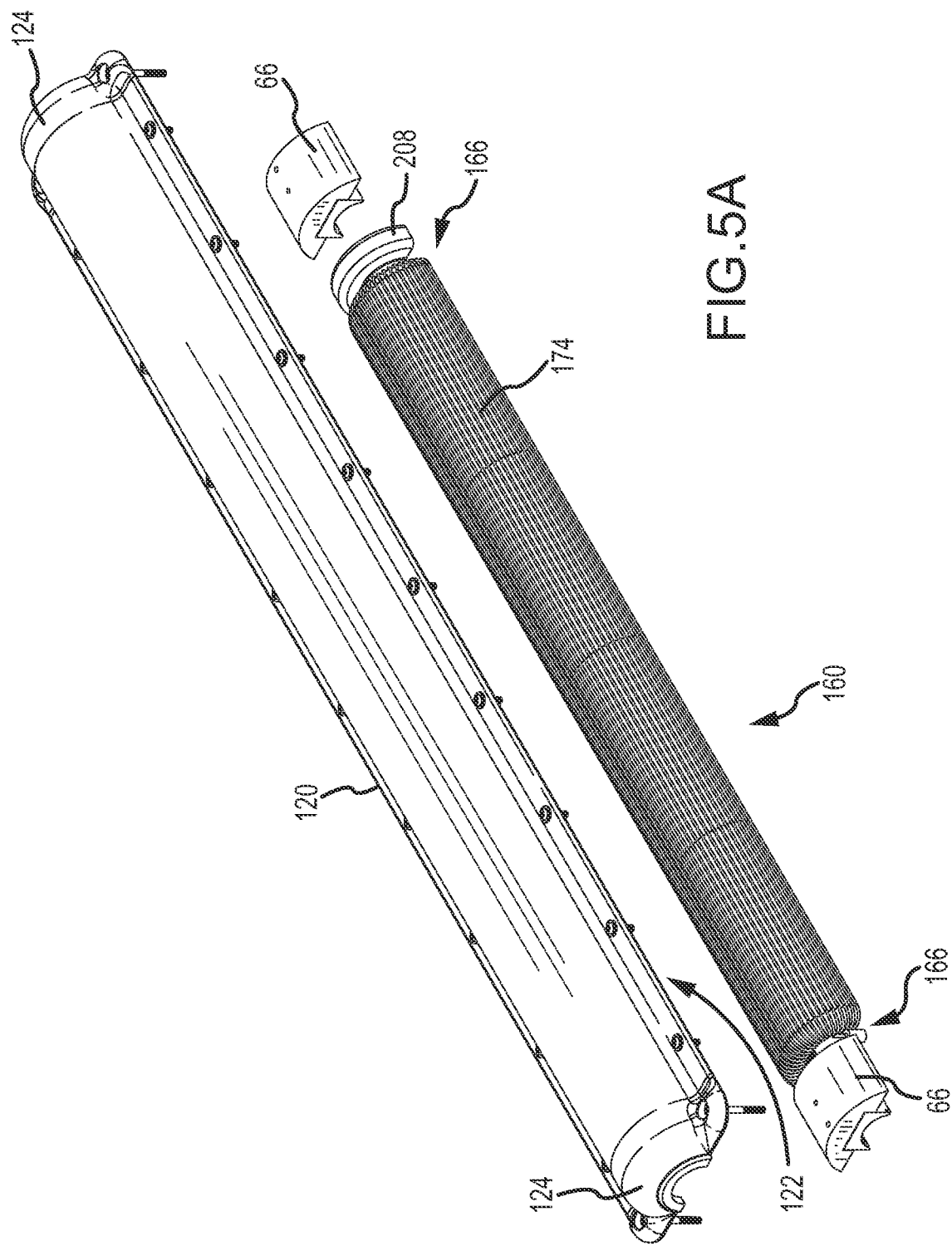

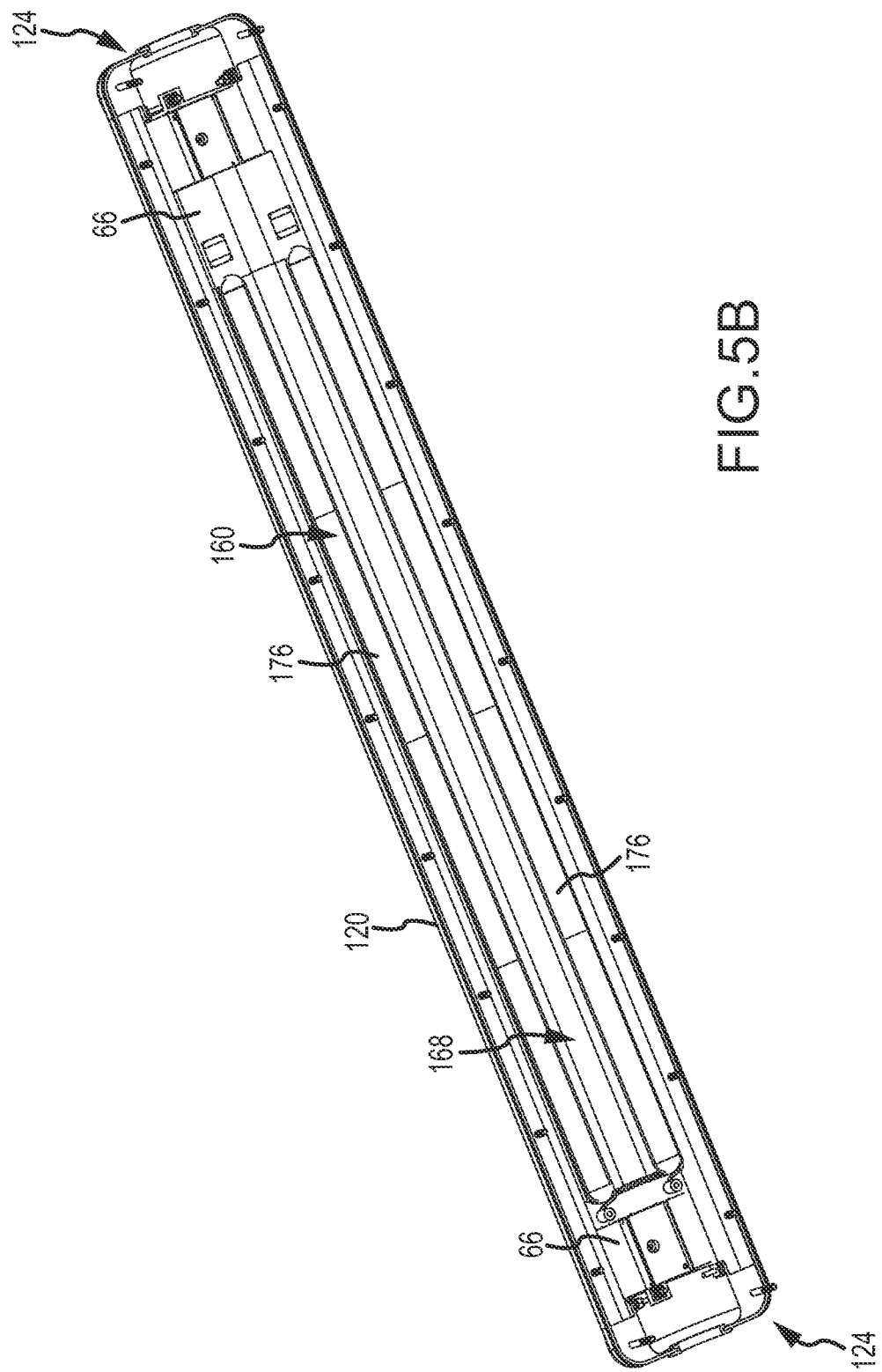

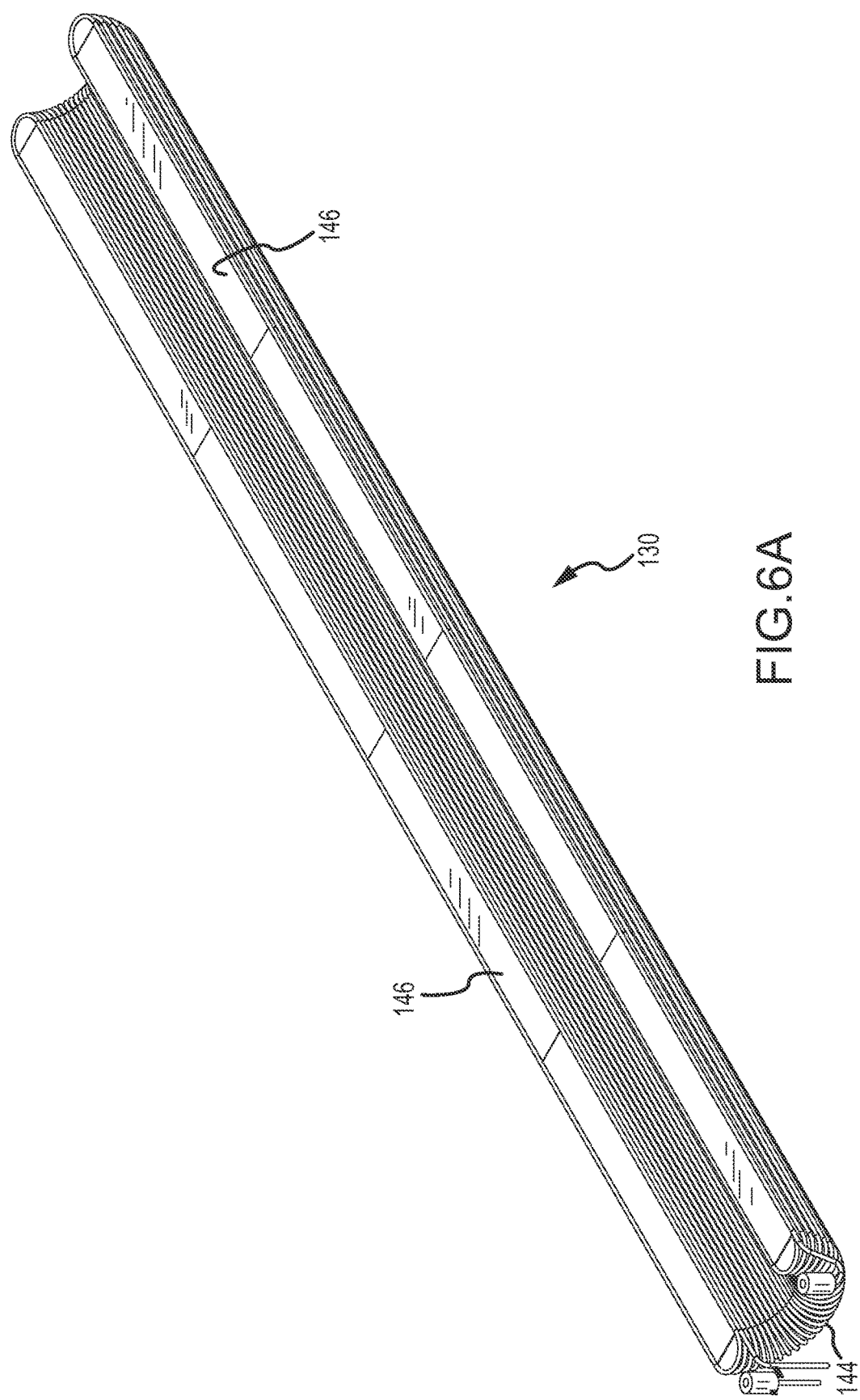

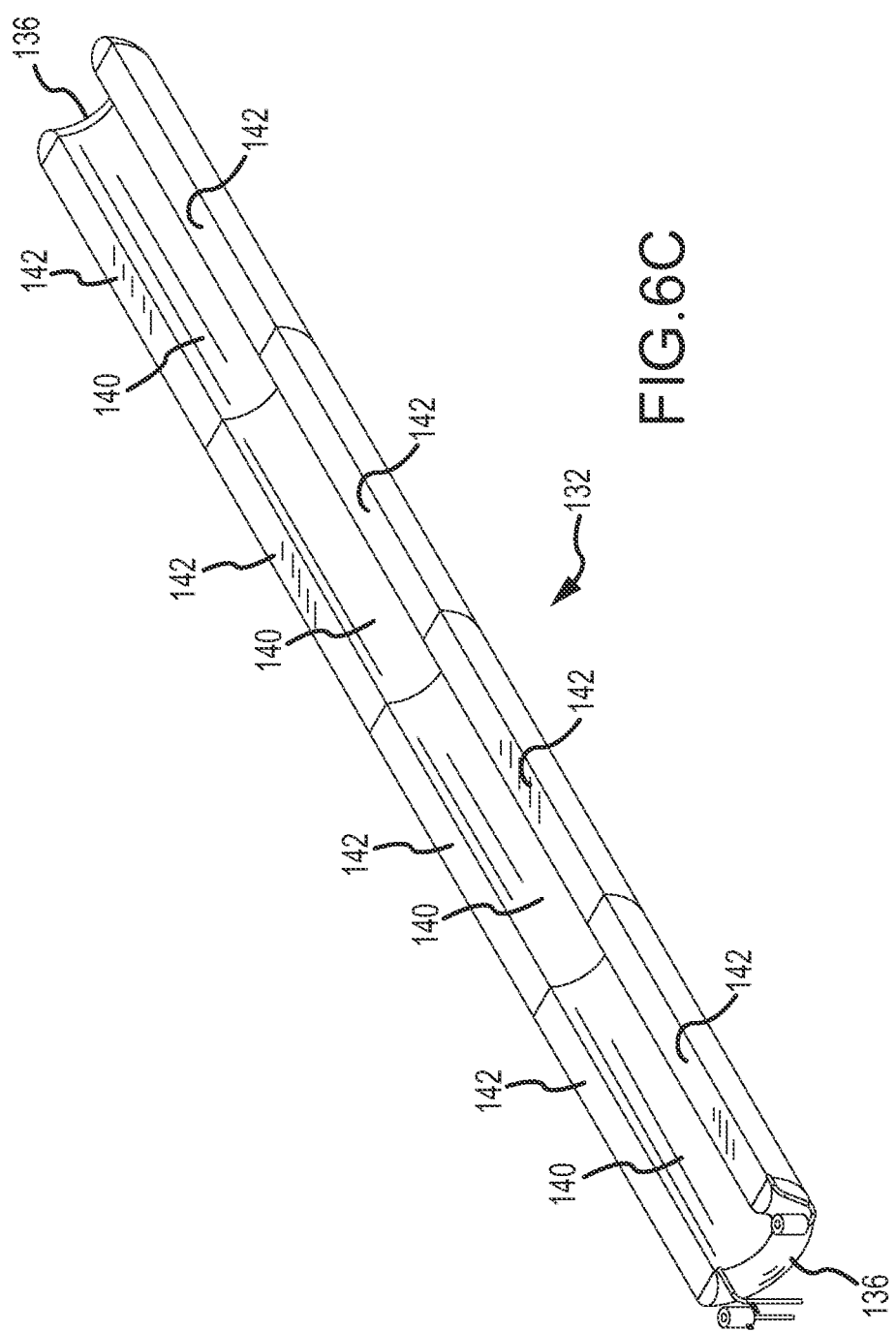

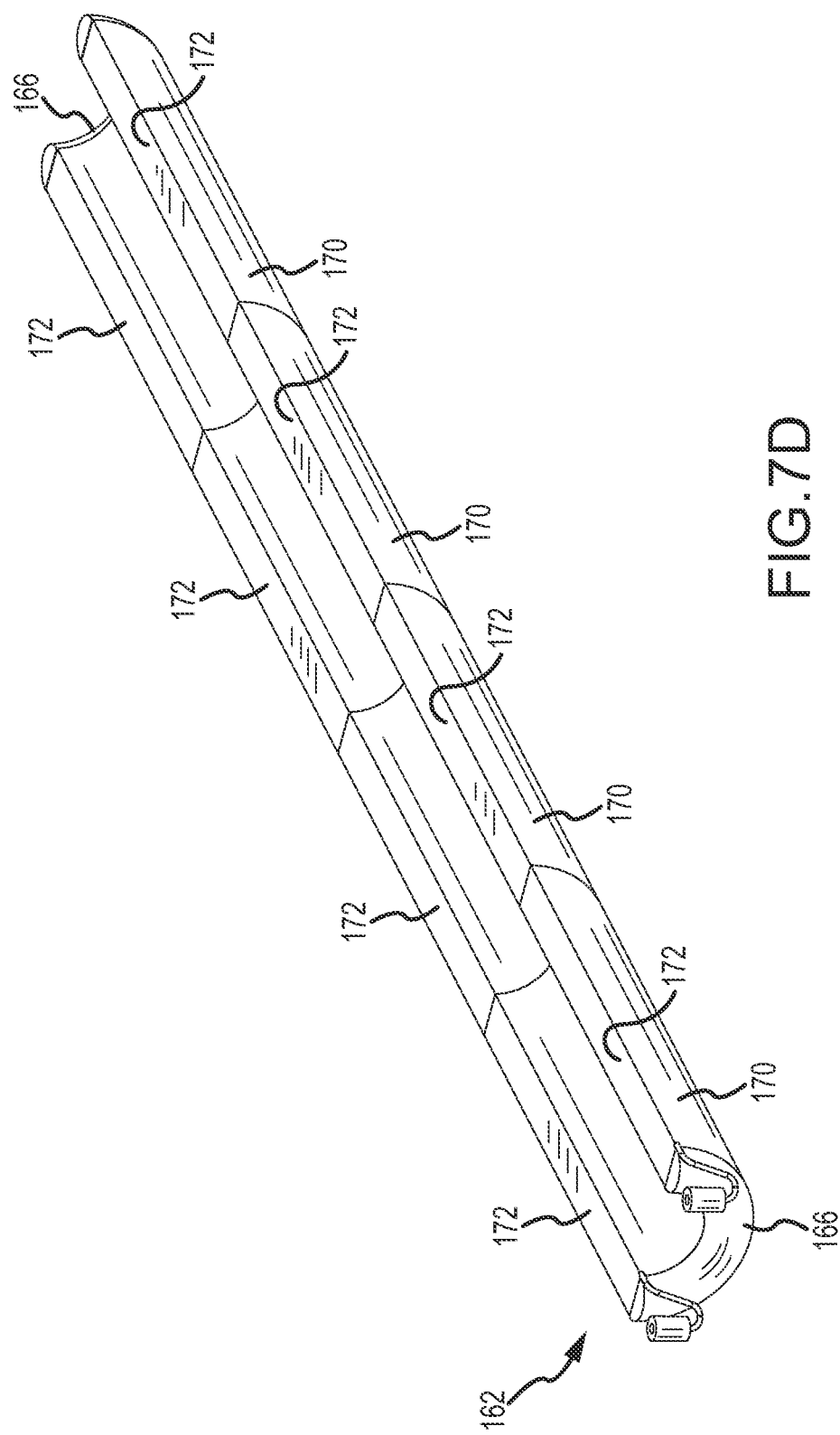

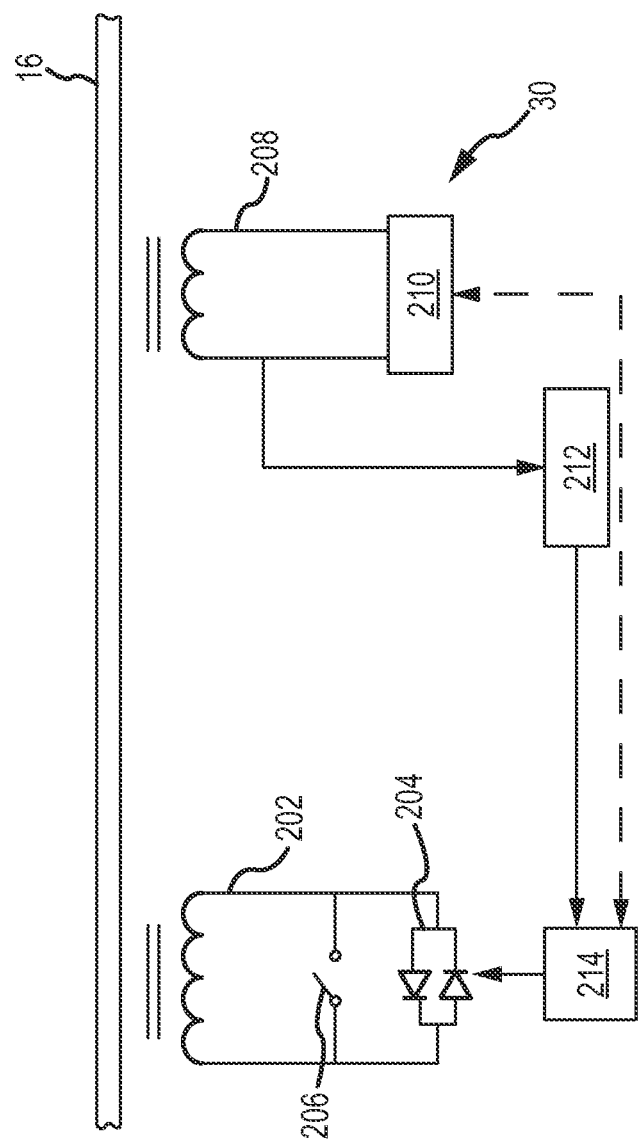

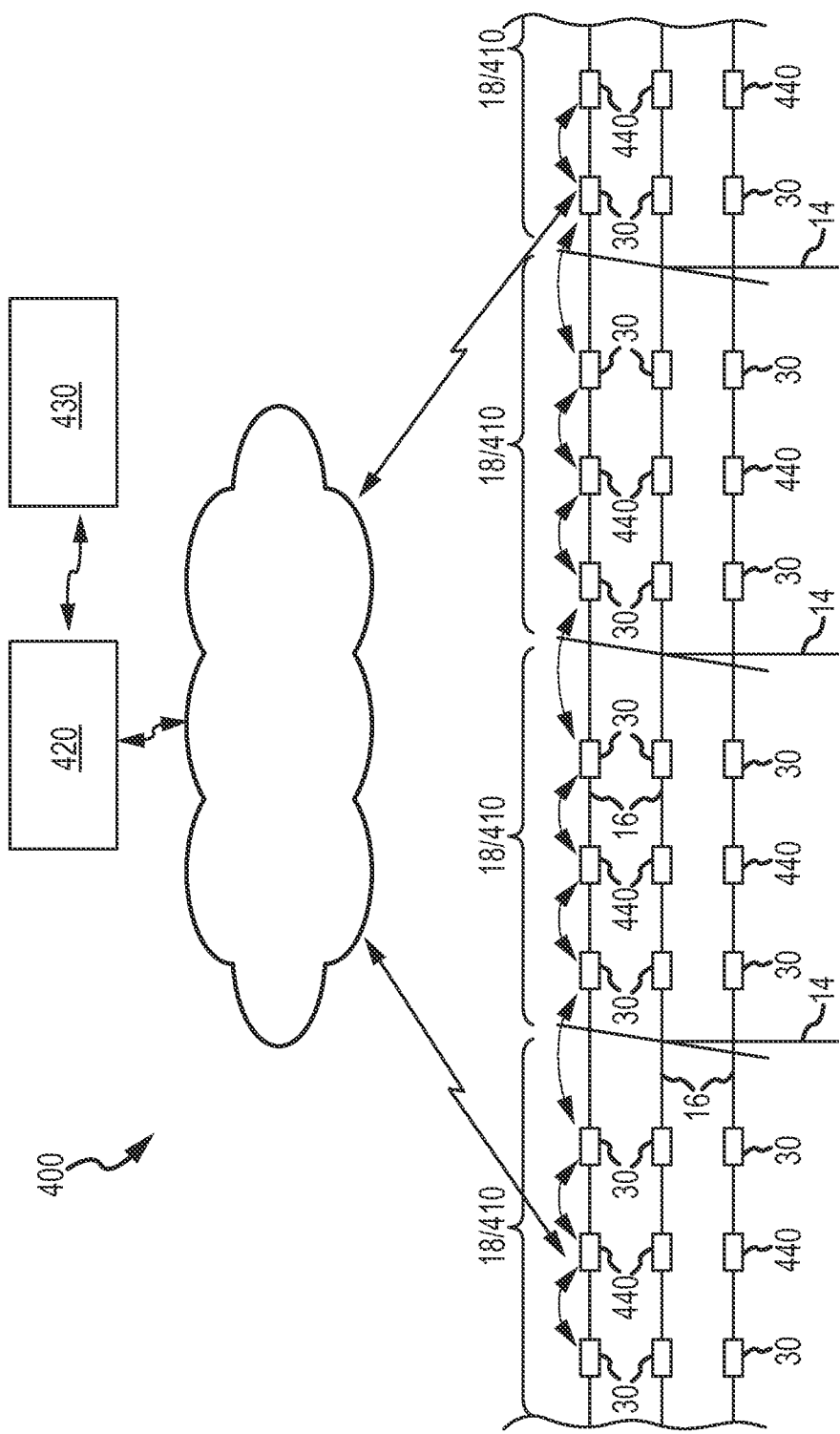

| SYSTEM CONDITION | DSR 30 | | DSR 30 | | DSR 30 | |
|---|---|---|---|---|---|---|
| | PFC MC | LFOC MC | PFC MC | LFOC MC | PFC MC | LFOC MC |
| 482 | 484 | 486 | 484 | 486 | 484 | 486 |
| 482 | 484 | 486 | 484 | 486 | 484 | 486 |
| 482 | 484 | 486 | 484 | 486 | 484 | 486 |
| 482 | 484 | 486 | 484 | 486 | 484 | 486 |
| 482 | 484 | 486 | 484 | 486 | 484 | 486 |
| 482 | 484 | 486 | 484 | 486 | 484 | 486 |
| 482 | 484 | 486 | 484 | 486 | 484 | 486 |

INSTALLATION FIXTURE FOR INSTALLING DEVICES ON POWER LINES

CROSS-REFERENCE TO RELATED APPLICATIONS

This patent application is a continuation of and claims priority to co-pending International Application No. PCT/US2013/075,608, that is entitled "INSTALLATION FIXTURE FOR INSTALLING DEVICES ON POWER LINES", and that was filed on Dec. 17, 2013, which is a non-provisional patent application of and claims priority to U.S. Provisional Patent Application Ser. No. 61/738,900 that is entitled "INSTALLATION FIXTURE FOR INSTALLING DEVICES ON POWER LINES," that was filed on Dec. 18, 2012. The entire disclosure of each application that is set forth in this CROSS-REFERENCE TO RELATED APPLICATIONS section is hereby incorporated by reference.

FIELD OF THE INVENTION

The present invention generally relates to the installation of a device on a power line.

BACKGROUND

Power transmission systems are formed of a complex interconnected system of generating plants, substations, and transmission and distribution lines. A significant issue currently plaguing power transmission systems may be characterized as active power flow control. Controlling power flow may include altering the impedance of the power lines or changing the angle of the voltage applied across the lines. At least some prior art techniques for controlling power flow may require a high bandwidth communications infrastructure and may result in transmission line congestion, fault protection coordination problems, poor utilization of both generation and transmission assets, significant costs, and increased complexity for the power transmission system.

SUMMARY

First and second aspects of the present invention are each generally directed to an installation fixture that may be used to install a device on a power line. This installation fixture includes a base, a lower cradle, and an upper cradle. The lower cradle is movably interconnected with the base and includes a lower receptacle. This lower receptacle is configured to receive a lower section of a first device that is to be mounted on a power line. The upper cradle includes an upper receptacle that is configured to receive an upper section of a first device that is to be mounted on a power line. The upper cradle may be moved between open and closed positions (e.g., relative to the lower cradle). The upper receptacle of the upper cradle is offset from the lower receptacle of the lower cradle when the upper cradle is in its open position. The upper receptacle of the upper cradle is aligned with (e.g., disposed above) the lower receptacle of the lower cradle when the upper cradle is in its closed position.

In the case of the first aspect, a positioning mechanism is located between the base and the lower cradle. This positioning mechanism may be disposed in each of first and second configurations. An orientation of the lower cradle relative to the base may be adjusted when the positioning mechanism is in its first configuration. The lower cradle is maintained in a fixed orientation relative to the base when the positioning mechanism is in its second configuration.

In the case of the second aspect, a connector is located between the base and the lower cradle. The connector provides at least three degrees of freedom (e.g., to allow the lower cradle to move relative to the base in at least three different dimensions).

A number of feature refinements and additional features are separately applicable to each of above-noted first and second aspects of the present invention as well. These feature refinements and additional features may be used individually or in any combination in relation to each of the first and second aspects. Initially, the installation fixture may be used to install a reactance module on a power line, including where a lower housing section is positioned within the lower receptacle of the lower cradle and where an upper housing section is positioned within the upper receptacle of the upper cradle. Such a reactance module is discussed in more detail below.

A positioning mechanism may be used by the installation fixture. This positioning mechanism may be disposed or located between the base and the lower cradle. An orientation of the lower cradle relative to the base may be adjusted when the positioning mechanism is disposed in a first configuration. The lower cradle may be maintained in a fixed orientation relative to the base when the positioning mechanism is disposed in a second configuration (where this second configuration is different from the first configuration in at least some respect). One embodiment has the positioning mechanism being selectively disposable in each of the first and second configurations (e.g., the positioning mechanism may be selectively changed (e.g., by an operator) between its first and second configurations in any appropriate manner). Any appropriate type of positioning mechanism may be used that allows the orientation of the lower cradle to be changed relative to the base, and that thereafter allows for the orientation of the lower cradle to be at least substantially fixed relative to the base.

The noted positioning mechanism may utilize a hydraulic circuit that uses a fluid of any appropriate type (e.g., one or more liquids, one or more gasses, or a combination thereof). The first configuration for such a positioning mechanism (that allows the lower cradle to move relative to the base) may be one that accommodates flow throughout the hydraulic circuit. Conversely, the second configuration for such a positioning mechanism (that maintains the lower cradle in a fixed orientation relative to the base) may be one that at least substantially precludes flow within the hydraulic circuit. Other types of positioning mechanisms may be appropriate.

The noted hydraulic circuit for the positioning mechanism may utilize a number of different hydraulic cylinders. Any appropriate number of hydraulic cylinders may be used. In any case, each hydraulic cylinder may include a housing that is fixed relative to the base in any appropriate manner (e.g., each hydraulic cylinder may extend from the base in the direction of the lower cradle). A separate plunger may be disposed in each housing (i.e., each housing may have its own corresponding plunger). Each such plunger may move relative to the base within its corresponding housing, including in a direction that is at least generally away from the base (at least generally in the direction of the lower cradle), and in a direction that is at least generally toward the base (at least generally away from the lower cradle). Each plunger may move along an axial path.

A free end of the plunger for each hydraulic cylinder may engage a surface of the lower cradle that faces or projects at least generally in the direction of the base (e.g., the underside of the lower cradle; a surface of the lower cradle that is opposite of that which includes the lower receptacle). This free end for each plunger may be in the form of a domed tip and/or may be characterized as being a convexly-shaped or curved surface (e.g. to provide a desired interface with the lower cradle).

Multiple hydraulic cylinders for positioning the lower cradle relative to the base may be disposed in any appropriate arrangement. One embodiment has the hydraulic cylinders being disposed about a connector between the lower cradle and the base, including where the hydraulic cylinders are symmetrically disposed about this connector.

A connector may be provided between the base and the lower cradle. Such a connector may be used in combination with, as well as without, the positioning mechanism described above. The connector may be configured to allow the lower cradle to move relative to the base. In one embodiment, this connector is of a configuration that provides at least three degrees of freedom (e.g., a spherical radial bearing). One characterization is that such a connector is of a configuration that allows the lower cradle to move relative to the base in at least three different dimensions. Another characterization is that such a connector is of a configuration that allows the lower cradle to move relative to the base about three different axes that are disposed in different orientations (e.g., a roll axis, a pitch axis, and a yaw axis).

The base of the installation fixture may utilize at least one base connector for detachably mounting the base on or to a first structure of any appropriate type. This first structure may be in the form of a worker carrier that is attached to a movable boom on a utility truck or the like. Such a worker carrier may be of any appropriate size, shape, and/or configuration, but in one embodiment provides at least somewhat of an enclosed space for one or more workers that are installing devices on overhead power lines. Representative worker carriers include a basket, a bucket, and a platform with at least one retention device (such as a retention device that provides a closed perimeter).

The base for the installation fixture may include a platform. The lower cradle may be movably interconnected with the platform in any appropriate manner, such as by the above-noted connector. The base may also include first and second frame sections that extend from the platform (e.g., in at least generally the same direction, for instance "downwardly" from the platform). One embodiment has the first and second frame sections being at least substantially parallel to one another. In any case, the first and second frame sections may be characterized as being disposed on one side of the platform (e.g., a lower surface or bottom of the platform), while the lower cradle of the installation fixture may be characterized as being disposed on an opposite side of the platform (e.g., an upper surface or top of the platform).

The first and second frame sections for the base may be spaced from one another to define a mounting receptacle (e.g., a space for capturing at least part of the noted first structure). At least an upper portion of a worker carrier may be received in this mounting receptacle, for instance an upper portion of a sidewall of a worker carrier (whether in the form of a solid surface or wall, or in the form of an open-air frame). The first frame section of the base may be disposed on an interior side of the sidewall of the worker carrier, and the second frame section may be disposed on an exterior side of this same sidewall of the worker carrier. In one embodiment, the second frame section extends further away from the platform of the installation fixture than the first frame section. More generally, the first and second frame sections may be of different lengths, for instance where the second frame section (e.g., exteriorly disposed relative to the worker carrier) is longer than the first frame section (e.g., interiorly disposed relative to the worker carrier). One or more clamping mechanisms may be used to further secure the base to the worker carrier.

The lower cradle of the installation fixture may be movable relative to the base in more than one dimension. The lower cradle may be rotated relative to the base in one or more directions (including an embodiment where there is a full 360° of rotational motion available between the base and lower cradle), the lower cradle may be tilted relative to the base in one or more directions, or both. In one embodiment, there is at least a 3° range of tilt motion between the lower cradle and the base. In another embodiment, there is at least about a 6° range of tilt motion between the lower cradle and the base. These ranges of tilt motion may be measured relative to a reference plane. This reference plane may correspond "home position" or the like for the lower cradle, for instance where the lower cradle is at least generally parallel with a platform for the base. Other ranges of tilt motion between the lower cradle and the base may be appropriate.

The lower cradle is again configured to receive a lower section of a first device that is to be mounted on a power line. One representative configuration for the lower cradle includes a base section and first and second sidewalls that are spaced from one another and that extend upwardly from this base section. The base section may define the "floor" of the lower receptacle, the first sidewall may define one side of the lower receptacle, and the second sidewall may define an opposite side of the lower receptacle. In one embodiment, each surface of each of the base section and the first and second sidewalls that defines a boundary for the lower receptacle is flat or planar.

The lower receptacle of the lower cradle may be characterized as being collectively defined by the noted base section and the noted first and second sidewalls. Although the first sidewall could be in the form of a continuous structure, in one embodiment the first sidewall includes separate first and second side sections that are spaced from one another along a length dimension of the lower receptacle. Although the second sidewall could be in the form of a continuous structure, in one embodiment the second sidewall includes separate third and fourth side sections that are spaced from one another along a length dimension of the lower receptacle. In one embodiment, the first side section of the first sidewall and the third side section of the second sidewall are disposed opposite of one another, while the second side section of the first sidewall and the fourth side section of the second sidewall are disposed opposite of one another.

The base section for the lower cradle may include at least one lower cradle pad. The first and second sidewalls for the lower cradle each may include at least one lower cradle pad. Each lower cradle pad may be formed from any appropriate material, such as silicone rubber. Contact between the lower cradle and a lower section of a first device that is received within the lower receptacle may be limited to each lower cradle pad that is utilized by the lower cradle.

The lower cradle may include the ability to selectively lock or retain a lower section of a first device within the lower cradle. Any appropriate locking/retention mechanism may be utilized by the lower cradle. The lower cradle may include a plurality of lower retention members that each may be extended into the lower receptacle. Each such lower retention member may be threadably engaged with the lower cradle and may include a free end that may be disposed within the lower receptacle. One or more lower retention members may be in the form of a bolt. Rotating a given bolt relative to the lower cradle may establish a threaded engagement between the bolt and the lower cradle, and furthermore may extend the free end of the bolt into the lower compartment where it may engage an exterior surface of a lower section of a first device that has been positioned within the lower receptacle (e.g., to push the lower section of the first device against an opposing surface of the lower cradle).

The upper cradle of the installation fixture may be movably interconnected with the lower cradle in any appropriate manner. In one embodiment, the upper cradle is pivotally connected with the lower cradle (e.g., by one or more pivot pins; for movement about a single axis). When the upper cradle is in its open position, the lower receptacle of the lower cradle and the upper receptacle of the upper cradle each may project at least generally upwardly. The lower receptacle of the lower cradle and the upper receptacle of the upper cradle may at least generally face in the same direction when the upper cradle is in its open position. The open position for the upper cradle may dispose the upper cradle (including its upper receptacle) and the lower cradle (including its lower receptacle) in side-by-side relation (e.g., the upper cradle may be positioned alongside the lower cradle).

When the upper cradle is in its closed position, the upper receptacle of the upper cradle may project at least generally in the direction of the lower receptacle of the lower cradle, and vice versa. The upper cradle may be characterized as being disposed in overlying relation to the lower cradle when the upper cradle is in its closed position. The upper cradle may be positioned "above" the lower cradle when the upper cradle is in its closed position. The upper and lower cradles may collectively define an enclosure when the upper cradle is in its closed position.

The open position for the upper cradle may be characterized as one that allows an upper section of a first device to be positioned within the upper receptacle of the upper cradle without any interference from the lower cradle, and that furthermore allows a lower section of a first device to be positioned within the lower receptacle of the lower cradle without any interference from the upper cradle. The closed position for the upper cradle may be characterized as one that positions the upper section for a first device in proper position (installed in the upper receptacle of the upper cradle) for attachment to a lower section for this first device (installed in the lower receptacle of the lower cradle).

The upper cradle is again configured to receive an upper section of a first device that is to be mounted on a power line. One representative configuration for the upper cradle includes first and second cradle sections that are spaced from one another along a length dimension of the upper receptacle. Contact between the upper cradle and an upper section of a first device that is received within the upper receptacle may be limited to the first and second cradle sections.

Each of the first and second cradle sections for the upper cradle may include at least one upper cradle pad. Each upper cradle pad may be formed from any appropriate material, such as silicone rubber. Contact between the upper cradle and an upper section of a first device that is received within the upper receptacle may be limited to each upper cradle pad that is utilized by the upper cradle.

The upper cradle may include the ability to selectively lock or retain an upper section of a first device within the upper cradle. Any appropriate locking/retention mechanism may be utilized by the upper cradle. The upper cradle may include one or more upper retention members. Any appropriate number of upper retention members may be utilized.

An upper retention member for the upper cradle may be in the form of a clamp. Each such clamp may be movably interconnected with the upper cradle in any appropriate manner. A given clamp may be moved (e.g., rotated) into a first, open, or un-locked position, where an upper section of a first device may be loaded into or removed from the upper receptacle of the upper cradle. This same clamp may be moved (e.g., rotated) into a second, closed, or locking position, where an upper section of a first device is retained or fixed within the upper receptacle of the upper cradle. In the first, open, or un-locked position, the entirety of the clamp may be characterized as being disposed outside of (or out of alignment with) the upper receptacle for the upper cradle. In the second, closed, or locking position, at least part of the clamp may be characterized as extending into or "over" the upper receptacle for the upper cradle (e.g., when the upper cradle is in an open position).

It should be appreciated that the lower cradle for the installation fixture of the first and second aspects may be more generally referred to as a first cradle having a first receptacle for receiving a first section of a first device to be installed on a power line. Similarly, the upper cradle of the first and second aspects may be more generally referred to as a second cradle having a second receptacle for receiving a second section of a first device to be installed on a power line. In this case, the second cradle again may be moved between open and closed positions. The open position for the second cradle may be characterized as one that allows a first section of a first device to be positioned within the first receptacle of the first cradle without any interference from the second cradle, and that furthermore allows a second section of a first device to be positioned within the second receptacle of the second cradle without any interference from the first cradle. The closed position for the second cradle may be characterized as one that disposes the second section for a first device in proper position (installed in the second receptacle of the second cradle) for attachment to the first section for this first device (installed in the first receptacle of the first cradle) and at a time where a power line is captured between these first and second sections of the first device.

A third aspect of the present invention is embodied by a method of installing a first device a power line. Upper and lower sections of this first device may be separately supported within a common installation fixture. The installation fixture may be positioned such that a power line is disposed above the lower section of the first device. Thereafter, the upper section of the first device is moved relative to the lower section of the first device to capture the power line between the upper and lower sections of the first device. Once the power line has been captured between the upper and lower sections of the first device, these upper and lower sections may be secured together. The upper and lower sections of the first device may be supported by the installation fixture at least until the time that the power line is captured between the upper and lower sections of the first device.

A number of feature refinements and additional features are applicable to the third aspect of the present invention. These feature refinements and additional features may be used individually or in any combination. The following discussion is applicable to at least the third aspect.

The third aspect may be used to install a reactance module on a power line, and again that will be discussed in more detail below. In this case, the noted upper section may be in the form of an upper housing section for the reactance module, and the noted lower section may be in the form of a lower housing section for the reactance module. This third aspect will hereafter be discussed in relation to the device being in the form of a reactance module. However, the third aspect remains applicable to other devices having two separate sections that may be positioned relative to one another to capture a power line therebetween.

The installation fixture may be installed on a worker carrier of the above-describe type. This worker carrier may be supported by a movable boom of the above-described type, which in turn may be incorporated by a vehicle (e.g., the boom may be movable relative to the vehicle, for instance to dispose a worker in position relative to the power line for installation of a reactance module). The entirety of method for the third aspect may be executed while the installation fixture is mounted on such a worker carrier.

The installation fixture used by the third aspect may be in accordance with the installation fixture discussed above in relation to the first and second aspects. An installation fixture that accommodates the method of the third aspect is also within the scope of the present invention. In any case and with the lower housing section of the reactance module being positioned within the lower cradle and with the upper housing section of the reactance module being positioned within the upper cradle, the orientation of the lower cradle may be changed relative to the base prior to moving the upper and lower housing sections relative to one another to capture the power line therebetween. This change in orientation may be undertaken or realized in any appropriate manner, including by rotating the lower cradle relative to the base, tilting the lower cradle relative to the base, or any combination thereof. Adjustment of the orientation of the lower cradle relative to the base may simultaneously adjust the orientation of the upper cradle relative to the base (this change in orientation typically being made prior to the time that the upper cradle is moved relative to the lower cradle to capture a power line therebetween).

Adjustment of the orientation of the lower cradle relative to the base may entail rotating the lower cradle relative to the base about one or more different axes. Adjustment of the orientation of the lower cradle relative to the base may entail tilting the lower cradle relative to the base about one or more different axes. Any combination of rotational and tilting motions may be used to change the orientation of the lower cradle relative to the base. Consider the case where the lower cradle has a length dimension that is defined by first reference axis (e.g., a "roll" axis), and a width dimension that is defined by a second reference axis (e.g., a "pitch" axis) that is perpendicular to this first reference axis. A third reference axis (e.g., a "yaw" axis) may extend from an intersection of the first and second reference axes, and may be disposed perpendicularly to a plane that contains the first and second reference axes. Generally, the lower cradle may be moved relative to the base about any of these first, second, and third reference axes (sequentially and/or simultaneously). In one embodiment, 360° of rotational motion is available between the lower cradle and the base.

At least a 3° range of tilt motion may be available between the base and the lower cradle (e.g., the lower cradle may be tilted relative to the base at least 3° relative to the above-noted reference plane). The installation fixture may be configured to have atilt angle of at least 6° between the base and lower cradle (e.g., the lower cradle may be tilted relative to the base by at least about 6° relative to the noted reference plane in one embodiment).

The change in orientation of the lower cradle relative to the base may be realized in any appropriate manner, including by utilizing an appropriate connector between the lower cradle and the base (e.g., a spherical bearing), by utilizing a positioning mechanism between the base and the lower cradle, or both. The positioning mechanism may be in the form of a hydraulic circuit and as discussed above in relation to the first and second aspects. Opening the hydraulic circuit may allow for the orientation of the lower cradle to be changed relative to the base (e.g., via the flow of hydraulic fluid within the hydraulic circuit). Consider the case where the hydraulic circuit includes a plurality of hydraulic cylinders, where each hydraulic cylinder includes a housing that is fixed relative to the base, and where each hydraulic cylinder includes a plunger that is movable both relative to the base and its corresponding housing, and where each such plunger also engages the lower cradle. Changing the orientation of the lower cradle relative to the base may result in retracting the plunger of at least one hydraulic cylinder relative to its corresponding housing and extending the plunger of at least one other hydraulic cylinder relative to its corresponding housing. Fluid may be discharged from those hydraulic cylinders having a plunger that is retracted by the change in orientation of the lower cradle relative to the base, and this fluid may be directed into one or more other hydraulic cylinders to cause an extension of their corresponding plunger relative to their corresponding housing. Once the lower cradle is in the desired orientation relative to the base, the hydraulic circuit may be closed. Closing the hydraulic circuit may maintain the lower cradle in a fixed orientation relative to the base (the upper cradle thereafter may be moved to capture the power line between the upper and lower housing sections of the reactance module).

The orientation of the lower cradle may be adjusted to dispose the lower cradle in a desired position relative to the power line for the installation of the reactance module. Adjusting the orientation of the lower cradle may be characterized as having the orientation of the lower housing section of the reactance module at least generally match an orientation of a portion of the power line on which the reactance module is being installed. During the positioning of the installation fixture relative to the power line, the upper and lower housing sections may be disposed in a first relative orientation, for instance where the interiors of the upper and lower housing sections each project at least generally upwardly.

Moving the upper housing section relative to the lower housing section (e.g., after the lower housing section has been disposed in a proper position relative to the power line) may entail disposing the upper and lower housing sections in a second relative orientation, for instance where an interior of the upper housing section projects at least generally downwardly and an interior of the lower housing section projects at least generally upwardly (including where the interior of the upper housing section projects into the interior of the lower housing section, and vice versa).

Prior to moving the upper housing section of the reactance module relative to the lower housing section of the reactance module to capture the power line therebetween, the upper housing section may be locked in a corresponding portion of the installation fixture (e.g., locked within the noted upper cradle). At this time and in one characterization, the lower housing section of the reactance module may be positioned under the power line, and the upper housing section of the reactance module may be positioned off to the side of the power line (for instance, where the length dimension of the upper cradle is spaced from and at least generally parallel with the portion of the power line on which the reactance module is to be installed). At this time and in another characterization, the interior of the lower housing section of the reactance module may project in the direction of the portion of the power line on which the reactance module is to be installed, but the projection of the interior of the upper housing section of the reactance module may not encompass the portion of the power line on which the reactance module is to be installed.

Moving the upper housing section of the reactance module relative to the lower housing section of the reactance module to capture the power line therebetween may entail pivoting the upper housing section (e.g., via pivoting a corresponding portion of the installation fixture, such as the upper cradle) relative to the lower housing section (e.g., retained in a corresponding portion of the installation fixture, such as the lower cradle). The upper housing section (and a corresponding portion of the installation fixture, such as the upper cradle) may be moved about a single axis to dispose the upper housing section in overlying relation to the lower housing section to capture a power line therebetween. Other types of motion may be utilized.

Once the upper housing section of the reactance module has been moved into a proper position relative to the lower housing section of the reactance module, the upper and lower housing sections may be secured together in any appropriate manner (e.g., using a plurality of threaded fasteners). The upper housing section may be at least partially secured to the lower housing section while the upper and lower housing sections each remain within the installation fixture. In one embodiment and after the upper housing section has been at least partially secured to the lower housing section (e.g., after all fasteners between the upper and lower housing sections have been tightened to some degree), any retention device(s) associated with the upper cradle may be deactivated to allow the upper cradle to be rotated away from the lower cradle (with the upper housing section remaining in the proper position relative to the lower housing section), and thereafter tightening of all fasteners that join the upper and lower housing sections together may be completed (e.g., all bolts between the upper and lower housing sections may be properly torque). Any retention devices associated with the lower cradle may be deactivated after the upper and lower housing sections have been properly secured together, and thereafter the installation fixture may be removed from the reactance module to allow the reactance module to be entirely supported by the power line.

A number of feature refinements and additional features are separately applicable to each of above-noted first, second, and third aspects of the present invention. These feature refinements and additional features may be used individually or in any combination in relation to each of the above-noted first, second, and third aspects of the present invention.

Each aspect of the present invention may be used in relation to a reactance module that is to be installed on a power line. Such a reactance module may be configured so as to be mountable on a power line without requiring a break in the power line. In one embodiment, the reactance module includes first and second housing sections. These first and second housing sections may be detachably interconnected in any appropriate manner, for instance using one or more fasteners (e.g., threaded fasteners). As such, the first and second housing sections may be disconnected from one another, and thereafter may be reconnected together. The first and second housing sections may also be characterized as being movable between an open position, where the first and second housing sections may be installed on a power line, and a closed position where the first and second housing sections may be characterized as capturing a portion of the power line therebetween (e.g., the power line may be characterized as extending between the first and second housing sections when in the closed position, when detachably connected, or both).

A transformer may be defined when a reactance module is mounted on a power line (e.g., a single turn transformer). The primary of this transformer may be the power line itself. The secondary for this transformer may be one or more windings of a core for the reactance module (e.g., a first winding wrapped around a first core section of the reactance module, a second winding wrapped around a second core section of the reactance module, or both for the case when the first winding and second winding are electrically connected).

A given reactance module may be configured to selectively inject reactance into the corresponding power transmission line (the power transmission line on which the reactance module is mounted). Such a reactance module could be configured to selectively inject inductance into the corresponding power transmission line (e.g., to reduce the current or power flow through the power transmission line, or a current-decreasing modal configuration for the reactance module). Such a reactance module could be configured to inject capacitance into the corresponding power transmission line (e.g., to increase the current or power flow through the power transmission line, or a current-increasing modal configuration for the reactance module).

A reactance module may include any appropriate switch architecture for switching between two different modes of operation. A reactance module may include one or more processors disposed in any appropriate processing architecture to control operation of any such switch architecture. In a first mode, a reactance module may be configured to inject little or no reactance into the corresponding power transmission line (e.g., a bypass or monitoring mode). In a second mode, a reactance module may be configured to inject substantially more reactance into the corresponding power transmission line compared to the first mode (e.g., an injection mode).

Any feature of any other various aspects of the present invention that is intended to be limited to a "singular" context or the like will be clearly set forth herein by terms such as "only," "single," "limited to," or the like. Merely introducing a feature in accordance with commonly accepted antecedent basis practice does not limit the corresponding feature to the singular (e.g., indicating that a reactance module includes "an antenna" alone does not mean that the reactance module includes only a single antenna). Moreover, any failure to use phrases such as "at least one" also does not limit the corresponding feature to the singular (e.g., indicating that a reactance module includes "an antenna" alone does not mean that the reactance module includes only a single antenna). Use of the phrase "at least generally" or the like in relation to a particular feature encompasses the corresponding characteristic and insubstantial variations thereof (e.g., indicating that faces of multiple core segments are at least generally coplanar encompasses these faces actually being coplanar). Finally, a reference of a feature in conjunction with the phrase "in one embodiment" does not limit the use of the feature to a single embodiment.

BRIEF DESCRIPTION OF THE FIGURES

FIG. 2A is a perspective view of one end of an embodiment of a line-mountable reactance module.

FIG. 3 is an exploded, perspective view of the reactance module of FIGS. 2A/2B.

FIG. 4A is a perspective view of a lower core assembly positioned within a lower housing section from the reactance module of FIGS. 2A/2B.

FIG. 4B is an exploded, perspective view of the lower core assembly and lower housing section from the reactance module of FIGS. 2A/2B.

FIG. 4D is an enlarged, perspective view of the lower housing section from the reactance module of FIGS. 2A/2B, and illustrating the encapsulating sections for the lower core assembly.

FIG. 4E is a perspective view of the interior of one of the lower end caps that is attached to the lower housing section, illustrating an antenna housing disposed therein.

FIG. 4F is an enlarged, perspective view of an insert for an antenna disposed at one of the ends of the reactance module of FIGS. 2A/2B.

FIG. 4G is an enlarged, perspective view of an internal cavity for an antenna disposed at one of the ends of the reactance module of FIGS. 2A/2B, illustrating an exciter or probe of the antenna.

FIG. 5A is an exploded, perspective view of an upper core assembly and upper housing section from the reactance module of FIGS. 2A/2B.

FIG. 5B is a bottom view of the upper core assembly seated within the upper housing section from the reactance module of FIGS. 2A/2B.

FIG. 6A is a perspective view of the lower core assembly from the reactance module of FIGS. 2A/2B.

FIG. 6C is a perspective view of the lower core section for the lower core assembly from the reactance module of FIGS. 2A/2B, illustrating the faces of the lower core segments that collectively define the lower core section (before installing the noted spacers).

FIG. 7D is a bottom perspective view of the upper core section for the upper core assembly from the reactance module of FIGS. 2A/2B, illustrating the faces of the individual upper core segments that collectively define the upper core section (before installing the noted spacers).

FIG. 10 is an electrical block diagram for an embodiment of the reactance module of FIGS. 2A/2B.

FIG. 13A is a schematic of an embodiment of a power transmission system with distributed control for multiple arrays of reactance modules of the type presented in FIGS. 2A/2B.

FIG. 13D is a diagram of a system condition/contingency data structure that may be incorporated by DSR array controllers from the power transmission system of FIG. 13A.

DETAILED DESCRIPTION

Figure 1:
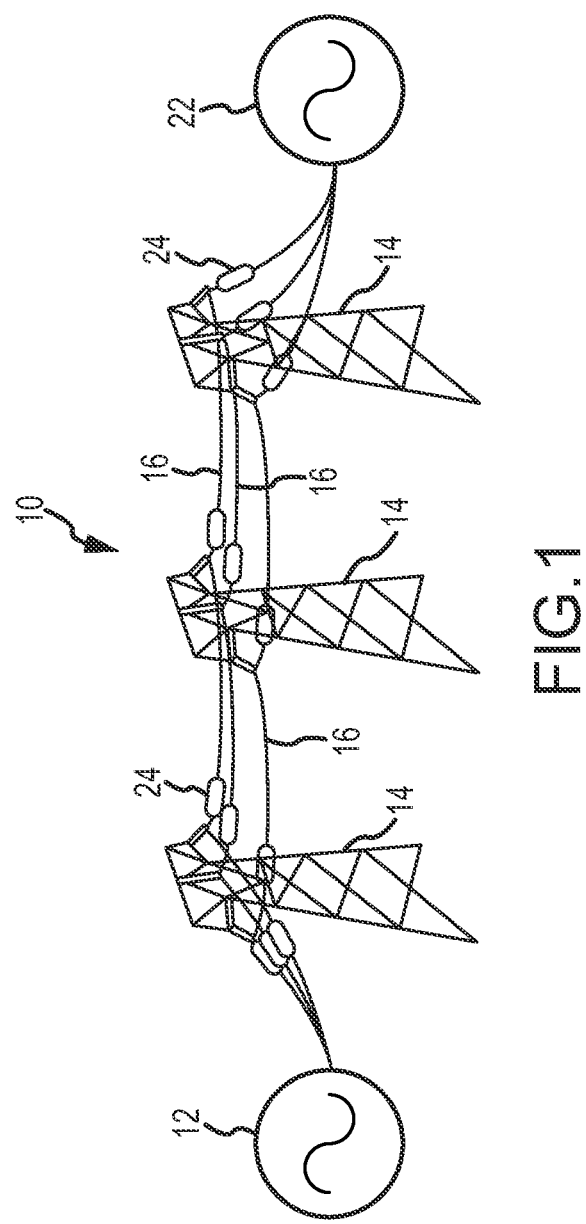
FIG. 1 is a schematic of one embodiment of a power transmission system having line-mounted reactance modules.

One embodiment of a power transmission system is illustrated in FIG. 1 as identified by reference numeral 10. The power transmission system 10 includes a plurality of power lines 16 (three in the illustrated embodiment, for providing three-phase power) that extend between an electric power source 12 and a load 22. Any appropriate number of electrical power sources 12 and loads 22 may be associated with the power transmission system 10. A plurality of towers 14 of any appropriate size, shape, and/or configuration may support the various power lines 16 at appropriately spaced locations. The power lines 16 may be of any appropriate type, for instance power transmission lines (larger capacity) or distribution lines (lower capacity).

A plurality of distributed series reactors (DSRs) or "reactance modules" are installed on each of the power lines 16 of the power transmission system 10, and are identified by reference numeral 24. Any appropriate number of DSRs 24 may be installed on a given power line 16 and using any appropriate spacing. Each DSR 24 may be installed on a power line 16 at any appropriate location, including in proximity to an insulator. Generally, each DSR 24 may be configured/operated to inject reactance (e.g., inductance, capacitance) into the corresponding power line 16. That is, a given DSR 24 may be of a configuration so as to be able to inject inductance into the power line 16 on which it is mounted (e.g., the injected reactance may be an inductive reactance or inductance, which may reduce the flow of current through the power line 16 on which the DSR 24 is mounted). A given DSR 24 may also be of a configuration so as to be able to inject capacitance into the power line 16 on which it is mounted (e.g., the injected reactance may be a capacitive reactance or capacitance, which may increase the flow of current through the power line 16 on which the DSR 24 is mounted).

Figure 2B:
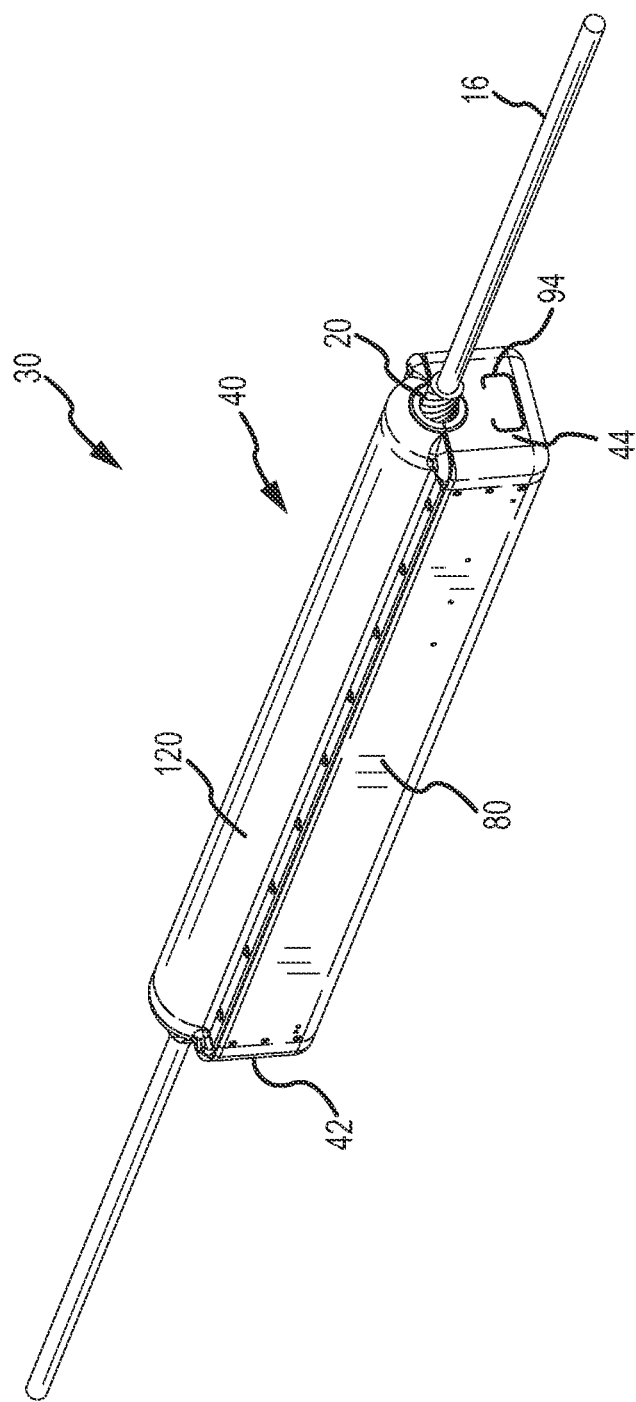
FIG. 2B is a perspective view of an opposite end of the reactance module of FIG. 2A.

FIGS. 2A, 2B, and 3 illustrate a representative configuration for the DSRs 24 presented in FIG. 1, and which is identified by reference numeral 30. Generally, the configuration of the DSR 30 presented herein is of the type that provides for the injection of inductance into a power line 16 on which it is mounted. However and as in the case of the DSR 24 discussed above, the DSR 30 could be configured so as to inject capacitance into the power line 16 on which it is mounted (not shown).

The DSR 30 of FIGS. 2A, 2B, and 3 is configured for installation on a power line 16 without requiring a break in the same. In this regard, a housing 40 of the DSR 30 includes a first or lower housing section 80 and a second or upper housing section 120 that are detachably connected in any appropriate fashion. A first or lower end cap 90 and a second or upper end cap 124 of the housing 40 are positioned on one end 42 (e.g., a power end) of the DSR 30, and another lower end cap 90 and upper end cap 124 are positioned at the opposite end 44 (e.g., a control end) of the housing 40. As will be discussed in more detail below, the DSR 30 uses a pair of cavity-backed slot antennas 100 (e.g., FIGS. 4E, 4F, and 4G), one being positioned at least generally at each end 42, 44 of the DSR 30. As such, a slot 94 for the antenna 100 extends through the wall thickness of the housing 40 at each of its ends 42, 44.

The housing 40 of the DSR 30 at least substantially encloses a core assembly 50 (e.g., in the form of a single turn transformer). A first or lower core assembly 130 is disposed within the lower housing section 80 (e.g., within a compartment 86), while a second or upper core assembly 160 is disposed within the upper housing section 120. The lower core assembly 130 includes a first or lower winding 144, while the upper core assembly 160 includes a second or upper winding 174. The windings 144, 174 may be electrically interconnected in any appropriate manner. The lower core assembly 130 and the upper core assembly 160 are collectively disposed about the power line 16 on which the DSR 30 is installed. When the core assembly 50 is installed on a power line 16, it collectively defines a single turn transformer, where the primary of this single turn transformer is the power line 16, and where the secondary of this single turn transformer is defined by the windings 144, 174 for the illustrated embodiment. However, the secondary of this single turn transformer could be comprised of only the lower winding 144 or only the upper winding 174. For example, the lower core assembly 130 may include the lower winding 144, and the upper core assembly 160 may not include the upper winding 174. Similarly, the lower core assembly 130 may not include the lower winding 144, and the upper core assembly 160 may include the upper winding 174. As such, the primary of the noted single turn transformer is the power line 16, and the secondary of this single turn transformer may be the lower winding 144 by itself, may be the upper winding 174 by itself, or collectively may be the lower winding 144 and the upper winding 174.

The housing 40 of the DSR 30 also at least substantially encloses electronics 200 for undertaking various operations of the DSR 30. The electronics 200 are disposed within the lower housing section 80, and are separated from the lower core assembly 130 by a partition or barrier 82. This partition 82 may provide shielding for the electronics 200, such as shielding against electromagnetic interference. Any appropriate shielding material may be utilized for the partition 82.

A pair of first or lower clamps 64 are associated with the lower core assembly 130, and may be anchored relative to the lower housing section 80 in any appropriate manner. A pair of second or upper clamps 66 are associated with the upper core assembly 160, and may be anchored relative to the upper housing section 120 in any appropriate manner. Although the clamps 64, 66 could directly engage the power line 16, in the illustrated embodiment a pair of line guards 20 are mounted on the power line 16 at locations that correspond with the position of each pair of clamps 64/66.

Figure 4C:
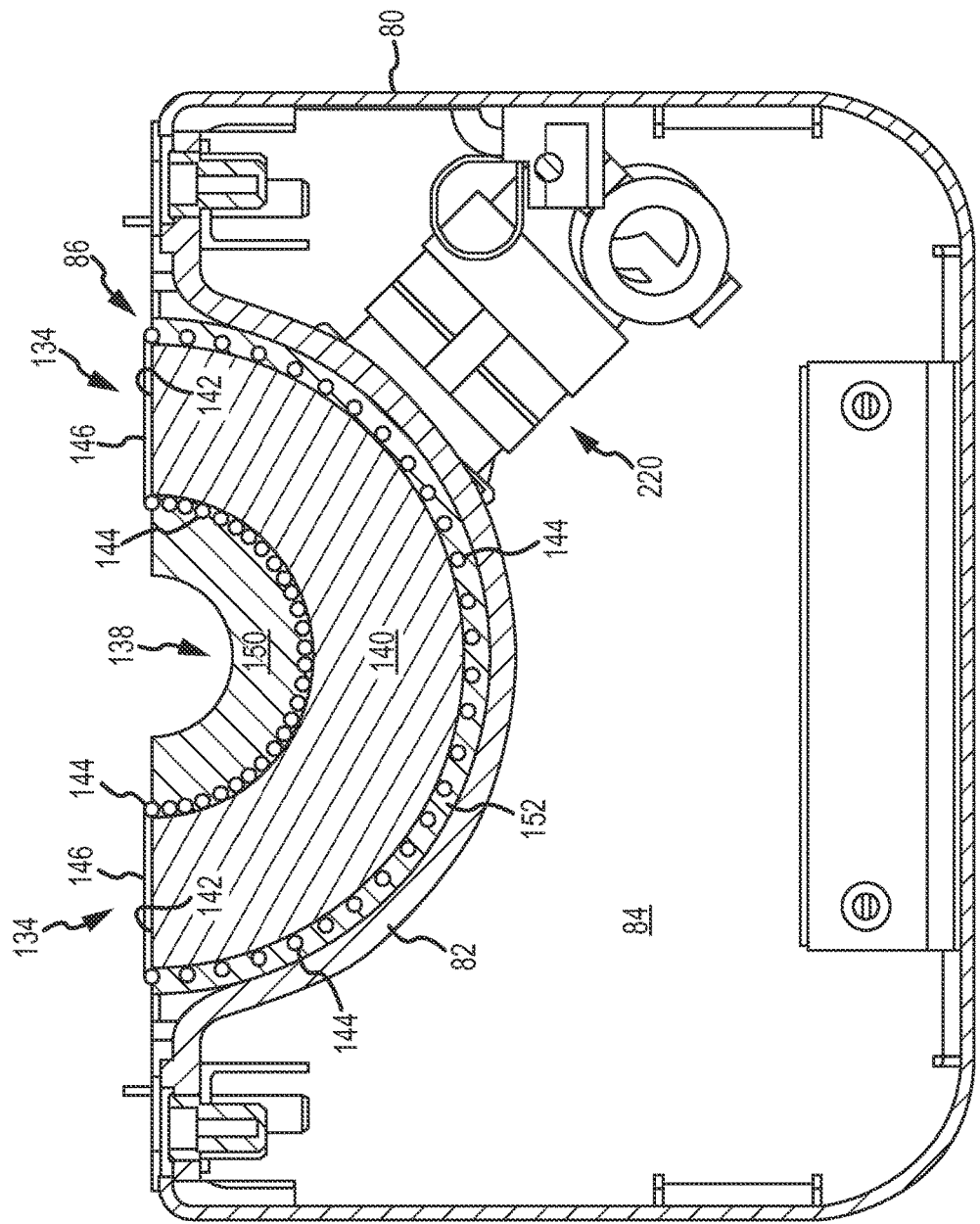
FIG. 4C is a cutaway view showing the lower core assembly seated within the lower housing section, and taken perpendicularly to the length dimension of the reactance module of FIGS. 2A/2B.

Additional views of the lower housing section 80 and lower core assembly 130 are presented in FIGS. 4A-4G. FIG. 4A shows the lower core assembly 130 being positioned within the lower housing section 80, while FIG. 4B shows the lower core assembly 130 being exploded away from the lower housing section 80. A barrier or partition 82 is associated with the lower housing section 80, and defines a lower or electronics compartment 84 and an upper or core compartment 86 (e.g., FIG. 4C). In one embodiment, the electronics compartment 84 is at least substantially waterproof. Moreover and as noted, the electronics compartment 84 may be shielded from the core assembly 50, for instance by the above-noted barrier or partition 82. In any case, the electronics 200 are disposed within the electronics compartment 84, while the lower core assembly 130 is disposed within the core compartment 86.

The lower core assembly 130 is retained by encapsulating sections 150, 152 within the lower housing section 80 (e.g., FIGS. 4B, 4C, and 4D). In one embodiment, the encapsulating sections 150, 152 are each in the form of a silicone elastomer encapsulant such as Sylgard® available from Dow Corning (the Sylgard® for the encapsulating sections 150, 152 may be matched to the dielectric and operational performance rating of the DSR 30). The encapsulating section 152 is disposed between the lower core assembly 130 and the partition 82 of the lower housing section 80. The encapsulating section 150 is disposed between the lower core assembly 130 and the power line 16. A first or lower power line cavity 138 extends along the length of the lower core assembly 130 (within the encapsulating section 150) for receiving a lower portion of the corresponding power line 16. FIG. 4D shows the relative position of the encapsulating sections 150, 152, with the lower core assembly 130 being removed to show this relative position.

A pair of first or lower end caps 90 are disposed at each of the two ends 42, 44 of the DSR 30, and are each detachably connected in any appropriate manner to the lower housing section 80. Each lower end cap 90 includes an end wall 92. A slot 94 extends through the entire thickness of the end wall 92, may be of any appropriate shape, and is part of the associated antenna 100. The slot 94 may be characterized as having a "folded configuration" to provide for a desired length. An antenna compartment 98 is disposed within each lower end cap 90. An end plate 88 (FIG. 4F) separates this antenna compartment 98 from the electronics compartment 84. Generally, each antenna 100 utilizes an aperture that extends through the housing 40 of the DSR 30, and this aperture may be of any appropriate shape/size, and may be incorporated in any appropriate manner (e.g., such an aperture could actually project downwardly when the DSR 30 is installed on a power line 16).

Other components of the antenna 100 are illustrated in FIGS. 4E, 4F, and 4G. Again, an antenna 100 is located at least generally at the two ends 42, 44 of the DSR 30 in the illustrated embodiment, with each antenna 100 being located within its corresponding antenna compartment 98. Each antenna 100 includes an antenna housing 102 of any appropriate size/shape and which may be formed from any appropriate material or combination of materials. The antenna housing 102 includes a back section 104, along with a plurality of side sections 106 (four in the illustrated embodiment) that extend to the back side of the end wall 92 of the corresponding lower end cap 90. As such, the end wall 92 of the corresponding lower end cap 90 may be characterized as defining an end of the antenna housing 102 that is disposed opposite of the back section 104.

An insert 110 (FIG. 4F) may be disposed within the antenna housing 102. This insert 110 may be formed from any appropriate material, for instance Teflon®. An insert 110 may not be required in all instances. In any case, a projection 112 may be formed on an end of the insert 110, and extends into the slot 94 on the end wall 92 of its corresponding lower end cap 90. The antenna housing 102 defines an internal cavity 108 having an exciter or probe 114. The antenna 100 may be characterized as a slotted antenna or as a cavity-backed slot antenna. Notably, neither antenna 100 protrudes beyond an outer perimeter of the housing 40 for the DSR 30.

Figure 4H:
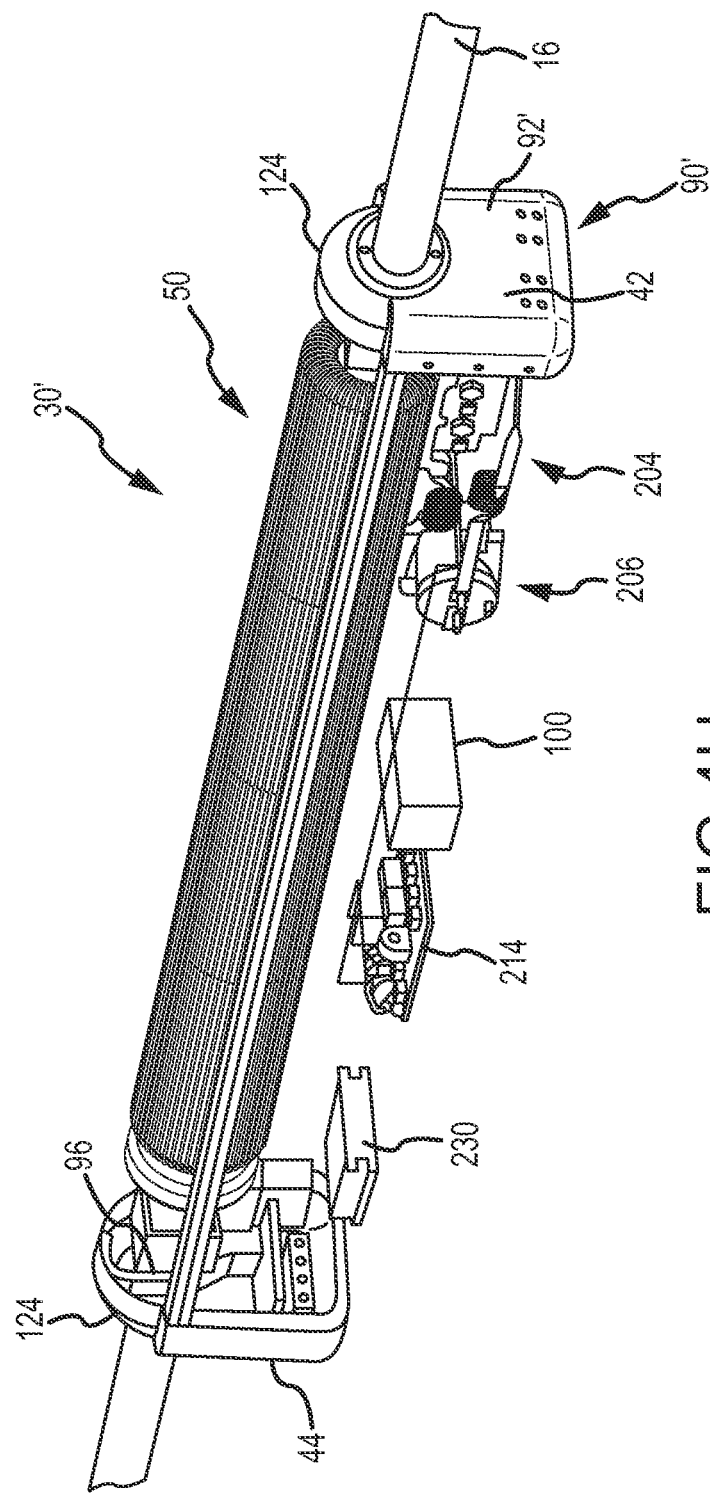
FIG. 4H is a perspective view of a variation of the lower housing section from the reactance module of FIGS. 2A/2B, and which incorporates installation hooks.

A variation of the DSR 30 is presented in FIG. 4H in the form of a DSR 30'. Corresponding components of these two embodiments are identified by the same reference numerals. Those corresponding components that differ are further identified by a "single prime" designation in FIG. 4H. Unless otherwise noted, the DSR 30' includes the same features as the DSR 30.

One difference between the DSR 30 and the DSR 30' is that there is a single antenna 100 in the case of the DSR 30' of FIG. 4H. This single antenna 100 may be disposed at an appropriate location between the ends 42, 44 of the DSR 30 (e.g., within the housing 40). In the illustrated embodiment, the antenna 100 is disposed at least generally midway between the ends 42, 44 of the DSR 30'. Relatedly, the end wall 92' of the two lower end caps 90' need not include a slot 94. Instead, a similar slot would be included on the bottom of the housing 40 to accommodate the antenna 100 for the DSR 30' (i.e., on the surface of the first housing section 80 that projects in a downward direction when the DSR 30' is installed on a power line 16).

Another difference between the DSR 30 and the DSR 30' of FIG. 4H is that the DSR 30' includes a pair of installation hooks 96. One installation hook 96 may be disposed within the lower end cap 90' at each of the ends 42, 44 of the DSR 30'. Each installation hook 96 may be anchored in any appropriate manner relative to the first housing section 80 of the DSR 30'. That is, the installation hooks 96 will move collectively with the lower housing section 80 during installation of the DSR 30' on a power line 16. It should be appreciated that the installation hooks 96 could also be integrated into the structure of the DSR 30 in any appropriate manner.

The installation hooks 96 facilitate installation of the DSR 30' on a power line 16. Generally, the first housing section 80 of the DSR 30' may be suspended from a power line 16 by disposing each of the installation hooks 96 on the power line 16 (the installation hooks 96 engaging the power line 16 at locations that are spaced along the length of the power line 16; the installation hooks 96 could be positioned directly on the power line 16, or on a corresponding line guard 20). The second housing section 120 may then be positioned over each of the power line 16 and the first housing section 80. At this time, the second housing section 120 may be supported by the power line 16 and/or the first housing section 80.

With the second housing section 120 being properly aligned with the first housing section 80, a plurality of fasteners may be used to secure the second housing section 120 to the first housing section 80. As the second housing section 120 is being connected to the first housing section 80, (e.g., as the various fasteners are rotated), the first housing section 80 may be lifted upwardly in the direction of the second housing section 120, which in turn will lift the installation hooks 96 (again, fixed relative to the first housing section 80) off of the power line 16. Ultimately, the installation hooks 96 are received within the hollow interior of the second or upper end caps 124 of the second housing section 120. Once the second housing section 120 and the first housing section 80 are appropriately secured together, both installation hooks 96 will be maintained in spaced relation to the power line 16.

Figure 5C:
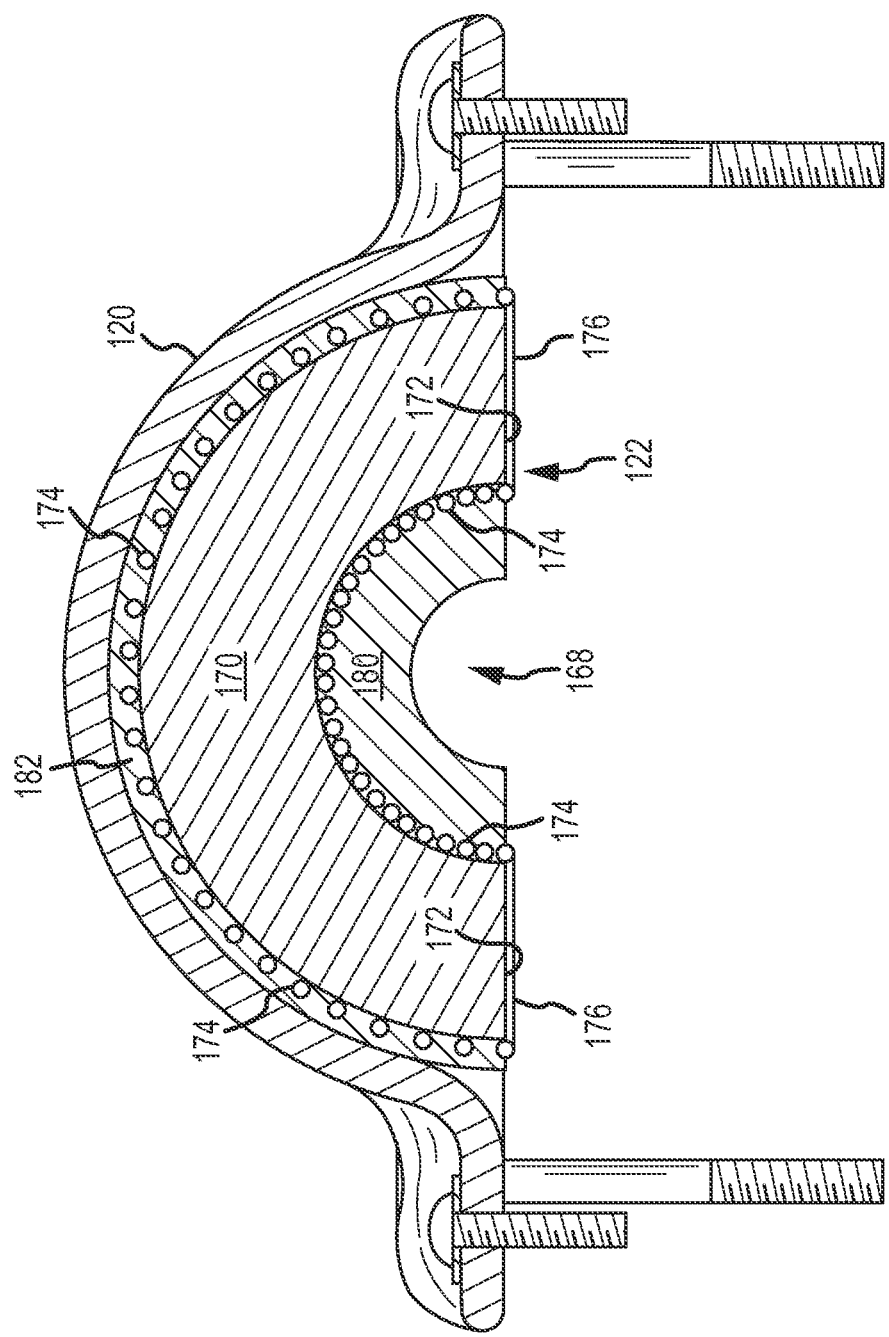
FIG. 5C is a cutaway view showing the upper core assembly seated within the upper housing section, and taken perpendicularly to the length dimension of the reactance module of FIGS. 2A/2B.

Additional views of the upper housing section 120 and upper core assembly 160 are presented in FIGS. 5A-5D. FIG. 5A shows the upper core assembly 160 being exploded away from the upper housing section 120 (the upper core assembly 160 being received within a core compartment 122 of the upper housing section 120), while FIG. 5B shows the upper core assembly 160 being positioned within the upper housing section 120 (more specifically within the core compartment 122). A pair of second or upper end caps 124 are detachably connected to opposite ends of the upper housing section 120 and define corresponding portions of the two ends 42, 44 of the DSR 30.

Figure 5D:
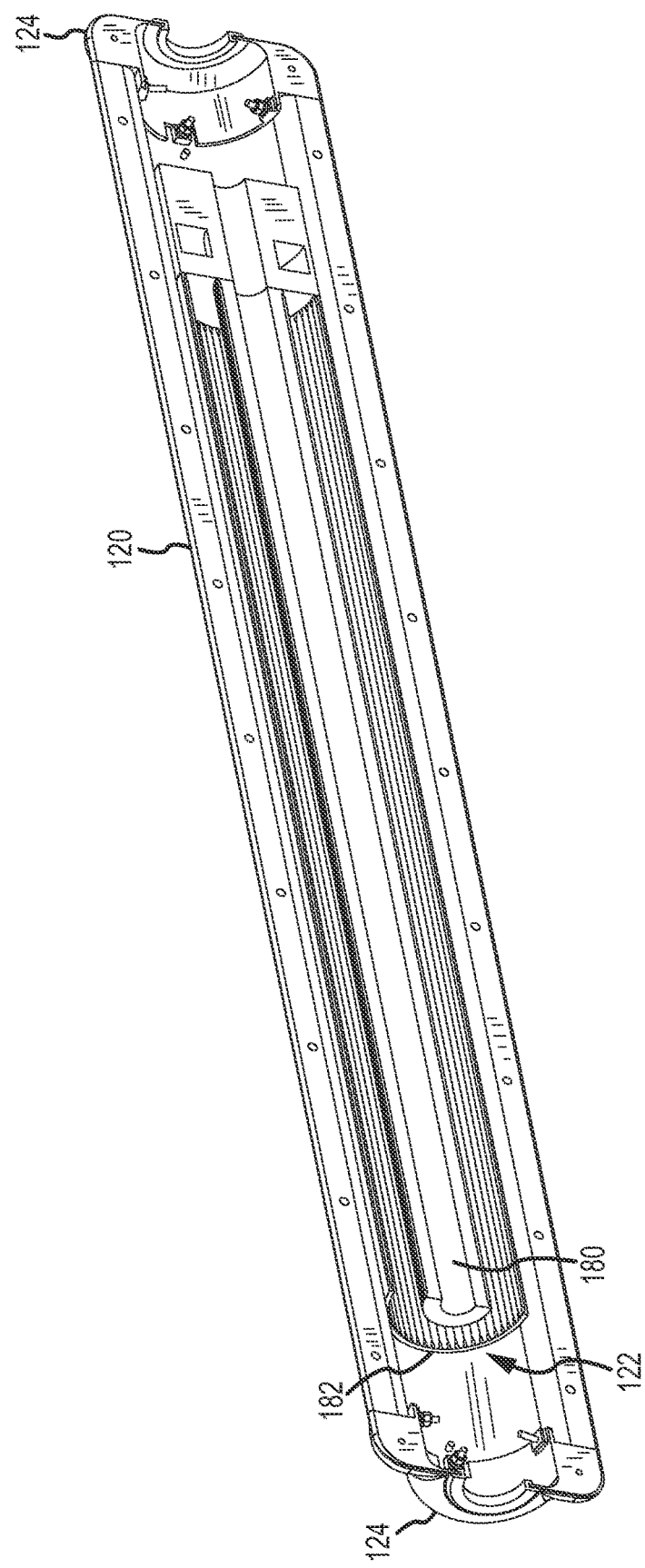
FIG. 5D is a perspective view of the interior of the upper housing section from the reactance module of FIGS. 2A/2B, and illustrating the encapsulating sections for the upper core assembly.

Referring now to FIG. 5C, the upper core assembly 160 is retained by encapsulating sections 180, 182 within the upper housing section 120. In one embodiment, the encapsulating sections 180, 182 are a silicone elastomer encapsulant such as the above-noted Sylgard®. The encapsulating section 182 is disposed between the upper core assembly 160 and the upper housing section 120. The encapsulating section 180 is disposed between the upper core assembly 160 and the power line 16. A second or upper power line cavity 168 extends along the length of the upper core assembly 160 (within the encapsulating section 180) for receiving an upper portion of the corresponding power line 16. FIG. 5D shows the relative position of the encapsulating sections 180, 182, with the upper core assembly 160 being removed to show this relative position.

Figure 6B:
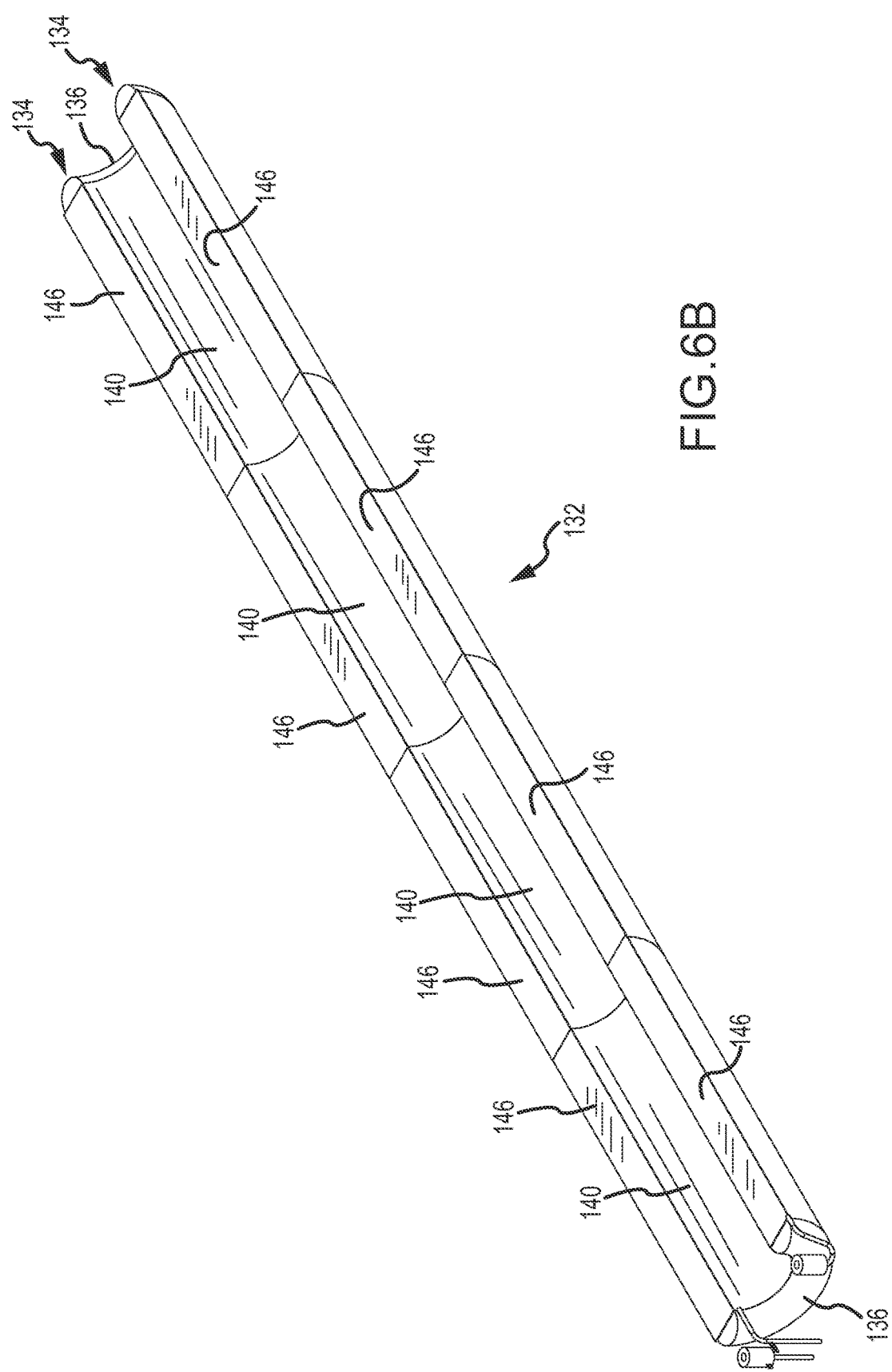
FIG. 6B is a perspective view of the lower core section for the lower core assembly from the reactance module of FIGS. 2A/2B, illustrating spacers installed on faces of the individual lower core segments that collectively define the lower core section.
Figure 7A:
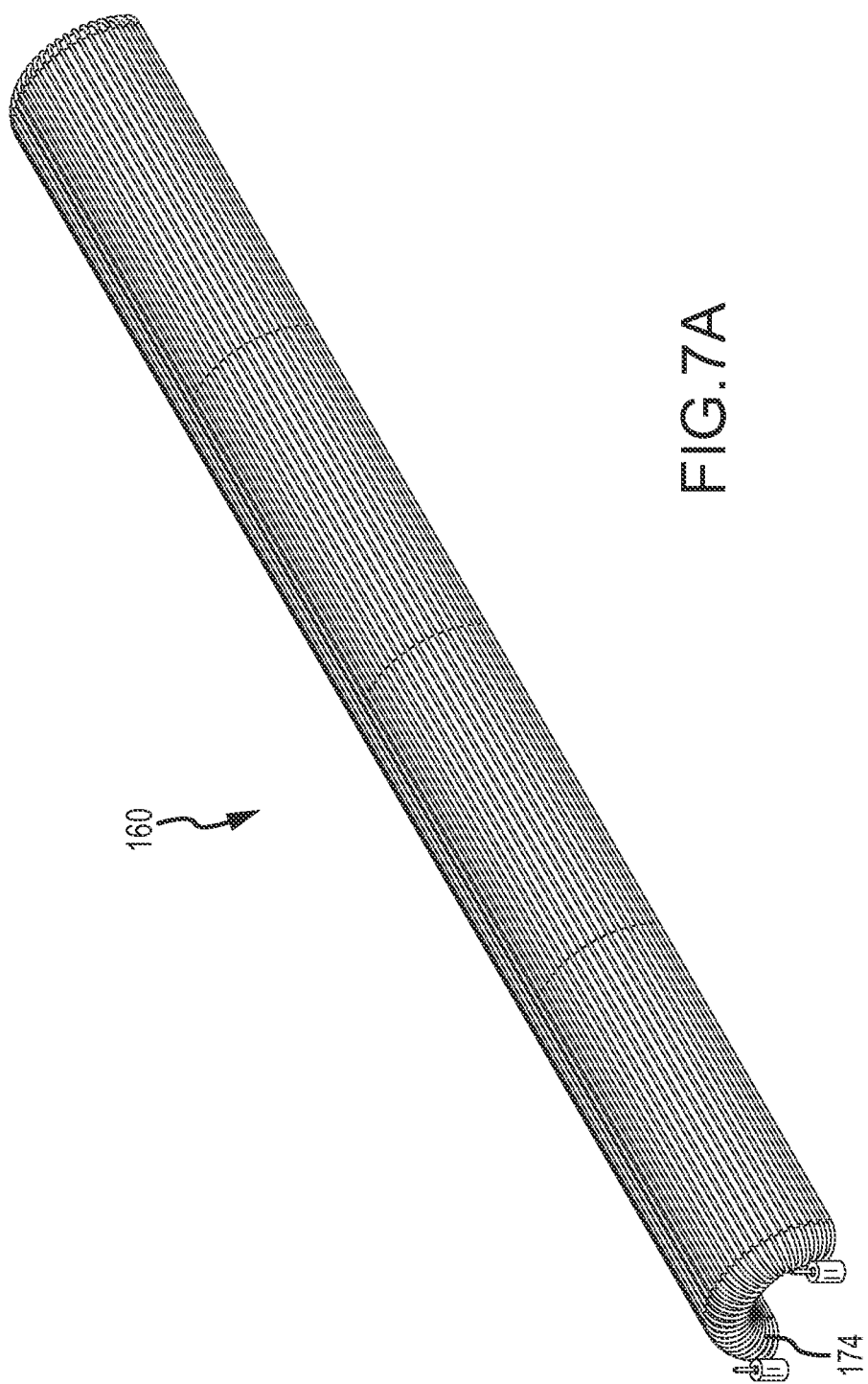
FIG. 7A is a perspective view of the upper core assembly from the reactance module of FIGS. 2A/2B.
Figure 7B:
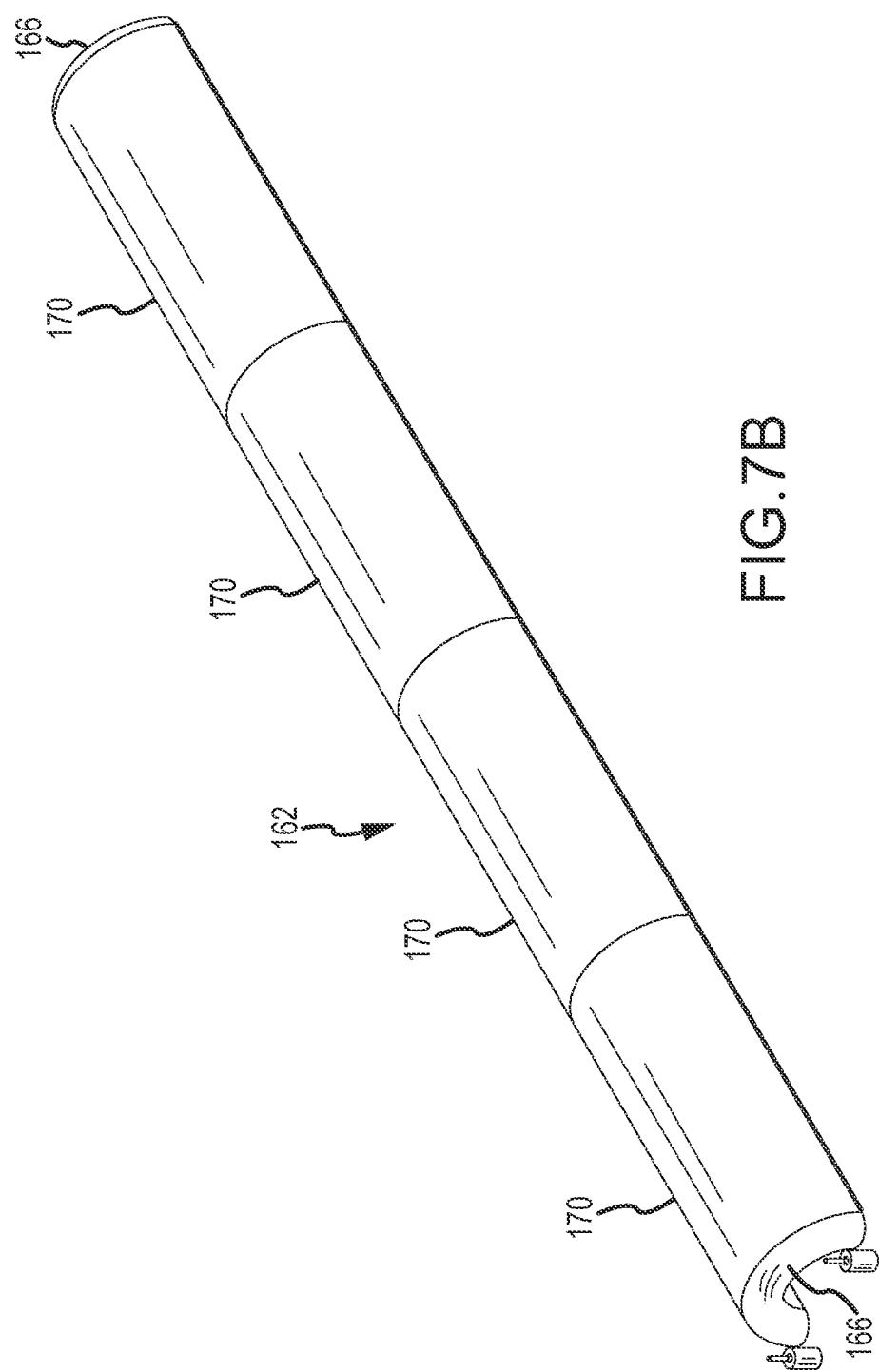
FIG. 7B is a top perspective view of the upper core section for the upper core assembly from the reactance module of FIGS. 2A/2B.
Figure 7C:
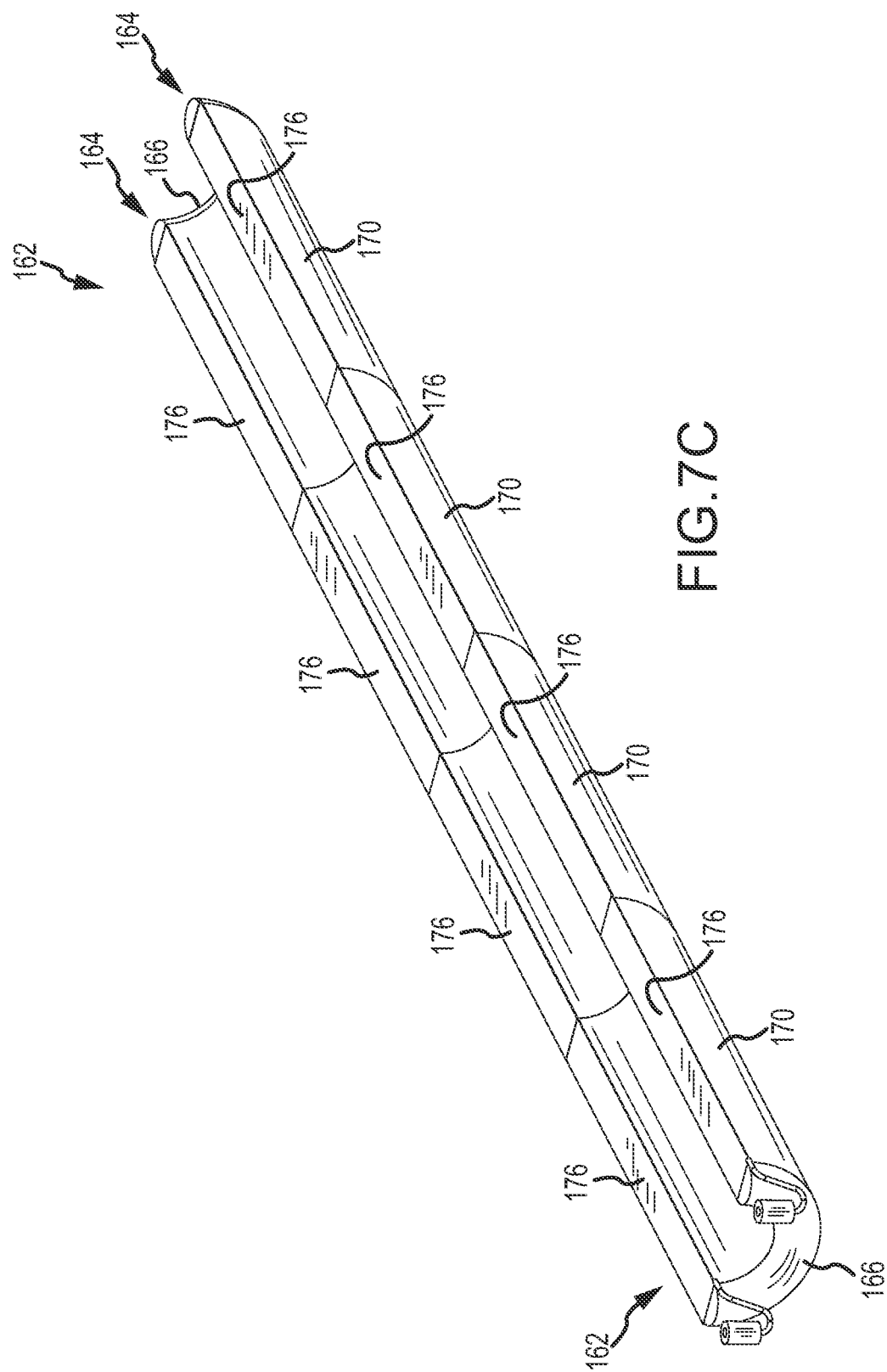
FIG. 7C is a bottom perspective view of the upper core section for the upper core assembly from the reactance module of FIGS. 2A/2B, illustrating spacers installed on faces of the individual lower core segments that collectively define the lower core section.

FIGS. 6A-6C present various enlarged views pertaining to the lower core assembly 130. The lower core assembly 130 includes a first or lower core section 132 (FIG. 6B) having a pair of oppositely disposed ends 136. A first or lower winding 144 (FIG. 6A) wraps around the lower core section 132 between its two ends 136.

The lower core section 132 of the lower core assembly 130 is collectively defined by a plurality of first or lower core segments 140 that are disposed in end-to-end relation. Any appropriate number of individual lower core segments 140 may be utilized (four in the illustrated embodiment). Adjacent lower core segments 140 may be disposed in abutting relation, or adjacent lower core segments 140 may be separated from one another by an appropriate space (typically a small space, such as a space of no more than about ⅛ inches).

Each lower core segment 140 includes a pair of faces 142 (FIGS. 6C and 4C) that extend along opposite sides of the corresponding lower core segment 140 in its length dimension. The faces 142 on each of the two sides of the lower core section 132 may be characterized as collectively defining a core section face (i.e., the lower core section 132 may be characterized as having two core section faces, with each of the core section faces being defined by the faces 142 of the lower core segments 140 on a common side of the lower core section 132). Each face 142 is in the form of an at least substantially planar or flat surface. The faces 142 of the various lower core segments 140 are disposed in at least substantially coplanar relation (e.g., the various faces 142 are at least substantially disposed within a common reference plane). A separate spacer 146 (e.g., FIGS. 6A, 6B, 4C) is appropriately secured (e.g., bonded; adhesively attached) to each face 142 of each lower core segment 140. A single spacer could collectively extend over those faces 142 of the various lower core segments 142 that are on a common side of the lower core segments 142 (not shown). In any case and in one embodiment, each spacer 146 is in the form of tape or a dielectric film, for instance a polyamide film (e.g., Kapton® tape available from DuPont Company). Kapton® tape dimensions for each spacer 146 (as well as spacers 176 addressed below) may be specific to the magnetization and loss performance ratings of the DSR 30.

The spacers 146 on a common side of the lower core section 132 may be characterized as collectively defining an interface 134. Therefore, the lower core section 132 includes a pair of laterally spaced interfaces 134 that each extend along the entire length of the lower core section 132 (e.g., between its opposing ends 136). One embodiment has each spacer 146 having a thickness within a range of about 0.07 inches to about 0.13 inches, although other thicknesses may be appropriate (e.g., to realize a desired amount of reactance to be injected into the power line 16 by the core assembly 50). Generally, the spacers 146 associated with the lower core section 132 contribute to providing and maintaining a desired and controlled physical and electric/magnetic spacing between the lower core assembly 130 and the upper core assembly 160.

FIGS. 7A-7D present various enlarged views pertaining to the upper core assembly 160. The upper core assembly 160 includes a second or upper core section 162 (FIG. 7B) having a pair of oppositely disposed ends 166. A second or upper winding 174 (FIG. 7A) wraps around the upper core section 162 between its two ends 166.

The upper core section 162 of the upper core assembly 160 is collectively defined by a plurality of second or upper core segments 170 that are disposed in end-to-end relation. Any appropriate number of individual upper core segments 170 may be utilized (four in the illustrated embodiment). Adjacent upper core segments 170 may be disposed in abutting relation, or adjacent upper core segments 170 may be separated from one another by an appropriate space (e.g., in accordance with the discussion presented above on the lower core section 132).

Each upper core segment 170 includes a pair of faces 172 (FIGS. 7D and 5C) that extend along opposite sides of the corresponding upper core segment 170 in its length dimension. The faces 172 on each of the two sides of the upper core section 162 may be characterized as collectively defining a core section face (i.e., the upper core section 162 may be characterized as having two core section faces, with each of the core section faces being defined by the faces 172 of the upper core segments 170 on a common side of the upper core section 162). Each face 172 is in the form of an at least substantially planar or flat surface. The faces 172 of the various upper core segments 170 are disposed in at least substantially coplanar relation (e.g., the various faces 172 are at least substantially disposed within a common reference plane). A separate spacer 176 (e.g., FIGS. 7A, 7B, 5C) is appropriately secured (e.g., bonded; adhesively attached) to each face 172 of each upper core segment 170. A single spacer could collectively extend over those faces 172 of the various upper core segments 170 that are on a common side of the upper core segments 170. In any case and in one embodiment, each spacer 176 is in the form of tape or a dielectric film, for instance a polyamide film (e.g., Kapton® tape, noted above).

The spacers 176 on a common side of the upper core section 162 may be characterized as collectively defining an interface 164. Therefore, the upper core section 162 includes a pair of laterally spaced interfaces 164 that each extend along the entire length of the upper core section 162 (e.g., between its opposing ends 166). One embodiment has each spacer 176 having a thickness within a range of about 0.07 inches to about 0.13 inches, although other thicknesses may be appropriate (e.g., to realize a desired amount of reactance to be injected into the power line 16 by the core assembly 50). Generally, the spacers 176 associated with the upper core section 162 contribute to providing and maintaining a desired and controlled physical and electric/magnetic spacing between the lower core assembly 130 and the upper core assembly 160.

When the upper core assembly 160 is properly aligned with the lower core assembly 130, the interface 164 on one side of upper core assembly 160 will engage the interface 134 on the corresponding side of the lower core assembly 130. Similarly, the interface 164 on the opposite side of upper core assembly 160 will engage the interface 134 on the corresponding side of the lower core assembly 130. Having each spacer 176 on the upper core assembly 160 engage a corresponding spacer 146 on the lower core assembly 130 maintains a desired physical and electric/magnetic spacing between the upper core assembly 160 and the lower core assembly 130 (e.g., a spacing within a range of about 0.14 inches to about 0.26 inches at the corresponding interfaces 134/164, although other spacings may be appropriate).

Figure 8A:
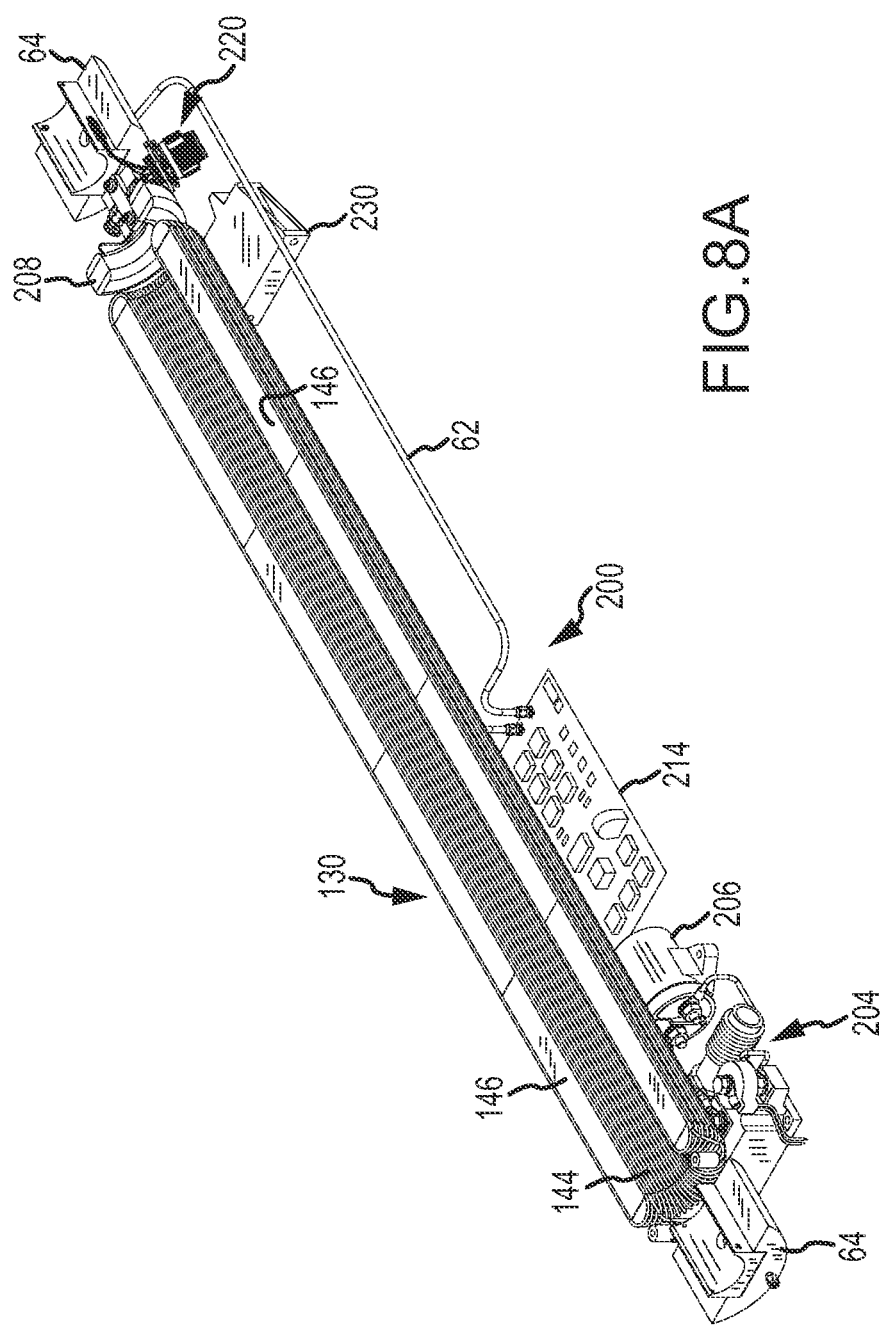
FIG. 8A is one perspective view of the lower core assembly and electronics from the reactance module of FIGS. 2A/2B.
Figure 8B:
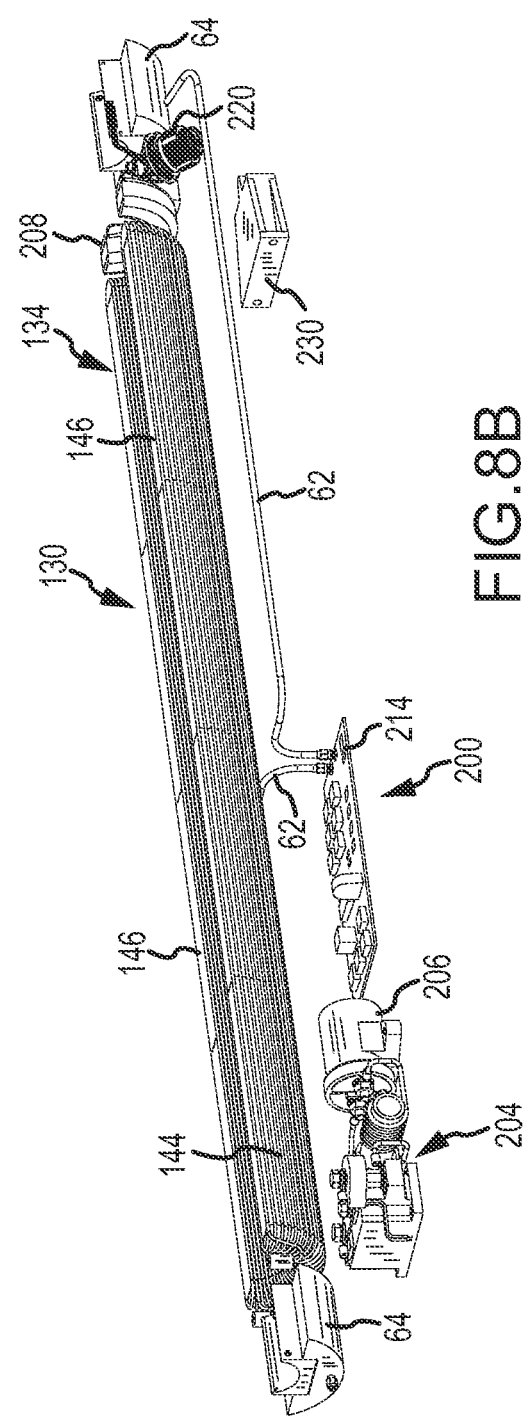
FIG. 8B is another perspective view of the lower core assembly and electronics from the reactance module of FIGS. 2A/2B.

FIGS. 8A and 8B present additional views of the lower core assembly 130 and the electronics 200. The electronics 200 includes a printed circuit, control board, or controller 214, a second electrical switch 206 (e.g., a contactor, bypass switch, or contact relay), a first electrical switch 204 (e.g., an SCR), an MOV (metal oxide varistor) 230, and a fault protection system 220 (again, these components are located within the electronics compartment 84 of the lower housing section 80, and are isolated from the core assembly 50 by the barrier or partition 82). A separate antenna cable 62 is also located within the electronics compartment 84 and extends from the controller 214 to each of the two antennas 100 for the DSR 30. The first electrical switch 204 (e.g., SCR) and the fault protection system 220 are utilized by the DSR 30 in fault current or surge conditions encountered in the power line 16 on which the DSR 30 is mounted. The MOV 230 is used by the DSR 30 for lightning protection. The controller 214 controls operation of the second electrical switch 206 (e.g., contactor), which in turn establishes the mode of the core assembly 50. The core assembly 50 may be disposed in either of first or second modes. In the second or injection mode, the core assembly 50 injects reactance into the power line 16 on which the DSR 30 is mounted (inductance for the illustrated configuration of the DSR 30, although the DSR 30 may be configured to instead inject capacitance as noted above). In the first or non-injection mode, the core assembly 50 injects little or no reactance into the power line 16 on which the DSR 30 is mounted.

Figure 9:
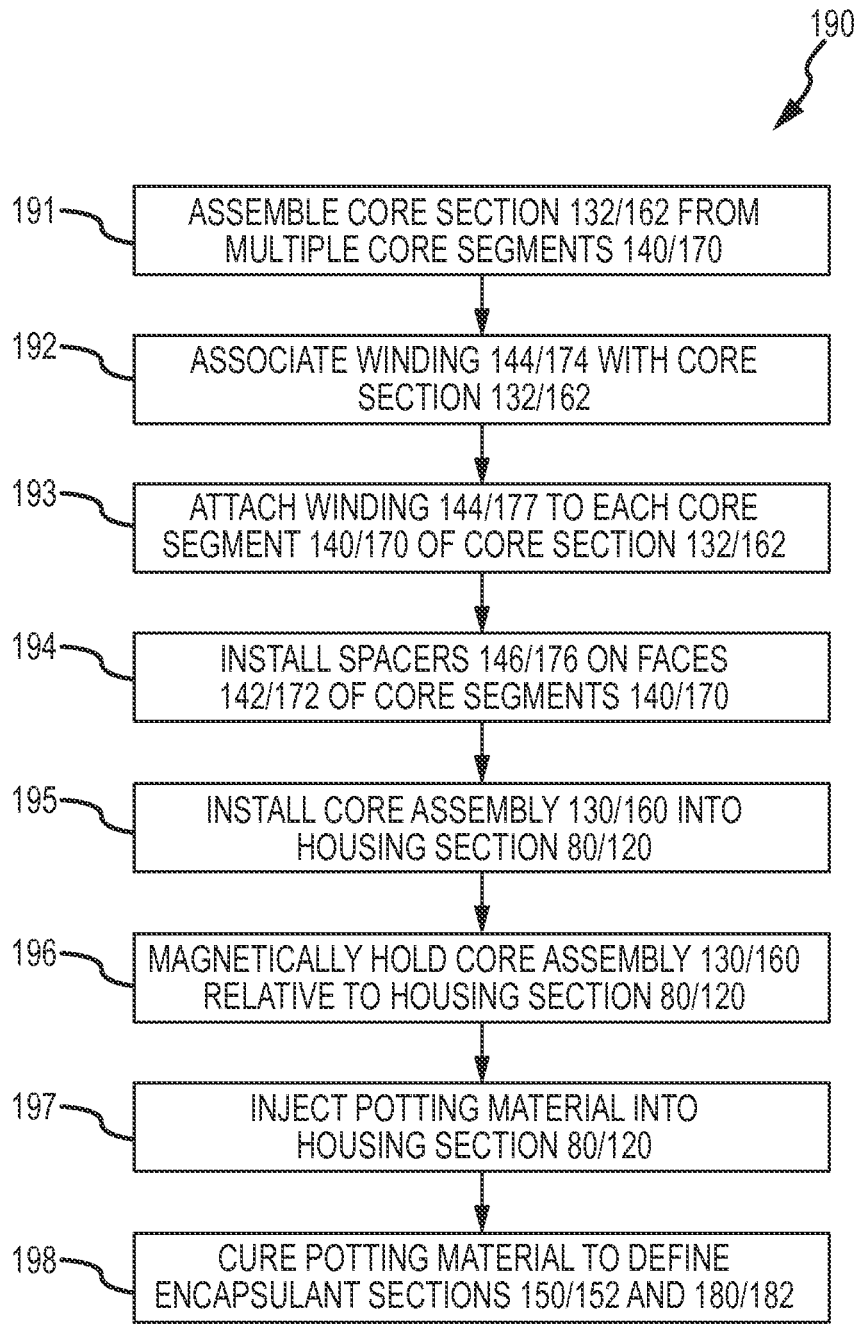
FIG. 9 is one embodiment of a protocol for assembling the reactance module of FIGS. 2A/2B.

One embodiment of a protocol for assembling the above-described DSR 30 is presented in FIG. 9 and is identified by reference 190. The protocol 190 is applicable to assembling the lower core assembly 130 within the lower housing section 80, as well as to assembling the upper core assembly 160 within the upper housing section 120 (including simultaneously (e.g., using different machine sets) or sequentially (e.g., using a common machine set). Hereafter, the protocol 190 will be described with regard to assembling the lower core assembly 130 within the lower housing section 80.

The lower core section 132 may be assembled by disposing the first core segments 140 in alignment (step 191). The ends of adjacent first core segments 140 may be disposed in abutting relation, or a small space may exist between each adjacent pair of first core segments 140. In one embodiment, the various first core segments 140 are positioned within an appropriate jig for purposes of step 191 of the protocol 190.

The first winding 144 may be associated with the assembled first core section 132 pursuant to step 192 of the protocol 190. The first winding 144 may be created/defined "off the first core section 132", and then separately positioned on the first core section 132 (so as to extend between its ends 136) for purposes of step 192. Another option would be to wind wire on the assembled first core section 132 (around its ends 136) to create/define the first winding 144 for purposes of step 192 of the protocol 190. In any case, the first winding 144 may be attached to the first core section 132 in any appropriate manner, for instance using an epoxy (step 193). In one embodiment, the first winding 144 is separately attached to each of the individual first core segments 140 that collectively define the first core section 132.

Spacers 146 may be installed on the various faces 142 of the first core segments 140 that collectively define the first core section 132 (step 194). Steps 192-194 may be executed in any appropriate order (e.g., step 194 could be executed prior to or after step 192). In one embodiment, a separate spacer 146 is provided for each face 142 of each first core segment 140. Any appropriate adhesive and/or bonding technique may be used to attach the spacers 146 to the corresponding first core segment 140 (more specifically, to one of its faces 142).

The first core assembly 130 is positioned within the first housing section 80 (step 195). The lower core assembly 130 is magnetically held relative to the lower housing section 80 (step 196). An appropriate jig may be used for purposes of step 196. Step 196 may entail using one or more magnets to maintain the various faces 142 (of the lower core segments 140 that collectively define the lower core section 132) in at least substantially coplanar relation (e.g., to dispose the faces 142 in a common reference plane), to maintain a desired spacing between the lower core assembly 130 and the interior of the lower housing section 80 in a desired spaced relation (e.g., the partition 82), or both. In one embodiment, each face 142 of each lower core segment 140 is positioned against a flat or planar surface of a corresponding magnet (e.g., a separate magnet may be provided for each lower core segment 140). Thereafter, a potting material (e.g., Sylgard®) is injected to encapsulate all but the upper surfaces of the spacers 146 of the lower core assembly 130 within the lower housing section 80 (step 197), and this potting material is allowed to cure in any appropriate manner to define the encapsulating sections 150, 152 discussed above (step 198).

A representative electrical block diagram of the DSR 30 is presented in FIG. 10. The DSR 30 may be characterized as including a first device 202 (e.g., a transformer that includes the core assembly 50 of the DSR 30), the above-noted first electrical switch 204 (e.g., an SCR), the above-noted second electrical switch 206 (e.g., a contact relay), a current transformer 208, a power supply 210, a current monitor 212, and the above-noted controller 214. Again, the DSR 30 may be mounted on a power line 16 such that reactance may be injected into the power line 16. The first device 202 may be in the form of (or part of) a reactance injecting circuit, for instance a single turn transformer. The first device 202 may be disposable in each of first and second modes. For example, switching the first device 202 from the first mode to the second mode may increase the injected reactance being input to the power line 16 when the DSR 30 is mounted on the power line 16. The first device 202 may be operably connected to the controller 214 via the first electrical switch 204 (e.g., SCR) and/or the second electrical switch 206 (e.g., a contact relay). In other words, the first device 202 may be operably connected with the first electrical switch 204, the second electrical switch 206, and/or the controller 214.

In one embodiment, the first electrical switch 204 (e.g., an SCR) may be a solid-state semiconductor device, for instance a thyristor pair. The first electrical switch 204 may be operably connected to the first device 202 and/or the controller 214. In this regard, the first electrical switch 204 may be operable to control the injection of reactance into the power line 16. For example and when the first electrical switch 204 is closed, a minimum level of reactance, corresponding to the first device 202 leakage reactance, is injected into power line 16. In another example and when the first electrical switch 204 is open and the second electrical switch 206 (e.g., a contact relay) is open, reactance is injected into power line 16. As will be discussed in more detail below, the first electrical switch 204 also may be operable to pass an overcurrent.

The controller 214 may be any computerized device (e.g., a microcontroller) that is operable to manage the operation of multiple devices and/or communicate with multiple devices in order to implement one or more control objectives. For example, the controller 214 may be operable to switch the first device 202 from the first mode to the second mode and/or communicate with any device of the DSR 30. In this regard, the controller 214 may be operably connected to the first electrical switch 204 (e.g., an SCR), the second electrical switch 206 (e.g., a contact relay), the first device 202, the current monitor 212, and/or the power supply 210. The controller 214 may switch the first device 202 from the first mode to the second mode via the second electrical switch 206. The first mode for the DSR 30 may be characterized as a bypass mode and the second mode for the DSR 30 may be characterized as an injection mode. When the second electrical switch 206 is closed (i.e., is conducting), the first device 202 is in bypass mode (e.g., the first device 202 is shorted) and little or no reactance is injected into the power line 16 via the DSR 30. When the second electrical switch 206 is open (such that the first device 202 is an open circuit) the first device 202 is in injection mode where reactance is injected into the power line 16.

The controller 214 may switch the first device 202 from bypass mode to injection mode when the current monitor 212 determines that a current of the power line 16 satisfies a predetermined threshold. For example, the current monitor 212 may be operable to measure the current on the power line 16 (at the DSR 30) and communicate the measured current to the controller 214. If the measured current satisfies the predetermined threshold (e.g., if the current is greater than the threshold, or is equal to or greater than the threshold, as the case may be), the controller 214 may switch the first device 202 from bypass mode to injection mode by opening the second electrical switch 206 (e.g., contact relay) such that reactance is injected into the power line 16. Similarly, if the measured current thereafter no longer satisfies the predetermined threshold (e.g., if the measured current drops below the predetermined threshold), the controller 214 may switch the first device 202 from injection mode back to bypass mode by closing the second electrical switch 206 such that the first device 202 is shorted and such that no substantial reactance is injected into the power line 16. As such, the controller 214 may be operable to switch the first device 202 between the bypass and injection modes.

The current monitor 212 may measure the current on the power line 16 via the current transformer 208. In this regard, the current transformer 208 may be mounted on the power line 16 and may be a separate component from the first device 202. In one embodiment, the current transformer 208 may be operable to produce a reduced current that is proportional to the current of the power line 16 such that the current may be processed and/or measured by a measuring device (e.g., the current monitor 212) and/or the current may provide power to electronic components (e.g., the power supply 210). The power supply 210 may be operably connected with the current transformer 208 and/or the controller 214. In this regard, the power supply 210 may receive power from the current transformer 208 and provide power to the controller 214.

The DSR 30 may be mounted on the power line 16 such that an injected reactance may be input to the power line 16. In one embodiment, the injected reactance may be an inductive reactance (e.g., inductance). For example, when inductance is injected into the power line 16, the flow of current in the power line 16 may be reduced and diverted to underutilized power lines in interconnected and/or meshed power networks. In another embodiment, the injected reactance may be a capacitive reactance (e.g., capacitance). For example, when capacitance is injected into the power line 16, the flow of current in the power line 16 may be increased and diverted from power lines in interconnected and/or meshed power networks.

Figure 11A:
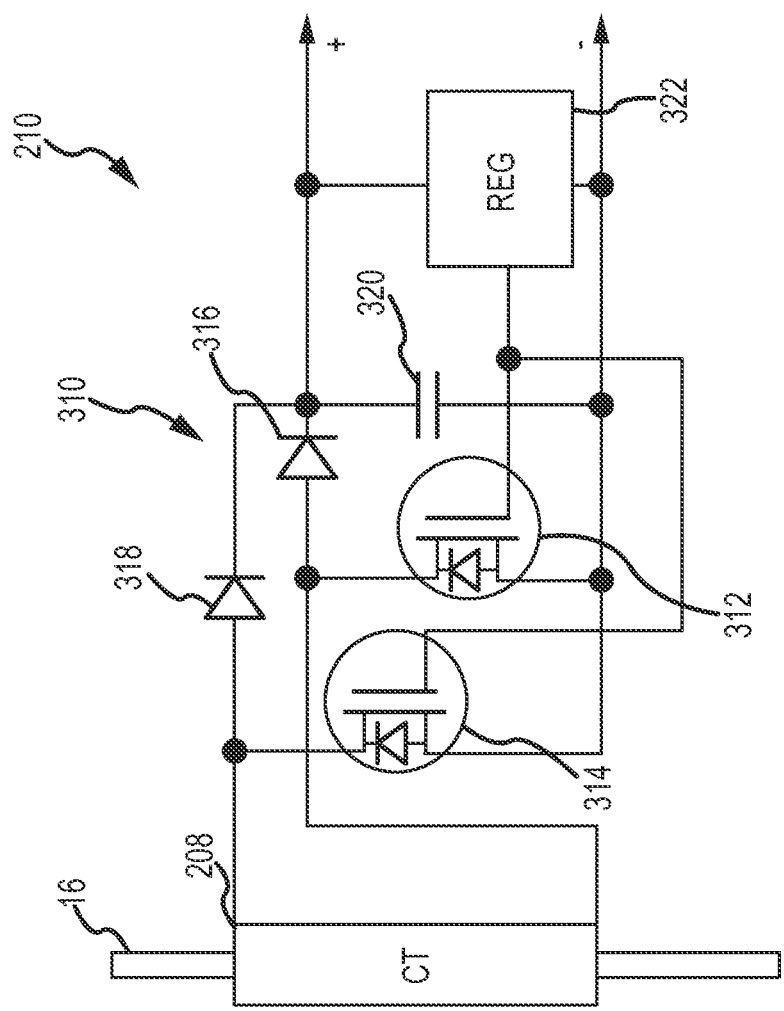
FIG. 11A is a schematic of an embodiment of a power supply from the electrical block diagram of FIG. 10.

FIG. 11A illustrates one embodiment that may be used as the power supply 210 for the DSR 30 addressed above in relation to FIG. 10. The power supply 210 of FIG. 11A includes a bridgeless power factor correction circuit or a bridgeless PFC 310 and a regulator 322. As discussed above, the power supply 210 may receive power from the current transformer 208 (where the power line 16 is the primary of the current transformer 208), and the current transformer 208 may be operable to produce a reduced current that is proportional to the current on the power line 16 such that the current transformer 208 may provide power to the power supply 210. In one embodiment, the current of the power line 16 may be characterized as a first current and the reduced current provided by the current transformer 208 may be characterized as a second current. In this regard, the current transformer 208 receives the first current and outputs the second current, the second current is different than the first current, and the second current is proportional to the first current.

The second current may be based at least on the number of turns of a secondary winding (not illustrated) of the current transformer 208. For example, the secondary winding of the current transformer 208 may comprise 100 turns. In this example, the second current would be $\frac{1}{100}$ of the first current (i.e., the first current is 100 times the second current). The current transformer 208 may be configured to provide any desired reduction of the current on the power line 16.

The bridgeless PFC 310 includes the current transformer 208, a first controllable switch 312, a second controllable switch 314, a first rectifier 316, a second rectifier 318, and a capacitor 320. The first rectifier 316 may be operably connected to the first controllable switch 312 and the second rectifier 318 may be operably connected to the second controllable switch 314. In this regard, the operation of the first and second rectifiers 316, 318 may be dependent on the operation of the first and second controllable switches 312, 314, respectively. For example, the first and second rectifiers 316, 318 may output a current to the capacitor 320 based on the state of the first and second controllable switches 312, 314, respectively. The first and second rectifiers 316, 318 may be any silicon-based semiconductor switch (e.g., diodes). The first and second controllable switches 312, 314 may be any semiconductor transistors (e.g., MOSFETs). The first and second controllable switches 312, 314 also may be operably connected to the regulator 322. In this regard, the regulator 322 may be configured to switch each of the first and second controllable switches 312, 314 between a conducting state and a non-conducting state.

As discussed above in relation to FIG. 10, the power supply 210 may provide power to the controller 214 of the DSR 30. The power supply 210 may be operable to output a regulated voltage (e.g., a 24 VDC output) to the controller 214. When the regulated voltage satisfies a predetermined threshold (e.g., if the regulated voltage is greater than the threshold, or is equal to or greater than the threshold), the regulator 322 may switch the first and second controllable switches 312, 314 to the conducting state. In one embodiment, the predetermined threshold may be within a range from about 23.9V to about 24.1V. This predetermined threshold may be a standard design power supply voltage for the system. When the first and second controllable switches 312, 314 are in the conducting state, the output current from the first and second rectifiers 316, 318 may be shunted. For example, the second current received from the current transformer 208 may flow through the first and second controllable switches 312, 314 such that the power supply 210 is shorted and no or very little current flows through the first and second rectifiers 316, 318. As discussed above, the capacitor 320 may receive current from the first and second rectifiers 316, 318. As such, when the output current from the first and second rectifiers 316, 318 is shunted, the capacitor 320 may begin to discharge.

When the regulated voltage no longer satisfies the predetermined threshold (e.g., if the regulated voltage drops below the predetermined threshold), the regulator 322 switches the first and second controllable switches 312, 314 to the non-conducting state. When the first and second controllable switches 312, 314 are in the non-conducting state, the second current from the current transformer 208 may flow through the first and second rectifiers 316, 318. As such, the capacitor 320 may receive the output current from the first and second rectifiers 316, 318 and may begin to charge. In turn, the output voltage of the power supply 210 is regulated. In one embodiment, the regulator 322 may have an operating frequency substantially higher than the current frequency on the power line 16.

Figure 11B:
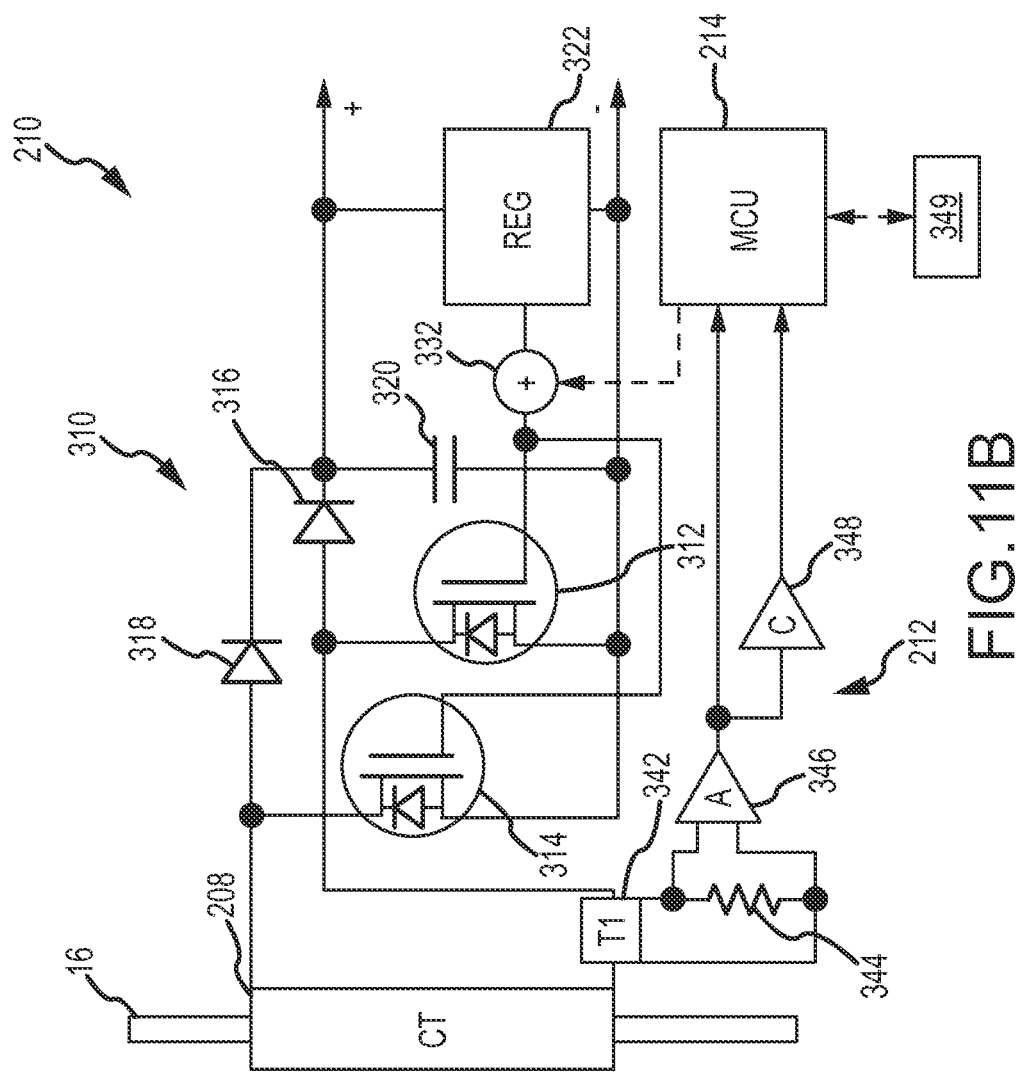
FIG. 11B is a schematic of an embodiment of a power supply and a current monitor from the electrical block diagram of FIG. 10.

As discussed above in relation to FIG. 10, the current monitor 212 may be operable to measure the current on the power line 16 (at the DSR 30) and communicate the measured current to the controller 214. One embodiment that may be used as the current monitor 212 is illustrated in FIG. 11B. The current monitor 212 of FIG. 11B may be operably connected to the current transformer 208, and furthermore may be configured to measure the second current from the current transformer 208. The current transformer 208 may be operable to output the second current to the power supply 210 through the current monitor 212. In this regard, the controller 214 may be configured to switch the current transformer 208 from a first state to a second state. The first state may include the current transformer 208 outputting the second current to the power supply 210. When the current transformer 208 is in the first state, the power supply 210 outputs the regulated voltage. The second state may include a measurement of the second current via the current monitor 212. When the current transformer 208 is in the second state, the first and second controllable switches 312, 314 are in the conducting state and the power supply 210 is shorted such that the second current flows through the first and second controllable switches 312, 314. Shunting the power supply 210 operation while the current transformer 208 is in the second state may remove any contribution of high-frequency switching noise, or other non-linearity associated with the power supply 210 operation from the measurement of the second current. As a result, the quality and signal-to-noise ratio of the current monitor 212 may be increased.

As illustrated in FIG. 11B, the controller 214 may include a logical summing device 332. The logical summing device 332 may be any simple logic element or programmable logic device such as a programmable logic array and a field-programmable gate array, to name a few. The logical summing device 332 may be configured to output a control signal. When the control signal is active, the current transformer 208 is in the second state and the first and second controllable switches 312, 314 are in the conducting state. This is true even if the regulated voltage no longer satisfies the predetermined threshold. In other words, when the power supply 210 is in normal operation, and the regulated voltage no longer satisfies the predetermined threshold, the first and second controllable switches 312, 314 are switched to the non-conducting state. However, if the control signal from the logical summing device 332 is active, the first and second controllable switches 312, 314 remain in the conducting state, resulting in the absence of influence of control pulses from the regulator 322 on the measurement of the second current. In this regard, the control signal from the logical summing device 332 may facilitate the measurement of the second current via the current monitor 212. When the current monitor 212 measures the second current, the second current may have a signal-to-noise ratio of at least about 48 dB.

The current monitor 212 may include an instrumental current transformer 342, a burden resistor 344, a differential amplifier 346, a comparator 348, and/or an analog-to-digital converter 349. The instrumental current transformer 342 may be operably connected to the current transformer 208 and configured to reduce the second current from the current transformer 208 to a third current. This third current may be less than the second current and proportional to the second current. This third current may be less than the first current (i.e., the current of the power line 16), and is proportional to the first current. The burden resistor 344 may be operably connected to the output of the instrumental current transformer 342 such that a voltage develops on the burden resistor 344. The voltage on the burden resistor 344 is proportional to the third current, and thus to the first and second currents. The differential amplifier 346 may be operably connected to the burden resistor 344 and may be configured to convert and/or amplify the voltage on the burden resistor 344. The analog-to-digital converter 349 may be operably connected to the differential amplifier 346 and the controller 214. As such, the differential amplifier 346 may send the analog-to-digital converter 349 an analog signal representative of the voltage on the burden resistor 344. In turn, the analog-to-digital converter 349 may be configured to determine the current on the power line 16. As will be discussed in more detail below, the comparator 348 may be operably connected to the differential amplifier 346 and the controller 214, and may be configured to send an interrupt signal to the controller 214.

Figure 12A:
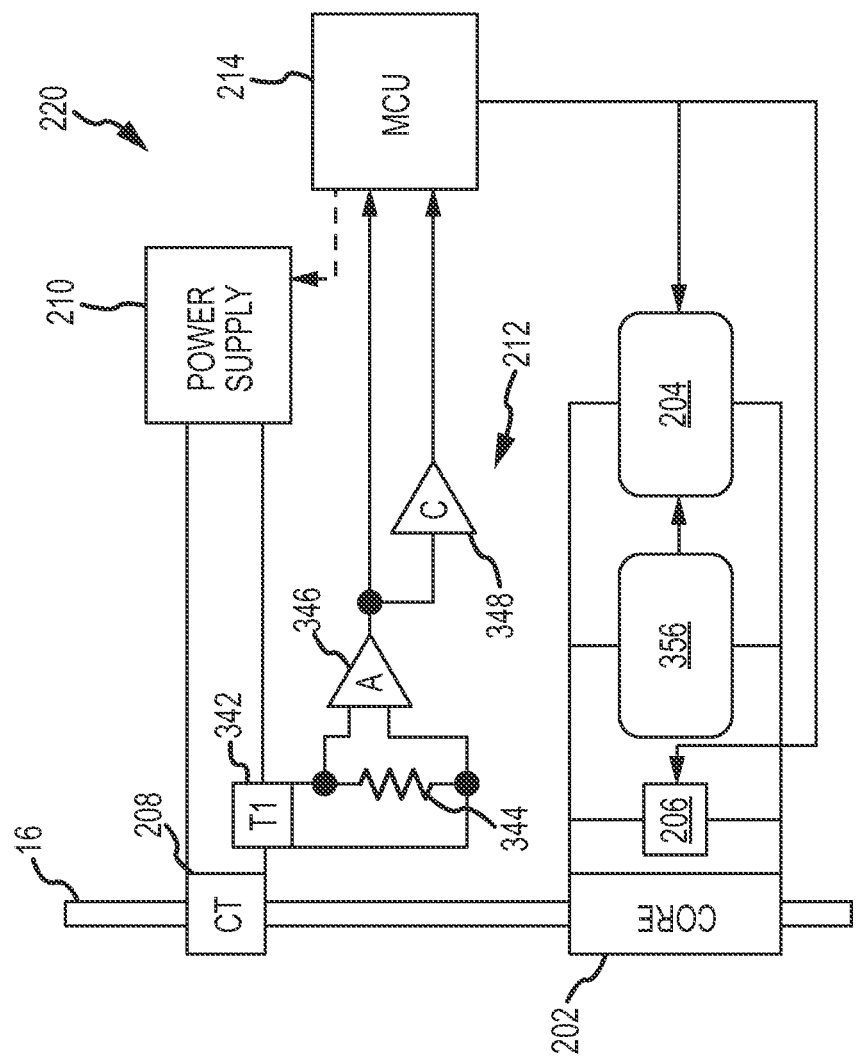
FIG. 12A is a schematic of an embodiment of a fault protection system for the reactance module of FIGS. 2A/2B.

FIG. 12A illustrates one embodiment for the above-noted fault protection system 220 of the DSR 30. The fault protection system 220 includes the power supply 210 (FIGS. 10 and 11A), the current monitor 212 (FIGS. 10 and 11B), a voltage detection circuit 356, the first device 202 (e.g., a transformer that uses the core assembly 50) addressed above (FIG. 10), and the first electrical switch 204 (e.g., an SCR; FIG. 10). The fault protection system 220 may include a plurality of different bypass sequences that are separately executable. The plurality of different bypass sequences may be executed to activate the first electrical switch 204 to short the first device 202. As discussed above, the first electrical switch 204 may be operable to pass an overcurrent. When the first electrical switch 204 is activated, the first electrical switch 204 may pass the overcurrent. In this regard, the plurality of different bypass sequences may be separately executed to protect the DSR 30 from overcurrent and/or fault conditions. The plurality of different bypass sequences may include first, second, and third bypass sequences.

The first bypass sequence may include the controller 214 activating the first electrical switch 204 (e.g., an SCR) to short the first device 202 (e.g., a transformer that uses the core assembly 50) based upon the controller 214 determining that an output from the current monitor 212 satisfies a first predetermined threshold (e.g., if the output is greater than the threshold, or is equal to or greater than the threshold). For example and as discussed above, the current monitor 212 may be one of the differential amplifier 346 or the analog-to-digital converter 349. As such, the output from the differential amplifier 346 may be an analog signal (e.g., a voltage signal) that gets sent to the analog-to-digital converter 349, where it is determined if the analog signal satisfies the first predetermined threshold. In this case, if the analog signal satisfies the first predetermined threshold, the controller 214 may activate the first electrical switch 204 to short the first device 202.

The second bypass sequence may include the comparator 348 sending a communication (e.g., an interrupt signal) to the controller 214, indicating that the output from the current monitor 212 satisfies a second predetermined threshold. For example and as discussed above, the comparator 348 may be operably connected with the differential amplifier 346 and the controller 214. As such, the output from the current monitor 212 may be the analog signal from the differential amplifier 346. The comparator 348 may receive the analog signal (e.g., a voltage signal) at its input, and determine if the voltage signal satisfies the second predetermined threshold. If the voltage signal satisfies the second predetermined threshold, the comparator 348 may send the interrupt signal to the controller 214. In this case, the controller 214 may activate the first electrical switch 204 (e.g., an SCR) to short the first device 202 (e.g., a transformer that uses the core assembly 50), in response to receiving the interrupt signal from the comparator 348. In other words, the interrupt signal may prompt the controller 214 to activate the first electrical switch 204. In order to activate the first electrical switch 204, the controller 214 may send a series of electrical pulses to the first electrical switch 204 such that the first electrical switch 204 begins conducting.

The output, i.e., the analog signal, may be representative of the current on the power line 16. For example, when the analog signal satisfies the first predetermined threshold, this may indicate that the current on the power line 16 is at least about 1100 Amps. In another example, when the analog signal satisfies the second predetermined threshold, this may indicate that the current on the power line 16 is at least about 1800 Amps. In other examples, the first and second predetermined thresholds may be selected based on specific applications of the fault protection system 220 of the DSR 30 relative to a given installation. The first and second predetermined thresholds may be selected to be above expected normal operating current limits on the power line 16. In other words, the first and second predetermined thresholds may be any value suitable to enable execution of the first and second bypass sequences to protect the DSR 30 from overcurrent and/or fault conditions.

The third bypass sequence may include the voltage detection circuit 356 (e.g., a crowbar circuit) activating the first electrical switch 204 (e.g., an SCR) to short the first device 202 when a detected voltage satisfies a third predetermined threshold. The detected voltage may be a voltage of the first device 202. For example and as discussed above, the first device 202 may be a single turn transformer including windings 144, 174 on the core assembly 50 (e.g., the secondary of a single turn transformer). As such, the detected voltage may be a voltage present on the secondary windings 144, 174 of the core assembly 50. In one embodiment, the third predetermined threshold may be at least about 1800 volts. The third predetermined threshold may be selected based on specific applications of the fault protection system 220 of the DSR 30 relative to a given installation. The third predetermined threshold may be selected based on the operational limits of the electronic components within the fault protection system 220 of the DSR 30 and/or the number of secondary windings 144, 174 of the core assembly 50. In other words, the third predetermined threshold may be any value suitable to enable execution of the third bypass sequence to protect the DSR 30 from overcurrent and/or fault conditions.

A secondary function of the fault protection system 220 may include protection of the second electrical switch 206 addressed above (e.g., a contact relay; FIG. 10). The second electrical switch 206 may be operably connected to the controller 214 and the first device 202. The controller 214 may be configured to switch the second electrical switch 206 between an open position and a closed position in order to switch the DSR 30 between bypass and injection modes of operation as discussed above. During such a change of position, the second electric switch 206 may be vulnerable to damage from electric arc and/or excessive currents through its contact surfaces. This damage may be minimized by externally shunting the contacts of the second electrical switch 206 during any such change of position, where the duration of the change of position may be within a range from about one millisecond to about one second. The secondary function of the fault protection system 220 may be activated by the controller 214 issuing a series of electrical pulses to the first electric switch 204 during the period when the second electric switch 206 is changing positions. In turn, the first electrical switch 204 may enter a conducting state, thereby shunting the contacts of the second electric switch 206.

For the same purpose, when the first electrical switch 204 is activated (e.g., when any of the first, second, or third bypass sequences is executed), the second electrical switch 206 remains in either the open position or the closed position. For example, if the second electrical switch 206 is in the open position (e.g., the DSR 30 is in injection mode) when the first electrical switch 204 (e.g., an SCR) is activated, the second electrical switch 206 remains in the open position during the execution of any of the first, second, or third bypass sequences. In another example, if the second electrical switch 206 is in the closed position (e.g., the DSR 30 is in bypass mode) when the first electrical switch 204 is activated, the second electrical switch 206 remains in the closed position during the execution of any of the first, second, or third bypass sequences.

The first bypass sequence may have a first response time, the second bypass sequence may have a second response time, and the third bypass sequence may have a third response time. The first response time may be the amount of time it takes for the controller 214 to determine that the output from the current monitor 212 satisfies the first predetermined threshold. For example, the analog-to-digital converter 349 may receive the output from the current monitor 212 while the controller 214 is performing another function, which may result in a first response time. In another example, the controller 214 may process the output from the current monitor 212 immediately upon receiving it, which may result in a first response time that is different than the first response time in the first example. The second response time may be the amount of time it takes for the comparator 348 to determine that the output from the differential amplifier 346 satisfies the second predetermined threshold. The third response time may be the amount of time it takes for the voltage detection circuit 356 to determine that the detected voltage satisfies the third predetermined threshold.

The first response time may be faster than the second response time and the third response time, and the second response time may be faster than the third response time. For example, the controller 214 may determine that the output from the current monitor 212 satisfies the first predetermined threshold before the comparator 348 determines that the output from the differential amplifier 346 satisfies the second predetermined threshold and before the voltage detection circuit 356 determines that the detected voltage satisfies the third predetermined threshold. As another example, the comparator 348 may determine that the output from the differential amplifier 346 satisfies the second predetermined threshold before the voltage detection circuit 356 determines that the detected voltage satisfies the third predetermined threshold. The second response time may be faster than the first response time and the third response time. For example, the comparator 348 may determine that the output from the differential amplifier 346 satisfies the second predetermined threshold before the controller 214 determines that the output from the current monitor 212 satisfies the first predetermined threshold and before the voltage detection circuit 356 determines that the detected voltage satisfies the third predetermined threshold. The third response time may be faster than the first response time and the second response time. For example, the voltage detection circuit 356 may determine that the detected voltage satisfies the third predetermined threshold before either the controller 214 or the comparator 348 determine that the output from the current monitor 212 satisfies the first or the second predetermined thresholds.

If the first bypass sequence is executed, the second and third bypass sequences may not be executed. Similarly, the second bypass sequence may be executed if the first bypass sequence is not executed. The first bypass sequence may not be executed when the output from the current monitor 212 is not processed by the controller 214 and/or if the second response time is faster than the first response time. The third bypass sequence may be executed if the first and second bypass sequences are not executed and/or if the third response time is faster than the first and second response times.

Figure 12B:
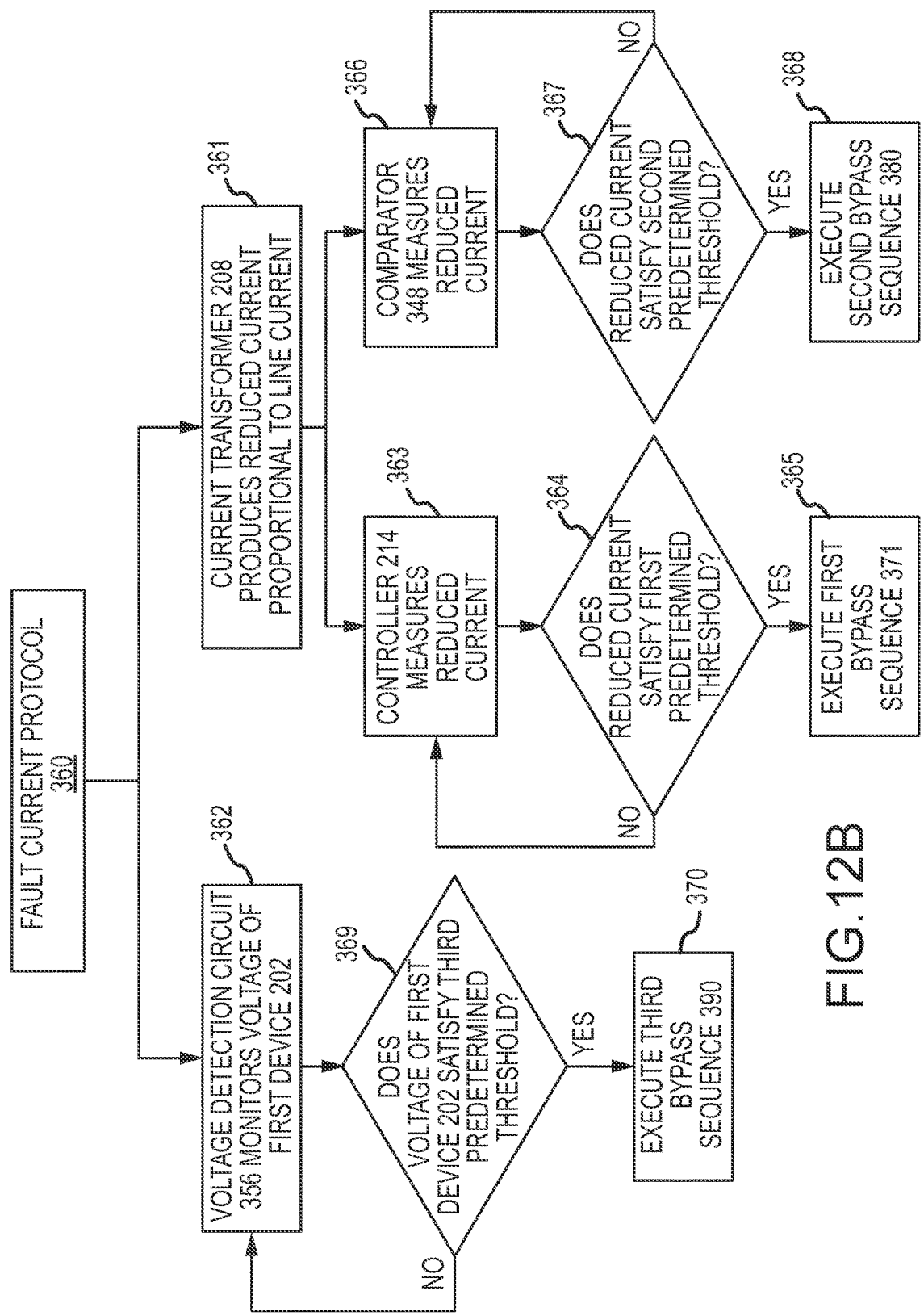
FIG. 12B is an embodiment of a fault current protocol that may be used by the fault protection system of FIG. 12A to execute a plurality of bypass sequences.

One embodiment of a protocol for protecting the DSR 30 is presented in FIG. 12B and is identified by reference numeral 360. The protocol 360 generally includes the steps for detecting a fault current and executing a plurality of different bypass sequences to protect the DSR 30 from damage. As current flows through the power line 16, the current transformer 208 produces a reduced current that is proportional to the current of the power line 16 (step 361) and the voltage detection circuit 356 monitors the voltage of the first device 202 (step 362). The reduced current produced by the current transformer 208 may be measured by the controller 214 (step 363) or the comparator 348 (step 366). Step 363 includes the controller 214 determining if the reduced current satisfies the first predetermined threshold (step 364). If the reduced current does not satisfy the first predetermined threshold, step 363 is repeated, i.e., the controller 214 continues measuring the reduced current produced by the current transformer 208. If the reduced current does satisfy the first predetermined threshold, the first bypass sequence 371 (FIG. 12C) is executed (step 365).

In step 366 of the protocol 360 of FIG. 12B, the comparator 348 measures the reduced current produced by the current transformer 208. Step 366 includes the comparator 348 determining if the reduced current satisfies the second predetermined threshold (step 367). If the reduced current does not satisfy the second predetermined threshold, step 366 is repeated, i.e., the comparator 348 continues measuring the reduced current produced by the current transformer 208. If the reduced current does satisfy the second predetermined threshold, the second bypass sequence 380 (FIG. 12D) is executed (step 368).

In step 362 of the protocol 360 of FIG. 12B, the voltage detection circuit 356 monitors the voltage of the first device 202. Step 362 includes the voltage detection circuit 356 determining if the voltage of the first device 202 satisfies the third predetermined threshold (step 369). If the voltage does not satisfy the third predetermined threshold, step 362 is repeated, i.e., the voltage detection circuit 356 continues to monitor the voltage of the first device 202. If the voltage does satisfy the third predetermined threshold, the third bypass sequence 390 (FIG. 12E) is executed (step 370).

Figure 12C:
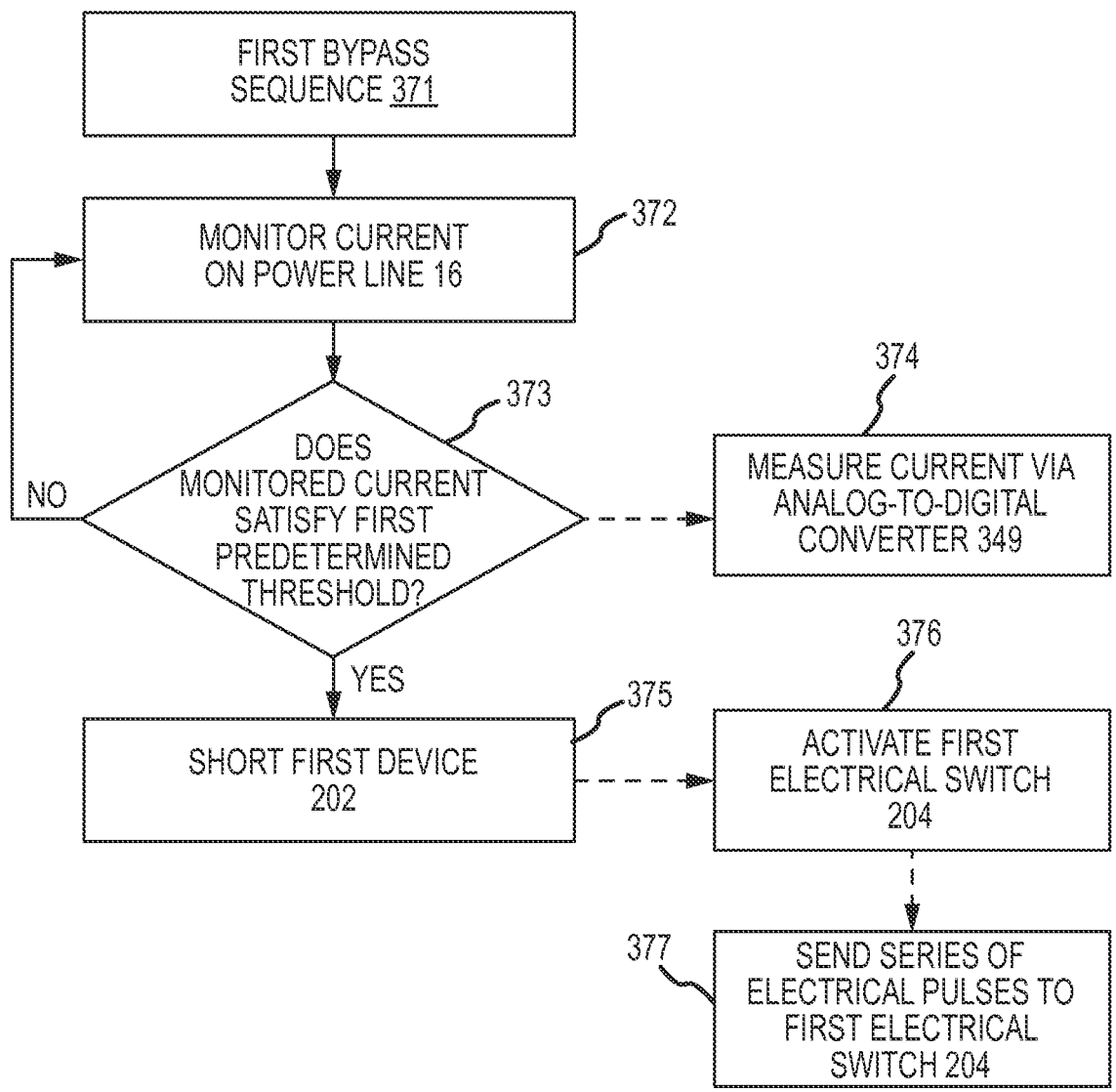
FIG. 12C is a flow chart illustrating one embodiment of a first bypass sequence that may be executed by the fault protection system of FIG. 12A.

With reference now to FIG. 12C, one embodiment of the first bypass sequence 371 is presented. The first bypass sequence 371 may include the steps of monitoring the current of the power line 16 (step 372), assessing whether the line current on the power line 16 satisfies the first predetermined threshold (step 373), and shorting the first device 202 in response to identification of satisfaction of the first predetermined threshold (step 375). Step 373 may include the step of measuring the current via the analog-to-digital converter 349 (step 374). Step 375 may include the step of activating the first electrical switch 204 (step 376). Step 376 may include the step of sending a series of electrical pulses to the first electrical switch 204 such that the first electrical switch 204 begins conducting (step 377).

Figure 12D:
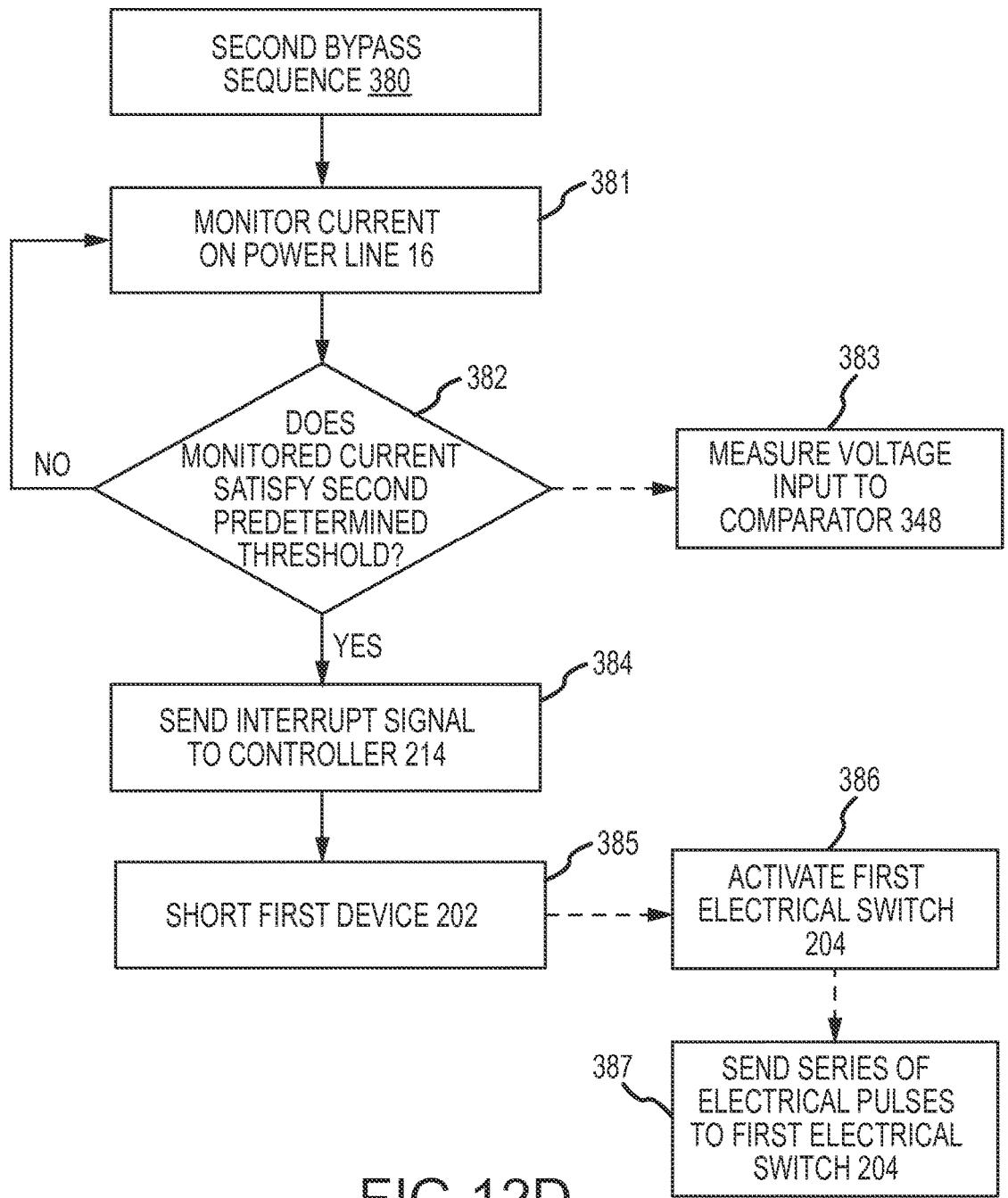
FIG. 12D is a flow chart illustrating one embodiment of a second bypass sequence that may be executed by the fault protection system of FIG. 12A.

FIG. 12D illustrates one embodiment of the second bypass sequence 380. The second bypass sequence 380 may include the steps of monitoring the current of the power line 16 (step 381), assessing whether the line current on the power line 16 satisfies the second predetermined threshold (step 382), sending an interrupt signal to the controller 214 in response to identification of satisfaction of the second predetermined threshold (step 384), and shorting the first device in response to identification of satisfaction of the second predetermined threshold (step 385). Step 382 may include the step of measuring the voltage input to the comparator 348 (step 383). Step 385 may include the step of activating the first electrical switch 204 (step 386). Step 376 may include the step of sending a series of electrical pulses to the first electrical switch 204 such that the first electrical switch 204 begins conducting (step 387).

Figure 12E:
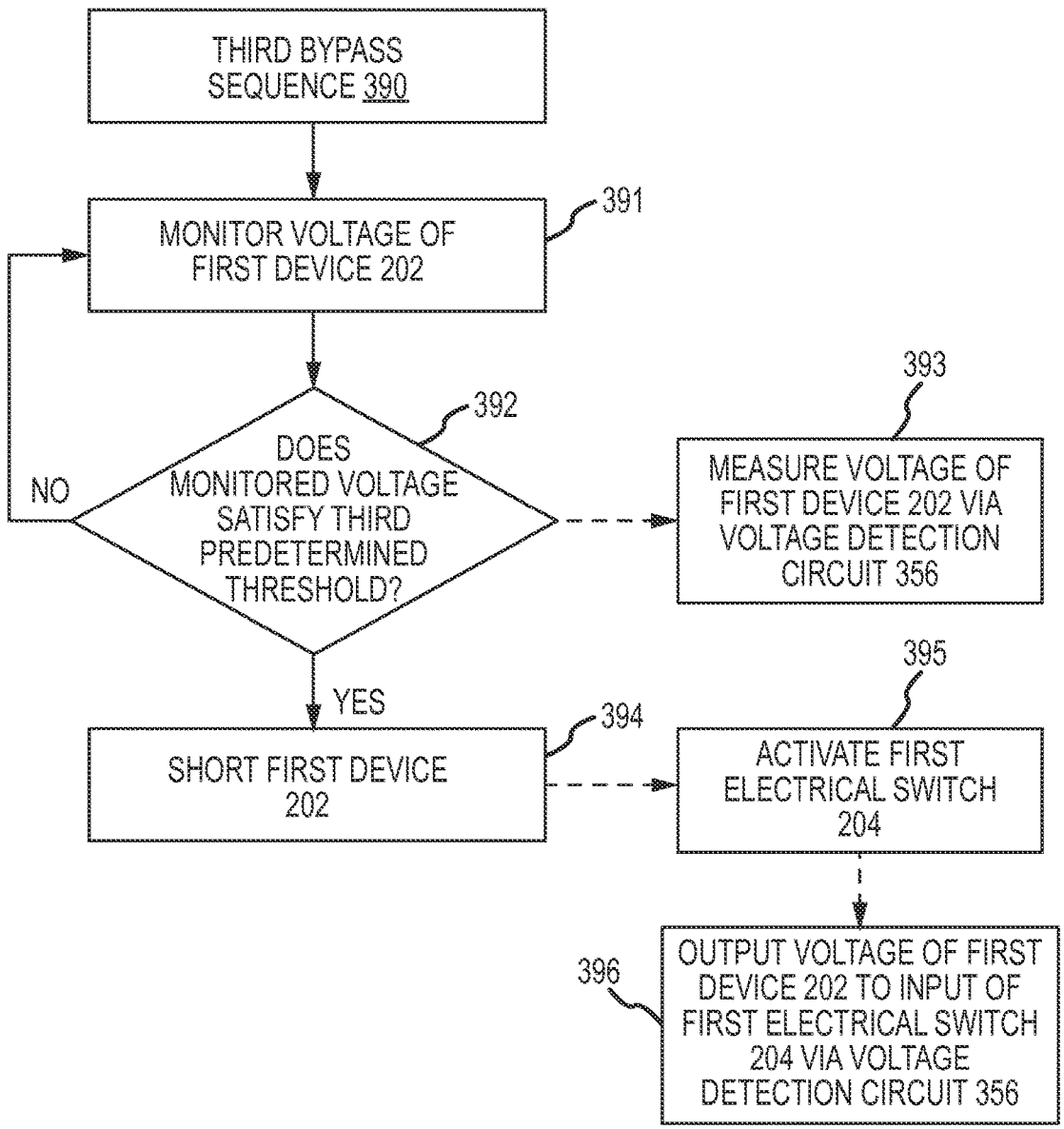
FIG. 12E is a flow chart illustrating one embodiment of a third bypass sequence that may be executed by the fault protection system of FIG. 12A.

With reference now to FIG. 12E, one embodiment of the third bypass sequence 390 is presented. The third bypass sequence 390 may include the steps of monitoring the voltage of the first device 202 (step 391), assessing whether the voltage satisfies the third predetermined threshold (step 392), and shorting the first device 202 in response to identification of satisfaction of the third predetermined threshold (step 394). Step 392 may include the step of measuring the voltage of the first device 202 via the voltage detection circuit 356 (step 393). Step 394 may include the step of activating the first electrical switch 204 (step 395). Step 395 may include the step of outputting the voltage of the first device 202 to the input of the first electrical switch 204 via the voltage detection circuit 356 (step 396). In one embodiment, the second bypass sequence 380 (FIG. 12D) is executed when the first bypass sequence 371 (FIG. 12C) is not executed. The first bypass sequence 371 (FIG. 12C) may not be executed when the current from the power line 16 is not measured by the analog-to-digital converter 349. In one embodiment, the third bypass sequence 390 is executed if neither the first bypass sequence 371 (FIG. 12C) nor the second bypass sequence 380 (FIG. 12D) are executed.

FIG. 13A illustrates one embodiment of a power transmission system 400, or more generally a distributed control architecture for use by such a power transmission system. The power transmission system 400 includes at least one power line 16 (three shown in the illustrated embodiment). One or more power lines 16 may be supported by a plurality of towers 14 that are spaced along the length of the power line(s) 16. As in the case of FIG. 1, the power transmission system 400 of FIG. 13A may include one or more electrical power sources 12 (not shown) and one or more electrical loads 22 (not shown).

A plurality of DSRs 30 are installed on a given power line 16—multiple power lines 16 each may have multiple DSRs 30 installed thereon. One or more DSR array controllers 440 may be mounted on each power line 16 that incorporates DSRs 30. Alternatively, a given DSR array controller 440 could be mounted on a tower 14. In any case, each DSR array controller 440 may be associated with a dedicated power line section 18 of the power line 16. A given power line section 18 could have a single DSR array controller 440, or a given power line section 18 could have a primary DSR array controller 400, along with one or more backup DSR array controllers 440.

Any number of DSR array controllers 440 may be associated with a given power line 16. A given power line 16 may be defined by one or more power line sections 18 of the same length, by one or more power line sections 18 of different lengths, or both (e.g., a power line section 18 is not limited to a portion of a given power line 16 that spans between adjacent towers 14 as shown in FIG. 13A; a given power line 16 may be divided up in any appropriate manner into multiple power line sections 18, each of which may have one or more DSR array controllers 440 that are dedicated to such a power line section 18).

One or more DSRs 30 are mounted on each power line section 18 of a given power line 16. Any appropriate number of DSRs 30 may be mounted on each power line section 18. The various DSRs 30 that are mounted on a given power line section 18 define what may be referred to as a DSR array 410. Each DSR array 410 may have one or more DSR array controllers 440 that are dedicated to such a DSR array 410 (e.g., multiple controllers 440 may be used for any given DSR array 410 to provide redundancy). In one embodiment, a given DSR array controller 440 is only associated with one DSR array 410. As such, one or more DSR array controllers 440 and each DSR 30 of their dedicated DSR array 410 may be associated with the same power line section 18. It should be appreciated that DSRs 30 need not be placed along the entire length of a given power line 16 (although such could be the case), and as such there may be a gap between one or more adjacent pairs of power line sections 18 that each have an associated DSR array 410.

Each DSR 30 in a given DSR array 410 only communicates (directly or indirectly) with one or more DSR array controllers 440 that are assigned to the DSR array 410 (e.g., the primary DSR array controller 440 for the DSR array 410 and any redundant or backup DSR array controllers). A given DSR array controller 440 could communicate directly with each DSR 30 in its associated DSR array 410. Another option would be to utilize a relay-type communication architecture, where a DSR array controller 440 could communicate with the adjacent-most DSR 30 on each side of the DSR array controller 440, and where the DSRs 30 could then relay this communication throughout the remainder of the DSR array 410 on the same side of the DSR array controller 440 (e.g., DSRs 30 in a given DSR array 410 could relay a communication, from DSR 30-to-DSR 30, toward and/or away from the associated DSR array controller 440).

DSR array controllers 440 associated with multiple DSR arrays 410 communicate with a common DSR server 420 of the power transmission system 400. Each of these DSR array controllers 440 could communicate directly with this DSR server 420. Alternatively, the DSR server 420 could directly communicate with one or more DSR array controllers 440, and these DSR array controllers 440 could then relay the communication to one or more other DSR array controllers 440 in the power transmission system 400. It should also be appreciated that the power transmission system 400 could incorporate one or more backup DSR servers (not shown), for instance to accommodate a given DSR server 420 going "off-line" for any reason. In any case, the DSR server 420 in turn communicates with what may be characterized a utility-side control system 430. Representative forms of the utility-side control system 430 include without limitation an energy management system (EMS), a supervisory control and data acquisition system (SCADA system), or market management system (MMS).

The power transmission system 400 could utilize any appropriate number of DSR servers 420. A single DSR server 420 could communicate with a given utility-side control system 430. Another option would be to have multiple DSR servers 420 that each communicate with a common utility-side control system 430. The power transmission system 400 could also utilize any appropriate number of utility-side control systems 430, where each utility-side control system 430 communicates with one or more DSR servers 420.

A given DSR server 420 may be characterized as providing an interface between a utility-side control system 430 and a plurality of DSR array controllers 440 for multiple DSR arrays 410. A DSR server 420 may receive a communication from a utility-side control system 430. This communication may be in any appropriate form and of any appropriate type. For instance, this communication could be in the form of a system objective, a command, a request for information, or the like (e.g., to change the inductance on one or more power lines 16 by a stated amount; to limit the current on one or more power lines 16 to a stated amount; to limit the power flow on one or more power lines 16 to a stated amount; to set a temperature limit for one or more power lines 16).

The DSR array controllers 440 may send information on their corresponding power line section 18 to a DSR server 420. The DSR server 420 in this case may consolidate this information and transmit the same to the utility-side control system 430 on any appropriate basis (e.g., using a push-type communication architecture; using a pull-type communication architecture; using a push/pull type communication architecture). The DSR server 420 may also store information received from the various DSR array controllers 440, including information from the DSR array controllers 440 that has been consolidated by the DSR server 420 and at some point in time transmitted to an utility-side control system 430.

Each DSR array controller 440 may be characterized as a "bridge" between a DSR server 420 (and ultimately a utility-side control system 430) and its corresponding DSR array 410. For instance, one communication scheme may be used for communications between a DSR array controller 410 and the DSRs 30 of its DSR array 410, and another communication scheme may be used for communications between this same DSR array controller 410 and the DSR server 420. In this case, a DSR array controller 410 may require two different interfaces—one interface/communication module for communicating with the DSRs 30 of its DSR array 410, and another interface/communication module for communicating with a DSR server 420.

As noted, FIG. 13A may be characterized as a distributed control architecture for a power transmission system (or as a power transmission system with a distributed control architecture). In this regard, consider the case where the utility-side control system 430 sends a communication to a DSR server 420. The DSR server 420 may repackage/translate/reformat this communication, but in any case sends a corresponding communication to one or more DSR array controllers 440. Each such DSR array controller 440 that receives such a communication makes a determination as to the modal configuration for each DSR 30 in its corresponding DSR array 410 (i.e., determines whether a given DSR 30 should be in a first or bypass mode, or whether this DSR 30 should be in a second or injection mode, and this may be undertaken for each DSR 30 in its corresponding DSR array 410). Notably, the communication that is received by the DSR array controller 440 does not itself indicate as to what the modal configuration should be for each DSR 30 in the DSR array 410 for the recipient DSR array controller 440. As such, each DSR array controller 440 must have sufficient intelligence so as to be able to be able to make this determination on its own.

Figure 13B:
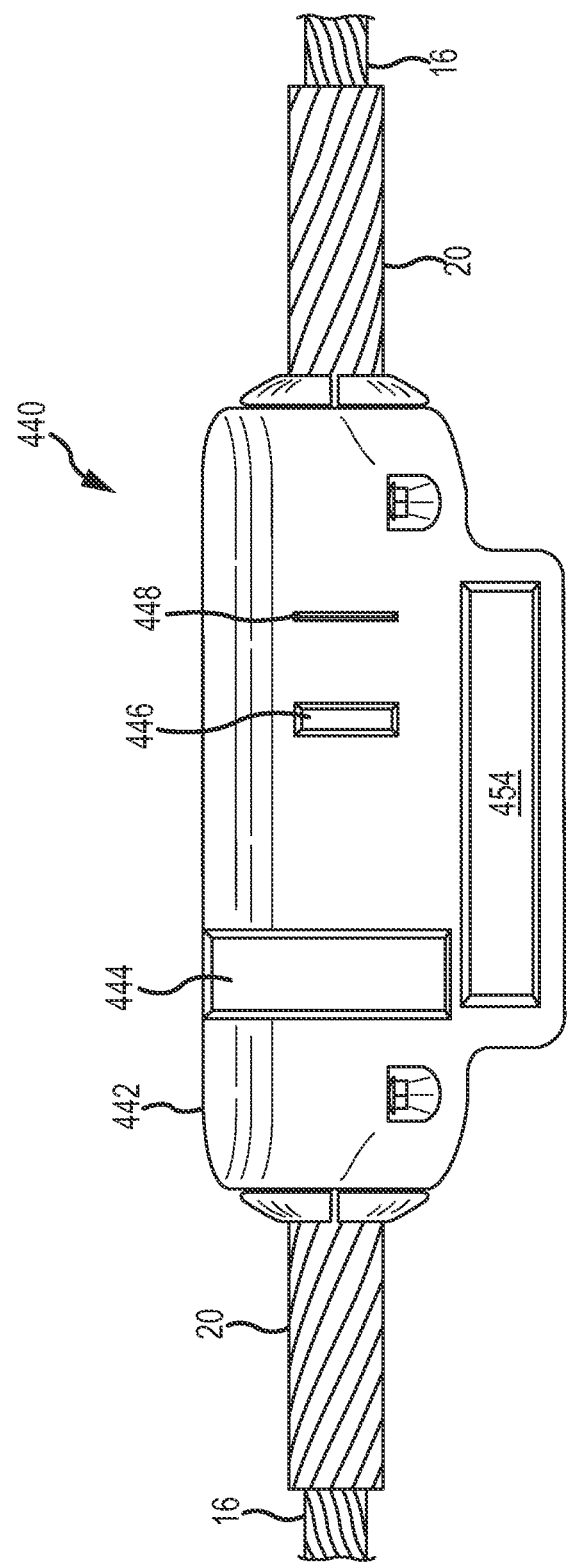
FIG. 13B is a schematic of a DSR array controller used to provide distributed control for the power transmission system of FIG. 13A.

FIG. 13B presents a representative configuration for a DSR array controller 440 that may be utilized by the power transmission system 400 of FIG. 13A. The DSR array controller 440 includes a housing 442. Preferably, the housing 442 allows the DSR array controller 440 to be mounted on a power line 16 without having to break the power line 16 (e.g., by using detachably connectable housing sections at least generally of the type discussed above in relation to the DSR 30). Moreover, preferably the housing 442 is configured to reduce the potential for Corona discharges.

The DSR array controller 440 includes a current transformer 444 that is disposed within the housing 442 and that derives power from the power line 16 to power electrical components of the DSR array controller 440. Various sensors may be utilized by the DSR array controller 440, such as a fault current sensor 446 and a temperature sensor 448. Moreover, the DSR array controller 440 utilizes a processing unit 454 (e.g., defined by one or more processors of any appropriate type, and utilizing any appropriate processing architecture).

Figure 13C:
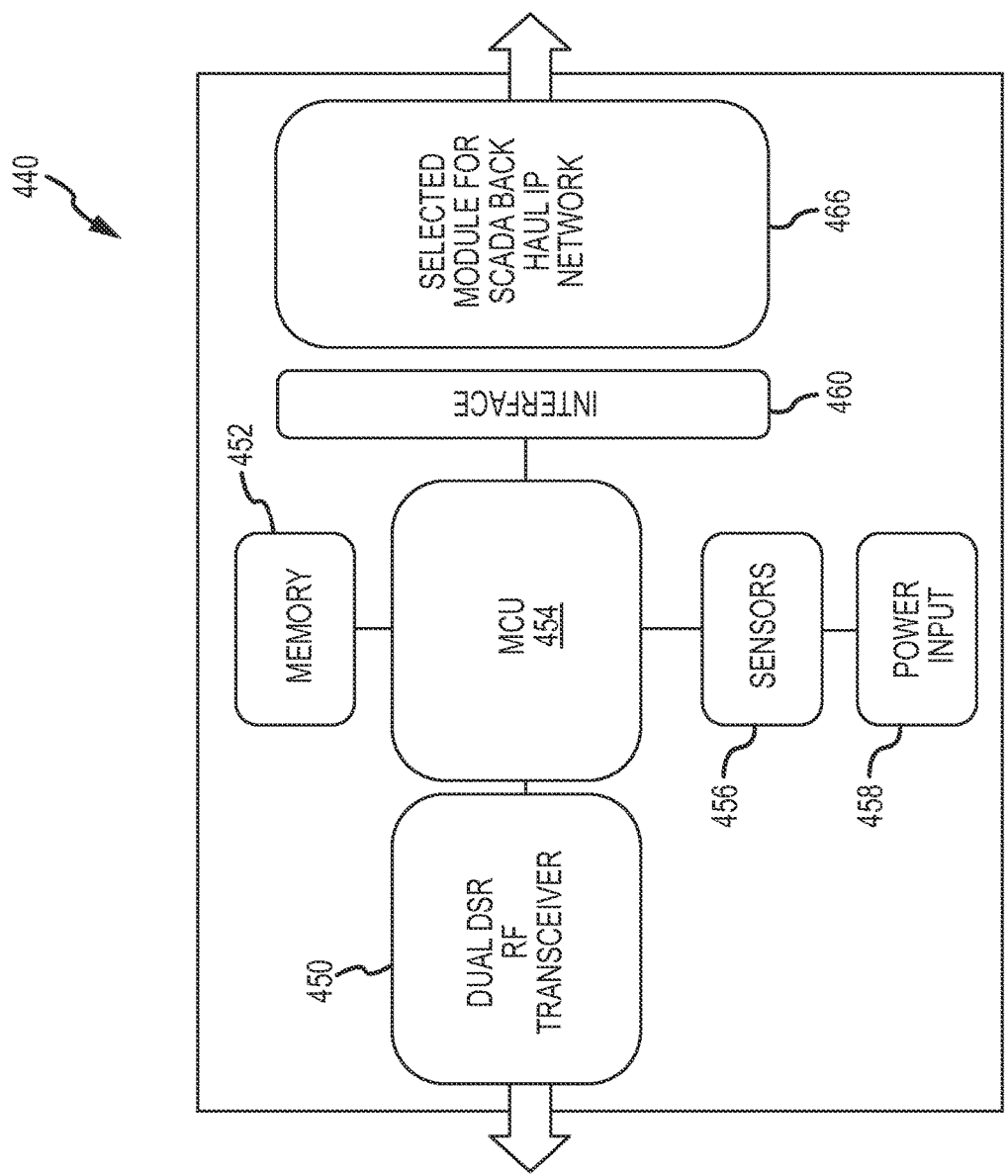
FIG. 13C is an electrical block diagram that may be utilized by DSR array controllers from the power transmission system of FIG. 13A.

FIG. 13C presents a functional schematic that may be implemented by a DSR array controller 440. The DSR array controller 440 includes the above-noted processing unit 454. Memory 452 (e.g., any appropriate computer readable storage medium) may be operatively interconnected with the processing unit 454. The memory 452 may be of any appropriate type or types, and may utilize any appropriate data storage architecture(s). One or more sensors 456 (e.g. the above-noted fault current sensor 446; the above-noted temperature sensor 448) may also be operatively interconnected with the processing unit 454.

One or more antennas 450 may be utilized by the DSR array controller 440 for communicating with the DSRs 30 in its corresponding DSR array 410. Any appropriate type of antenna 450 may be utilized by the DSR array controller 440, including a cavity-backed slot antenna of the type utilized by the DSRs 30. Multiple antennas 450 could also be used to communicate with the DSRs 30 in its corresponding DSR array 410, including where two antennas 450 are incorporated by the DSR array controller 440 in the same manner as discussed above with regard to the DSRs 30 (e.g., an antenna 450 may be provided on each end of the DSR array controller 440). As noted, the DSR array controller 440 may use one communication scheme (e.g., a first communication scheme) for communicating with the DSRs 30 of its DSR array 410.

The DSR array controller 440 also communicates with the utility-side control system 430 through the DSR server 420 in the embodiment of FIG. 13A. In this regard, the DSR array controller 440 may include a communications module 466 of any appropriate type and an interface 460. If the communications module 466 provides for wireless communications with the DSR server 420, the DSR array controller 440 may require one or more antennas of any appropriate type. For example, the communications module may be at least one of an Ethernet adapter, a cellular modem, and a satellite modem, to name a few. In another example, the interface 460 may be part of the processing unit 454 and may include at least one of a SPI bus, UART, and a I2C serial bus, to name a few. In any case, the DSR array controller 440 may use another communication scheme (e.g., a second communication scheme) for communicating with the DSR server 420. In one embodiment, the DSR array controller 440 uses different communication schemes for communications with the DSR array 410 and the DSR server 420. It could be appreciated that a dedicated antenna(s) may be required for communications with the DSRs 30 of the corresponding DSR array 410, and that a dedicated antenna (s) may be required for communications with the DSR server 420. However, it may be possible that a common antenna(s) may be used to communicate with both the DSRs 30 of the corresponding DSR array 410 and with the DSR server 420.

The DSR array controller 440 may also incorporate a power supply 458 of any appropriate type, and that is operatively interconnected with the above-noted current transformer 444 (FIG. 13B). The power supply 458 may receive a current flow from the current transformer 444, and may provide power to one or more of the processing unit 454, the memory 452, the antenna(s) 450, one or more antennas associated with the communication module 466 (for communicating with the DSR server 420), one or more sensors 456, or any combination thereof.

FIG. 13D presents one embodiment of a first data structure 480 (e.g., a lookup table) that may be stored/reside in the memory 452 of a given DSR array controller 440. The first data structure 480 may utilize any appropriate data storage architecture. Generally, for each of a plurality of system contingencies or conditions 482, the first data structure 480 includes a corresponding model configuration for at least one control objective for each DSR 30 associated with the DSR array controller 440. Again, there are two "model configurations" for the DSRs 30. One modal configuration (e.g., a first modal configuration or first mode) for each DSR 30 is where the DSR is disposed in a non-injection or bypass mode (e.g., where little or no reactance is being injected into the corresponding power line 16 by the DSR 30, or more specifically into the corresponding power line section 18 on which the DSR 30 is mounted). The other modal configuration (e.g., a second modal configuration or second mode) for each DSR 30 is where it is configured to inject reactance into the corresponding power line 16 (e.g., an injection mode). The amount of reactance injected by a given DSR 30 when in its second modal configuration (or when in its second mode) is substantially greater than the amount of reactance, if any, that is injected by a given DSR 30 when in its first modal configuration (or when in its first mode).

The first data structure 480 includes a modal configuration for two different control objectives for each DSR 30 that is associated with the DSR array controller 440 (three representative DSRs 30 being shown for purposes of the first data structure 480 of FIG. 13D; each DSR 30 within the corresponding DSR array 410 would of course be included in the first data structure 480). The first data structure 480 presents both a power factor control modal configuration 484 (one control objective) and a low-frequency oscillation control modal configuration 486 (a different control objective) for each DSR 30 associated with the DSR array controller 440, and for each system condition or contingency 482. Any number of control objectives may be stored in the first data structure 480, including a single control objective or any appropriate number of multiple control objectives.

The system conditions or contingencies that are loaded into the first data structure 480 may represent at least some or all of the permutations for a power transmission system in relation to each power source utilized by the power transmission system (whether on line or off line), the load level presently imposed on the system, the operating status of the transmission lines forming the interconnected grid, the operating status of the transformers and substation equipment supporting the operation of the transmission lines forming the interconnected grid, or any combination of the above that combine to create a normal, abnormal or emergency operating condition for the grid. The same system conditions or contingencies may be loaded into the memory 452 of one or more DSR array controller 440. In one embodiment, a set of DSR array controllers 440 will have the same system conditions or contingencies loaded into their corresponding memory 452. However, each DSR array controller 440 will have its own modal configuration for each of its DSRs 30, and for each control objective. It should be appreciated that the first data structure 480 for each DSR array controller 440 may be updated without having to dismount the DSR array controller 440 from its corresponding power line 16 (e.g., using the built-in communication capabilities of the DSR array controllers 440).

Figure 13E:
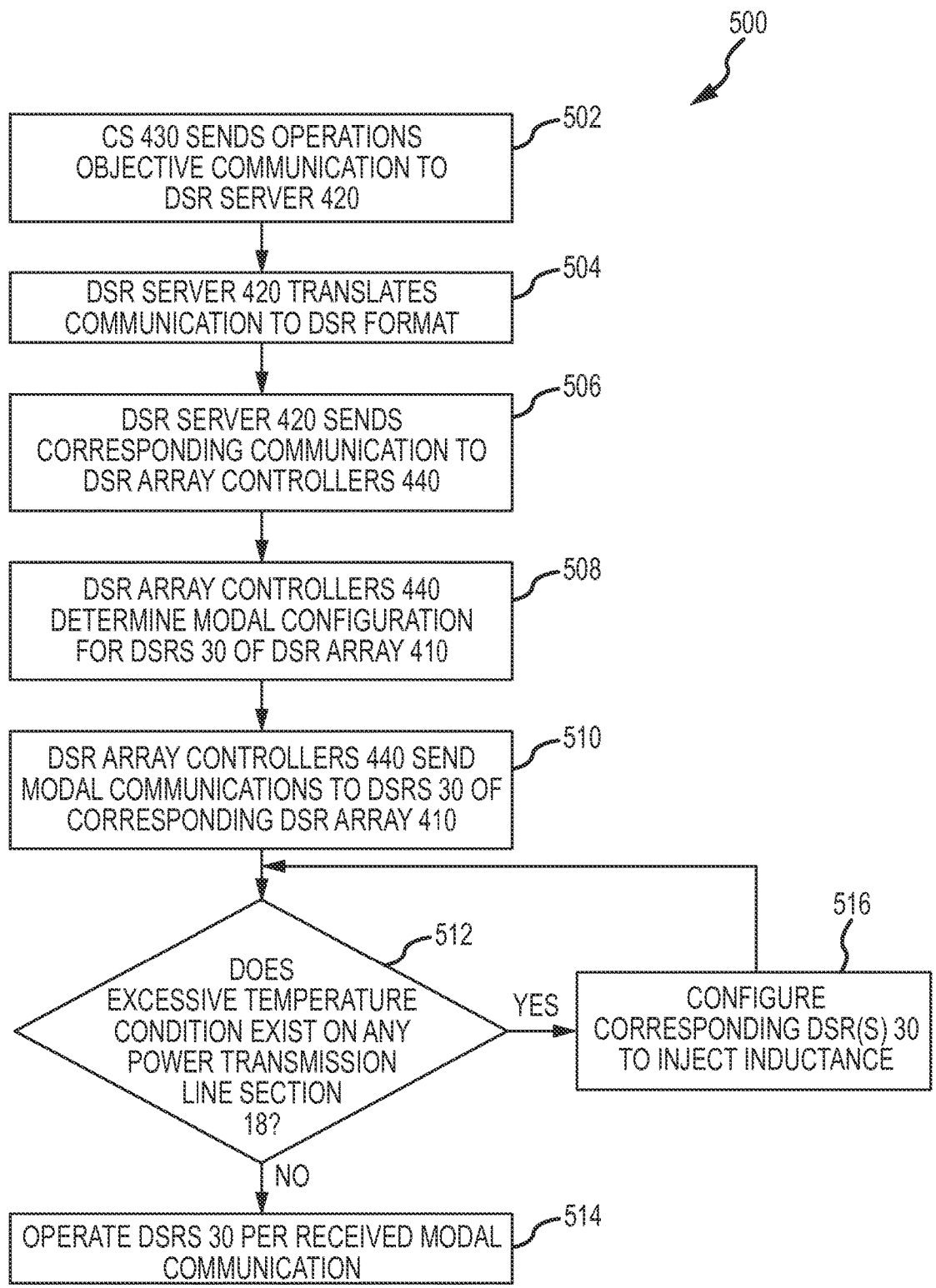
FIG. 13E is an embodiment of an operations protocol that may be used by the power transmission system of FIG. 13A to control operation of individual reactance modules.
Figure 13F:
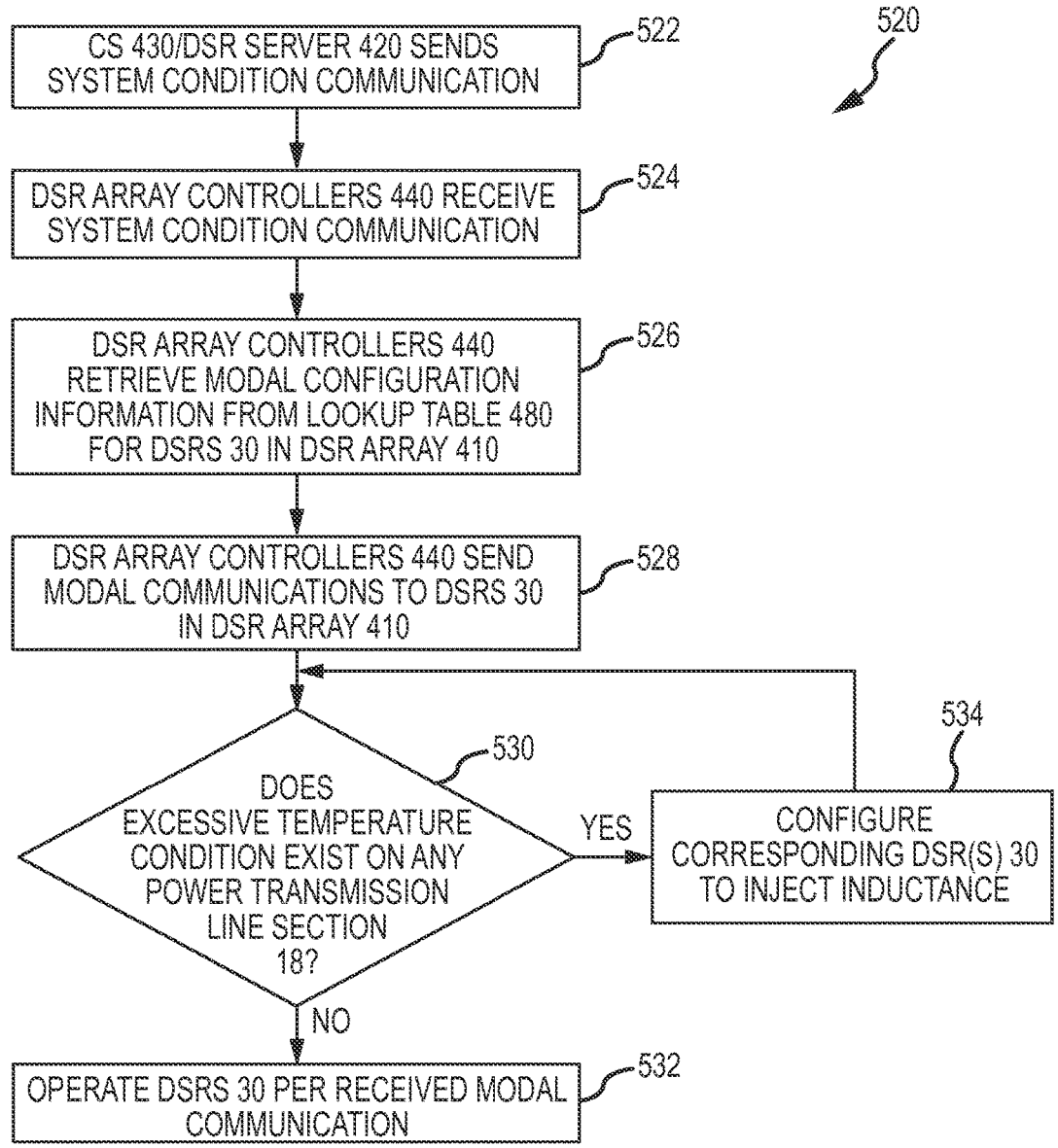
FIG. 13F is an embodiment of a system condition/contingency-based protocol that may be used by the power transmission system of FIG. 13A to control operation of individual reactance modules.

One embodiment of an operations protocol for the power transmission system 400 of FIG. 13A is presented in FIG. 13E and is identified by reference numeral 500. The utility-side control system 430 sends an operations objective communication to the DSR server 420 (step 502). This operations objective communication may be of any appropriate type. The DSR server 420 may translate this communication from the utility-side control system 430 into an appropriate DSR format (step 504). In any case, the DSR server 420 sends a corresponding communication to the relevant DSR array controllers 440 (step 506). Each of the DSR array controllers 440 will independently determine the modal configuration for the DSRs 30 in its corresponding DSR array 410 based upon receipt of this communication (step 508). The communication associated with step 506 does not itself indicate the modal configurations that are determined by step 508. Thereafter, the DSR array controllers 440 may send a modal communication to one or more of the DSRs 30 in its corresponding DSR array 410 (step 510), and the DSRs 30 may be operated in accordance with any modal communication that has been received (step 514). It should be appreciated that the protocol 500 could be configured such that a modal communication is sent by a given DSR array controller 440 to each of its corresponding DSRs 30 (step 510), or a given DSR array controller 440 could be configured to send a modal communication (step 510) only to those associated DSRs 30 that have been determined to be in need of a modal change in accordance with step 508. The operations protocol 500 of FIG. 13E may include what may be characterized as an optional "temperature override" feature. In this regard, step 512 of the protocol 500 is directed to determining if an excessive temperature condition exists on any given power line section 18 (e.g., determining whether an operating temperature meets or exceeds a predetermined temperature threshold, and which may be undertaken in any appropriate manner). Each power line section 18 may be monitored for the existence of an excessive temperature condition. This monitoring may be undertaken by the DSR array controller(s) 440 and/or the DSRs 30 for such a power line section 18. In any case and in the event that such an excessive temperature condition has been determined to exist, the protocol 500 may be configured to execute step 516. Step 516 is directed to configuring one or more of the DSRs 30 on the subject power line section 18 (with an excessive temperature condition) to inject inductance into this power line section 18. Injecting inductance into a given power line section 18 that is experiencing an excessive temperature condition should reduce the current flow through such a power line section 18, which in turn should reduce its operating temperature. It should be appreciated that steps 512 and 516 on the noted temperature override feature may be implemented at any appropriate location within the protocol 500. Moreover, it should be appreciated that the temperature override logic could be incorporated by the DSR array controllers 440 (which would then send an appropriate communication to the DSRs 30 of their corresponding DSR array 410, such that step 516 would be executed by the individual DSRS 30 upon receiving such a communication from their corresponding DSR array controller(s) 440), that the temperature override logic could be incorporated by the individual DSRs 30 of each DSR array 410 (e.g., such that each individual DSR 30 could independently determine when step 516 should be executed), or both. One embodiment of an operations protocol for addressing system conditions or contingencies is illustrated in FIG. 13F and is identified by reference numeral 520. Step 522 of the protocol 520 is directed to sending or transmitting a system condition or system contingency communication to one or more DSR array controllers 440 of the power transmission system 400. This system condition/contingency communication may come directly from the utility-side control system 430 or through the DSR server 420. In any case, one or more DSR array controllers 440 may receive the system condition/contingency communication (step 524). Each DSR array controller 440 will then retrieve the modal configuration information from the first data structure 480 for all DSRs 30 in its corresponding DSR array 410 (step 526). That is, each DSR array controller 440 will locate the system condition/contingency within its first data structure 480, and will then retrieve the associated modal configuration for each DSR 30 in its DSR array 410 for the associated control objective. Each DSR array controller 440 may then send a modal communication to each DSR 30 in its corresponding DSR array 410 (step 528) to specify whether a given DSR 30 should be in its first or bypass mode, or whether this DSR 30 should be in its second or injection mode. The controller 54 of a DSR 30 that receives such a modal communication from its corresponding DSR array controller 440 will then dispose the DSR 30 in the communicated mode pursuant to step 532 (either by switching the mode of the DSR 30, or maintaining the DSR 30 in its then current mode). It should be appreciated that the protocol 520 could be configured such that a modal communication is sent by a given DSR array controller 440 to each of its corresponding DSRs 30 (step 528), or a given DSR array controller 440 could be configured to send a modal communication (step 528) only to those associated DSRs 30 that have been determined to be in need of a modal change based upon step 526.

The operations protocol 520 of FIG. 13F may include what may be characterized as an optional "temperature override" feature. In this regard, step 530 of the protocol 520 is directed to determining if an excessive temperature condition exists on any given power line section 18 (e.g., determining whether an operating temperature meets or exceeds a predetermined temperature threshold, and which may be undertaken in any appropriate manner). Each power line section 18 may be monitored for the existence of an excessive temperature condition. This monitoring may be undertaken by the DSR array controller(s) 440 and/or the DSRs 30 for such a power line section 18. In any case and in the event that such an excessive temperature condition has been determined to exist, the protocol 520 may be configured to execute step 534. Step 534 is directed to configuring one or more of the DSRs 30 on the subject power line section 18 (with an excessive temperature condition) to inject inductance into this power line section 18. Injecting inductance into a given power line section 18 that is experiencing an excessive temperature condition should reduce the current flow through such a power line section 18, which in turn should reduce its operating temperature. It should be appreciated that steps 530 and 534 on the noted temperature override feature may be implemented at any appropriate location within the protocol 520. Moreover, it should be appreciated that the temperature override logic could be incorporated by the DSR array controllers 440 (which would then send an appropriate communication to the DSRs 30 of their corresponding DSR array 410, such that step 534 would be executed by the individual DSRS 30 upon receiving such a communication from their corresponding DSR array controller(s) 440), that the temperature override logic could be incorporated by the individual DSRs 30 of each DSR array 410 (e.g., such that each individual DSR 30 could independently determine when step 534 should be executed), or both.

The operations protocol 520 of FIG. 13F assumes that the various DSR array controllers 440 are able to receive system condition/contingency communications from the utility-side control system 430 and/or the DSR server 420. That may not always be the case, and is accommodated by the operations protocol that is set forth in FIG. 13G and that is identified by reference numeral 540. Step 542 of the protocol 540 is directed to assessing receipt of system condition/contingency communications. In the event a predetermined number of DSR array controllers 440 are not receiving system condition/contingency communications, the protocol 540 proceeds from step 544 to step 546. Step 546 of the protocol 540 is directed to the DSR array controllers 440 communicating with one another and sharing information regarding their corresponding power line section 18. From this information, the present state system condition/contingency is derived (step 548). A derived system condition/contingency communication is then sent to the various DSR array controllers 440 pursuant to step 550 of the protocol 540. Each DSR array controller 440 will then retrieve the modal configuration information from the first data structure 480 for all DSRs 30 in its corresponding DSR array 410 (step 552). That is, each DSR array controller 440 will locate the system condition/contingency within its first data structure 480 that corresponds to the derived system condition/contingency communication, and will then retrieve the associated modal configuration for each DSR 30 in its DSR array 410 (and for the associated control objective). Each DSR array controller 440 may then send a modal communication to each DSR 30 in its corresponding DSR array 410 (step 556) to specify whether a given DSR 30 should be in its first or bypass mode, or whether this DSR 30 should be in its second or injection mode. The controller 54 of a DSR 30 that receives such a modal communication from its corresponding DSR array controller 440 will then dispose the DSR 30 in the communicated mode pursuant to step 560 (either by switching the mode of the DSR 30, or maintaining the DSR 30 in its then current mode). It should be appreciated that the protocol 540 could be configured such that a modal communication is sent by a given DSR array controller 440 to each of its corresponding DSRs 30 (step 556), or a given DSR array controller 440 could be configured to send a modal communication (step 556) only to those associated DSRs 30 that have been determined to be in need of a modal change based upon step 552.

Figure 13G:
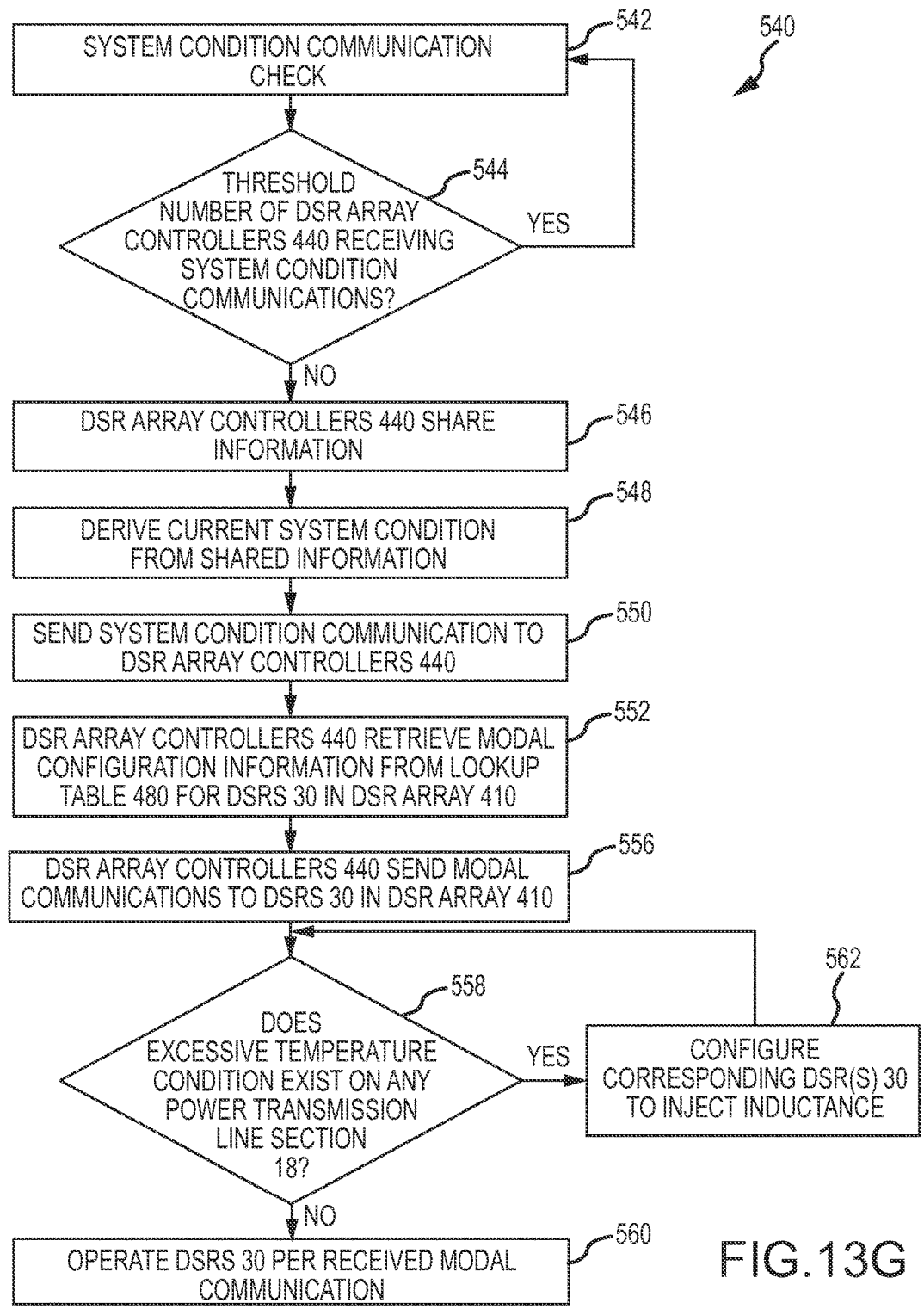
FIG. 13G is another embodiment of a system condition/contingency-based protocol that may be used by the power transmission system of FIG. 13A to control operation of individual reactance modules.

The operations protocol 540 of FIG. 13G may include what may be characterized as an optional "temperature override" feature. In this regard, step 558 of the protocol 540 is directed to determining if an excessive temperature condition exists on any given power line section 18 (e.g., determining whether an operating temperature meets or exceeds a predetermined temperature threshold, and which may be undertaken in any appropriate manner). Each power line section 18 may be monitored for the existence of an excessive temperature condition. This monitoring may be undertaken by the DSR array controller(s) 440 and/or the DSRs 30 for such a power line section 18. In any case and in the event that such an excessive temperature condition has been determined to exist, the protocol 540 may be configured to execute step 562. Step 562 is directed to configuring one or more of the DSRs 30 on the subject power line section 18 (with an excessive temperature condition) to inject inductance into this power line section 18. Injecting inductance into a given power line section 18 that is experiencing an excessive temperature condition should reduce the current flow through such a power line section 18, which in turn should reduce its operating temperature. It should be appreciated that steps 558 and 562 on the noted temperature override feature may be implemented at any appropriate location within the protocol 540. Moreover, it should be appreciated that the temperature override logic could be incorporated by the DSR array controllers 440 (which would then send an appropriate communication to the DSRs 30 of their corresponding DSR array 410, such that step 562 would be executed by the individual DSRS 30 upon receiving such a communication from their corresponding DSR array controller(s) 440), that the temperature override logic could be incorporated by the individual DSRs 30 of each DSR array 410 (e.g., such that each individual DSR 30 could independently determine when step 562 should be executed), or both.

Each DSR array controller 440 may incorporate any one of the protocols 500, 520, and 540, or may incorporate any two or more of these protocols. For instance, each DSR array controller 440 could incorporate both the protocol 500 of FIG. 13E and the protocol 520 of FIG. 13F. Each DSR array controller 440 could then determine the modal configuration for each DSR 30 in its corresponding DSR array 410 based upon the type of communication that is received. Another option would be for each DSR array controller 440 to incorporate both the protocol 520 of FIG. 13F and the protocol 540 of FIG. 13G. Each DSR array controller 440 could be configured to operate simultaneously in accordance with the protocol 520 of FIG. 13F and the protocol 540 of FIG. 13G. That is, the protocol 520 would be used to control a given DSR array control 440 until step 546 of the protocol 540 of FIG. 13G was reached, in which case the protocol 540 would then be used to control a given DSR array controller 440.

One embodiment of an installation fixture for installing a DSR 30 on a power line 16 is presented in FIGS. 14A-D and is identified by reference numeral 600. Generally, the installation fixture 600 may be mounted or installed on a worker carrier of any appropriate type (e.g., a bucket or basket of a bucket or boom truck—FIG. 15). A DSR 30 may be loaded into the installation fixture 600 while in a first configuration, and the worker carrier may be raised so that the lower housing section 80 of the DSR 30 is positioned under the power line 16 while being supported within the installation fixture 600. The lower housing section 80 may now be in close proximity to and/or in contact with the power line 16. At this time, the upper housing section 120 of the DSR 30 is sufficiently spaced from the lower housing section 80 while also being supported within the installation fixture 600 in its first configuration (e.g., the upper housing section 120 may be positioned alongside the power line 16). The installation fixture 600 may then be changed into a second configuration to position the upper housing section 120 of the DSR 30 (while still being supportably retained in the installation fixture 600) above the power line 16 and also above the lower housing section 80 of the DSR 30 (which continues to be supported by the installation fixture 600). This in effect captures the power line 16 between the lower housing section 80 and the upper housing section 120. The upper housing section 120 may then be secured to the lower housing section 80 while the DSR 30 continues to be supported within the installation fixture 600, and which mounts the DSR 30 on the power line 16. Thereafter, the installation fixture 600 may be moved away from the DSR 30, as it is now supported entirely by the power line 16.

The installation fixture 600 includes a base 602, a lower cradle 620, and an upper cradle 640. Generally, the base 602 is used to mount the installation fixture 600 on a worker carrier that will be used in the installation of a DSR 30 on a power line 16. The lower cradle 620 of the installation fixture 600 supports the lower housing section 80 of the DSR 30 to be installed on a power line 16. The upper cradle 640 of the installation fixture 600 supports the upper housing section 120 of the DSR 30 to be installed on a power line 16.

The base 602 includes a platform 604, a first frame section 606, and a second frame section 608. Each of the platform 604, the first frame section 606, and the second frame section 608 may be formed from any appropriate material or combination of materials, and may be of any appropriate configuration. The first frame section 606 and second frame section 608 are positioned on one side of the platform 604, while the lower cradle 620 and upper cradle 640 are positioned on an opposite side of the platform 604. The first frame section 606 and the second frame section 608 are spaced from each other to define a mounting receptacle 610, with the second frame section 608 extending further from the platform 604 than the first frame section 606. At least an upper portion of a sidewall of a worker carrier may be received in this mounting receptacle 610. As such, the first frame section 606 and the second frame section 608 may be characterized as collectively defining a "base connector" for mounting the installation fixture 600 on a worker carrier. Mounting of the installation fixture 600 to a worker carrier is further facilitated by at least one screw clamp 616 and at least one tightening fixture or latch 612, which will be discussed in more detail below.

The lower cradle 620 may be characterized as being movably interconnected with the base 602, more specifically the platform 604. One or more connectors between the lower cradle 620 and the platform 604 may be utilized to provide a desired movable interconnection. In this regard, the movable connector(s) between the base 602 and the lower cradle 620 may provide one or more of the following characteristics: 1) may allow the lower cradle 620 to move relative to the base 602 in multiple dimensions; 2) may allow the lower cradle 620 to rotate relative to the base 602 about an axis (360° of rotational motion between the lower cradle 620 and base 602 being available in one embodiment) and to tilt relative to the base 602 in any direction; 3) may provide a range of tilt motion of at least 3° between the lower cradle 620 and the base 602; 4) may provide a range of title motion of at least about 6° between the lower cradle 620 and the base 602; or 5) may provide at least 3 degrees of freedom. In one embodiment, a spherical radial bearing 618 is positioned between and interconnects the lower cradle 620 and the platform 604, and provides each of the above-noted characteristics. Other connector types may be appropriate.

A positioning mechanism 660 may be used in conjunction with the noted movable connection between the lower cradle 620 and the base 602 of the installation fixture 600. Generally, the positioning mechanism 660 may be characterized as being disposable in a first configuration that allows an orientation of the lower cradle 620 (along with the upper cradle 640 interconnected therewith) to be adjusted relative to the base 602 (e.g., via the spherical radial bearing 618), as well as being disposable in a second configuration that maintains the lower cradle 620 in an at least substantially fixed orientation relative to the base 602. Referring now primarily to FIG. 14D, the positioning mechanism 660 may be in the form of a hydraulic circuit. This hydraulic circuit includes a plurality of hydraulic cylinders 662 that are fluidly interconnected—hydraulic fluid may flow between the various hydraulic cylinders 662. The hydraulic cylinders 662 may be characterized as being disposed (e.g., symmetrically) about the spherical radial bearing 618.

Each hydraulic cylinder 662 includes a housing 664 that is disposed in a fixed position relative to the base 602, along with a corresponding plunger 666 that is able to extend and retract relative to its corresponding housing 664. A piston is disposed within each housing 664, and the plunger 666 extends from its corresponding piston (the hydraulic fluid and the plunger 666 being on opposite sides of the corresponding piston). A domed tip 668 may be provided on the end of each plunger 666 to engage the underside of the lower cradle 620. When the hydraulic circuit is open, fluid may flow between the various hydraulic cylinders 662 as the orientation of the lower cradle 620 is changed relative to the base 602. Changing the orientation of the lower cradle 620 relative to the base 602 will push one or more of the plungers 666 further into their respective housing 664, which will force hydraulic fluid to flow from the corresponding hydraulic cylinder(s) 662 to one more other hydraulic cylinders 662 to further extend the corresponding plunger 666. When the hydraulic circuit is closed, the plungers 666 should be maintained in an at least substantially fixed position (to thereby maintain the lower cradle 620 in an at least substantially fixed position or orientation relative to the base 602).

Figure 14A:
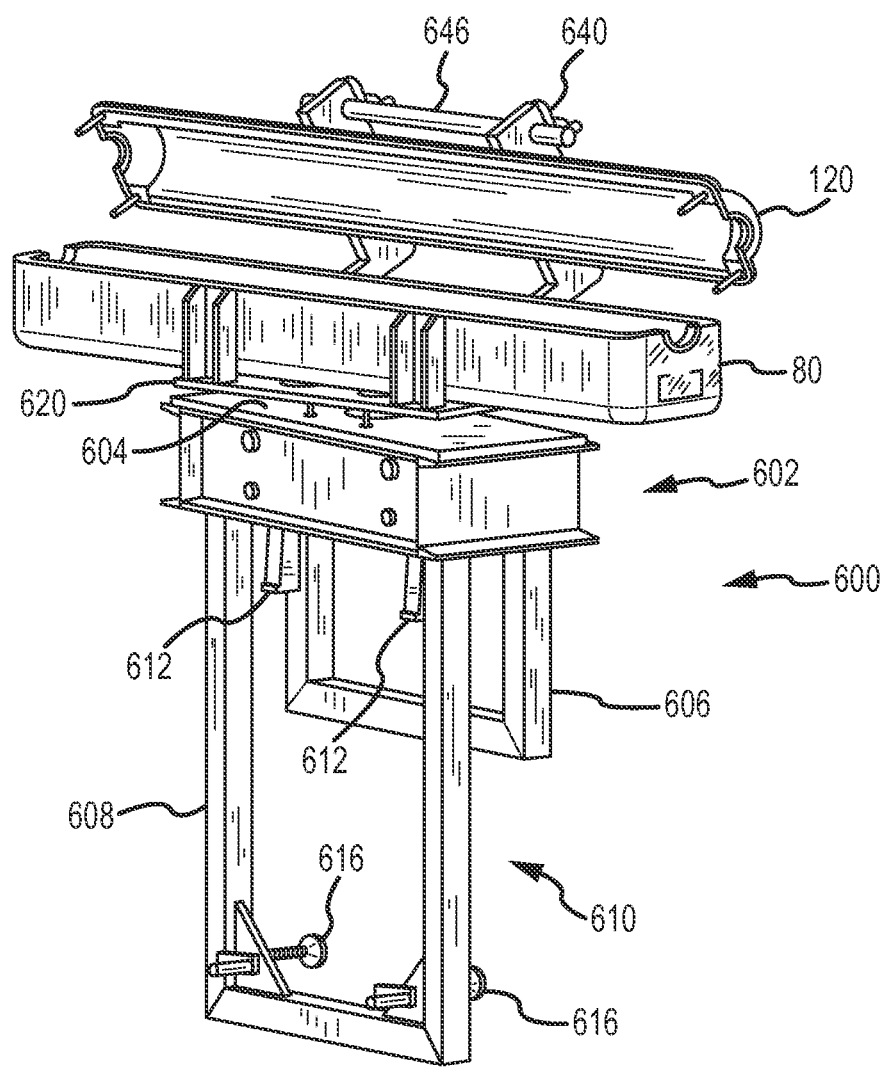
FIG. 14A is a perspective view of one embodiment of an installation fixture for installing a reactance module on a power line, with the upper cradle having been moved toward an open position.
Figure 14B:
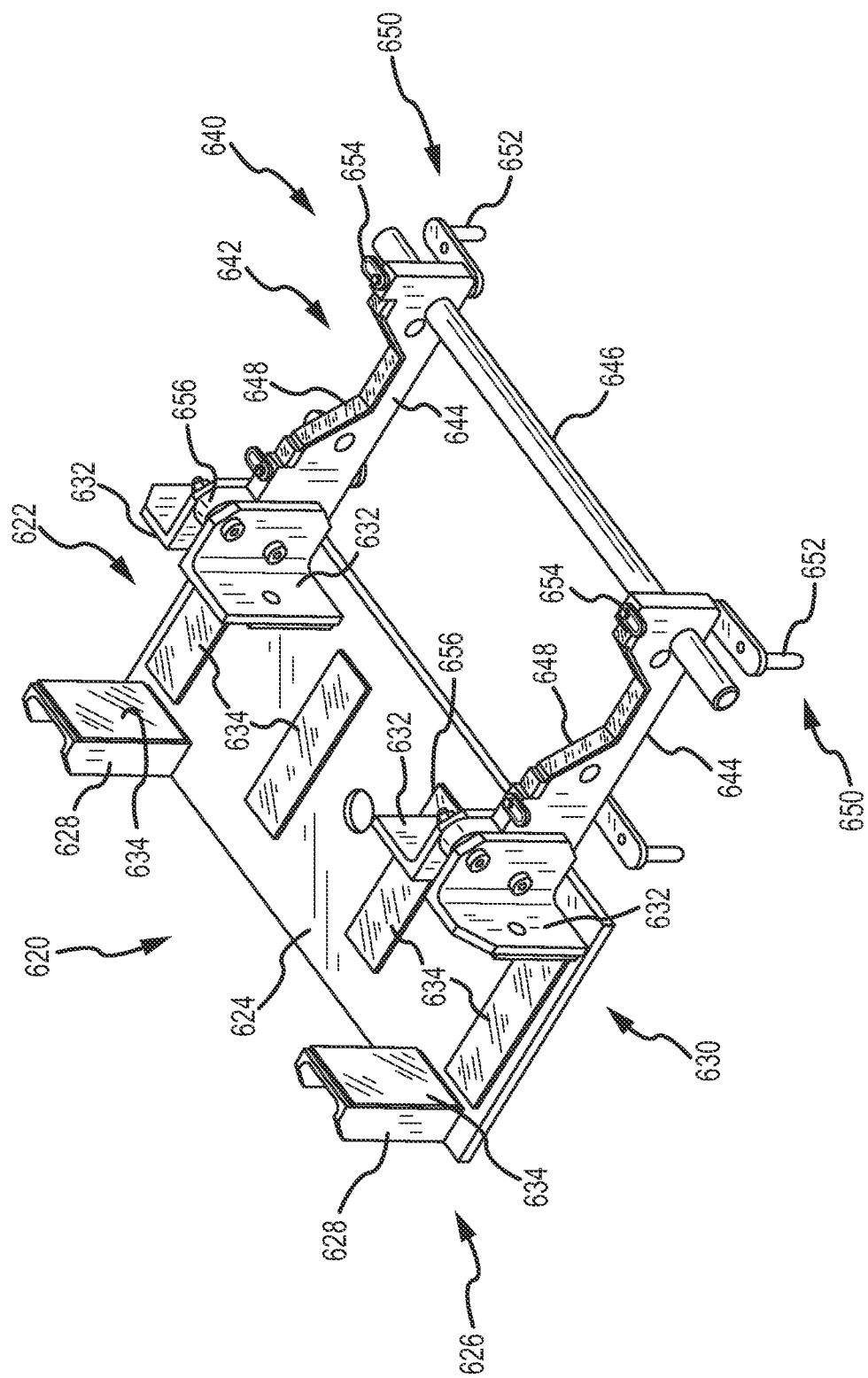
FIG. 14B is a perspective view of a lower cradle and upper cradle used by the installation fixture of FIG. 14A, with the upper cradle being in an open position.
Figure 14C:
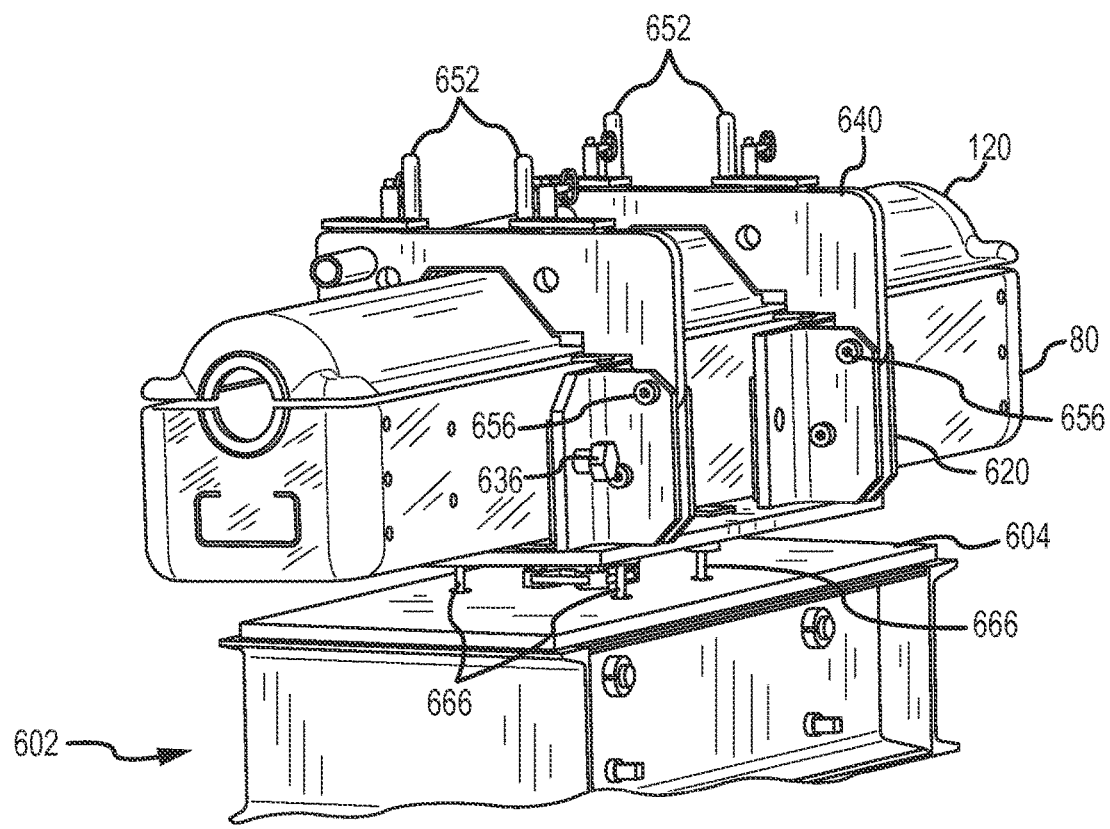
FIG. 14C is a perspective view of the installation fixture of FIG. 14A, with the upper cradle being in a closed position.
Figure 14D:
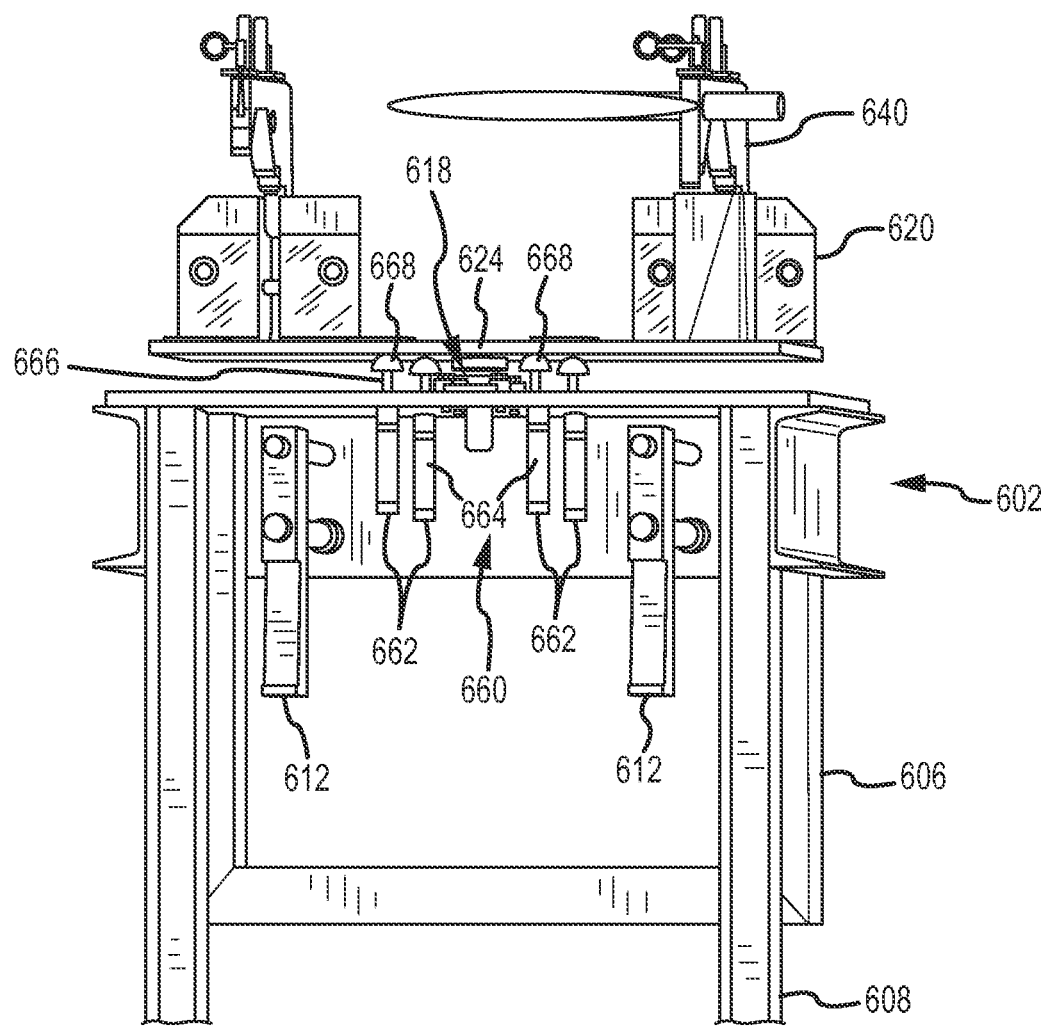
FIG. 14D is a perspective view that illustrates a spherical radial bearing between the lower cradle and a base of the installation fixture of FIG. 14A, as well as a positioning mechanism for accommodating adjustment of the position of the lower cradle relative to the base.

Referring now primarily to FIG. 14B, the lower cradle 620 includes a lower receptacle 622 for receiving the lower housing section 80 of a DSR 30 to be installed on a power line 16. This lower receptacle 622 is collectively defined by a base section 624, a first sidewall 626, and a second sidewall 630. Surfaces of the base section 624, the first sidewall 626, and the second sidewall 630 that define the lower receptacle 622 may each be flat or planar. In the illustrated embodiment, the first sidewall 626 is defined by a pair of side sections 628 that are spaced from one another in the length dimension of the lower receptacle 622 (the long axis of the lower receptacle 622). More than two side sections 628 could be utilized to define the first sidewall 626. The first sidewall 626 could also utilize a continuous structure.

The second sidewall 630 of the lower cradle 620 is defined by one pair of side sections 632 that are spaced from another pair of side sections 632 in the length dimension of the lower receptacle 622. More than four side sections 632 could be utilized to define the second sidewall 630. The second sidewall 630 could also utilize a continuous structure. In the illustrated embodiment, each side section 628 of the first sidewall 626 is disposed directly opposite of a corresponding pair of side sections 632 of the second sidewall 630 (e.g., one side section 628 of the first sidewall 626 and one pair of side sections 632 of the second sidewall 630 may be disposed along a common axis that is orthogonal to the long axis of the lower receptacle 622). Each pair of side sections 632 of the second sidewall 630 may provide for a pivotal connection with the upper cradle 640.

The lower cradle 620 may include at least one lower cradle pad 634 to provide a desired interface with the lower housing section 80 of the DSR 30 to be installed on a power line 16. Each lower cradle pad 634 may be formed from any appropriate material (e.g., silicone rubber). The base section 624 may include at least one lower cradle pad 634, and each of the first sidewall 626 and the second sidewall 630 may include at least one lower cradle pad 634. In the illustrated embodiment, the base section 624 includes a plurality of lower cradle pads 634 that are spaced along the long axis of the lower receptacle 622 (although any appropriate number of lower cradle pads 634 could be utilized for the base section 624, including a single lower cradle pad 634 that extends along the long axis of the lower receptacle 622 for at least a substantial portion of the length of the base section 624—not shown), each side section 628 of the first sidewall 626 includes a lower cradle pad 634, and each side section 632 of the second sidewall 630 includes a lower cradle pad 634. In one embodiment, contact between the lower cradle 620 and the lower housing section 80 of the DSR 30 is limited to each lower cradle pad 634 of the lower cradle 620.

Continuing to refer primarily to FIG. 14B, the upper cradle 640 is movably interconnected with the lower cradle 620. In the illustrated embodiment, the lower cradle 620 and the upper cradle 640 are pivotally connected—the upper cradle 640 may be moved relative to the lower cradle 620 about a single pivot axis (e.g., via a pivotal motion). In this regard, each of the two pairs of side sections 632 of the second sidewall 630 of the lower cradle 620 includes a pivot pin 656 for providing the pivotal connection between the lower cradle 620 and the upper cradle 640. Generally, the upper cradle 640 may be moved between open and closed positions. FIG. 14B is a representative open position, where the lower receptacle 622 of the lower cradle 620 and an upper receptacle 642 of the upper cradle 640 each project in a common direction (e.g., upwardly when positioning the installation fixture 600 relative to a power line 16 to install a DSR 30 on the power line 16). The upper cradle 640 may be moved to a closed position (e.g., FIG. 14C), where the upper receptacle 642 of the upper cradle 640 projects toward the lower receptacle 622 of the lower cradle 620. The lower cradle 620 and the upper cradle 640 may be characterized as collectively defining an enclosure when the upper cradle 640 is in its closed position.

The installation fixture 600 may utilize one or more locking pins 656a for selectively retaining the upper cradle 640 in its closed position, for instance to maintain the upper cradle 640 in a fixed position relative to the lower cradle 620. In one embodiment, a hole extends through each pair of adjacently disposed side sections 632 for the lower cradle 620, and a hole also extends through each of the cradle sections 644 of the upper cradle 640. When the upper cradle 640 is pivoted into its closed position, the hole through each cradle section 644 (upper cradle 640) should be aligned with the holes through the corresponding pair of side sections 632 (lower cradle 620) such that a locking pin 656a may be inserted therein.

The upper cradle 640 includes the noted upper receptacle 642 for receiving the upper housing section 120 of a DSR 30 to be installed on a power line 16. This upper receptacle 642 is collectively defined by a pair of cradle sections 644 that are spaced from one another along the long axis of the upper receptacle 642. A rod 646 may extend between the two cradle sections 644 to provide structural stability. Each cradle section 644 may include an upper cradle pad 648 to provide a desired interface with the upper housing section 120 of the DSR 30 to be installed on a power line 16. Each upper cradle pad 648 may be formed from any appropriate material (e.g., silicone rubber). In one embodiment, contact between the upper cradle 640 and the upper housing section 120 of the DSR 30 is limited to each upper cradle pad 648 of the upper cradle 640.

A lower housing section 80 of a DSR 30 may be positioned within the lower receptacle 622 of the lower cradle 620 when the upper cradle 640 is disposed in an open position (e.g., FIG. 14B). One or more lower retention members 636 (FIG. 14C) may be used to retain the lower housing section 80 within the lower receptacle 622. Each lower retention member 636 may extend through one of the side sections 632 of the second sidewall 630 of the lower cradle 620 and into the lower receptacle 622 to push the lower housing section 80 against the opposing side section 628 of the first sidewall 626. In one embodiment, each lower retention member 636 is in the form of a bolt that may engage/interact with a threaded hole that extends through the corresponding side section 632 of the second sidewall 630 of the lower cradle 620. At least one lower retention member 636 may be used for each side section 628 of the first sidewall 626 of the lower cradle 620. A separate lower retention member 626 could be used in conjunction with each side section 632 of the second sidewall 630.

An upper housing section 120 of a DSR 30 may be positioned within the upper receptacle 642 of the upper cradle 640 when the upper cradle 640 is disposed in an open position (e.g., FIG. 14B). One or more upper retention members 650 (e.g., FIG. 14B) may be used to retain the upper housing section 120 within the upper receptacle 642. In the illustrated embodiment, each upper retention member 650 includes a tab 654 and a corresponding handle 652. Each handle 652 may be used to rotate its corresponding tab 654 over the edge at the open end of the upper housing section 120 to secure the upper housing section 120 within the upper cradle 640. It may be desirable to be able to lock each handle 652 in a position that secures the upper housing section 120 within the upper cradle 640 (e.g., a quick release ball-lock pin).

Figure 14G:
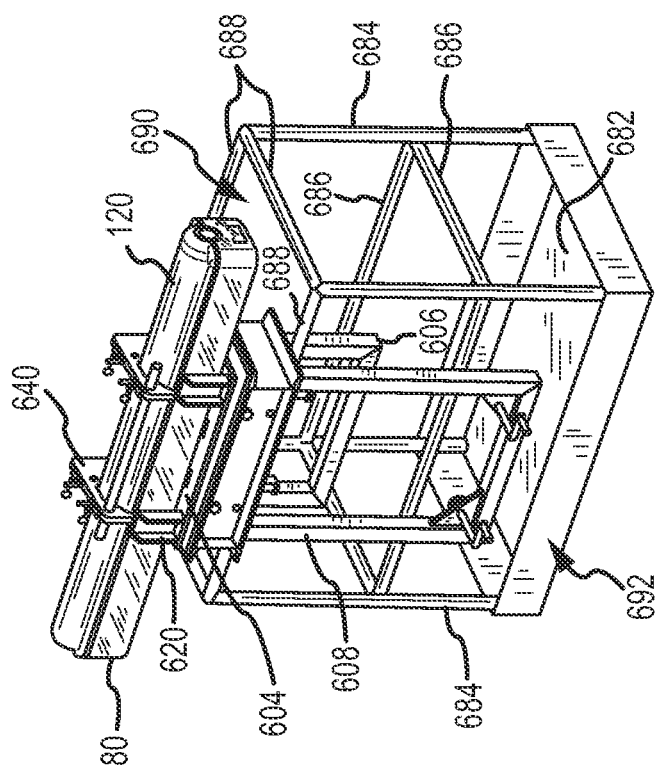
FIG. 14G is a perspective view of the installation fixture of FIG. 14A mounted on another type of worker carrier.
Figure 14E:
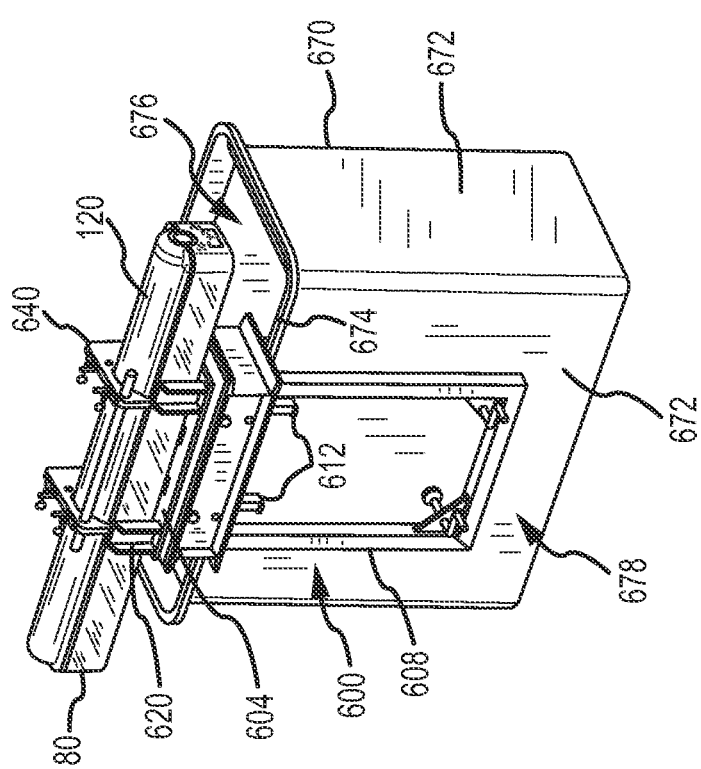
FIG. 14E is a perspective view of the installation fixture of FIG. 14A mounted on one type of worker carrier.
Figure 14F:
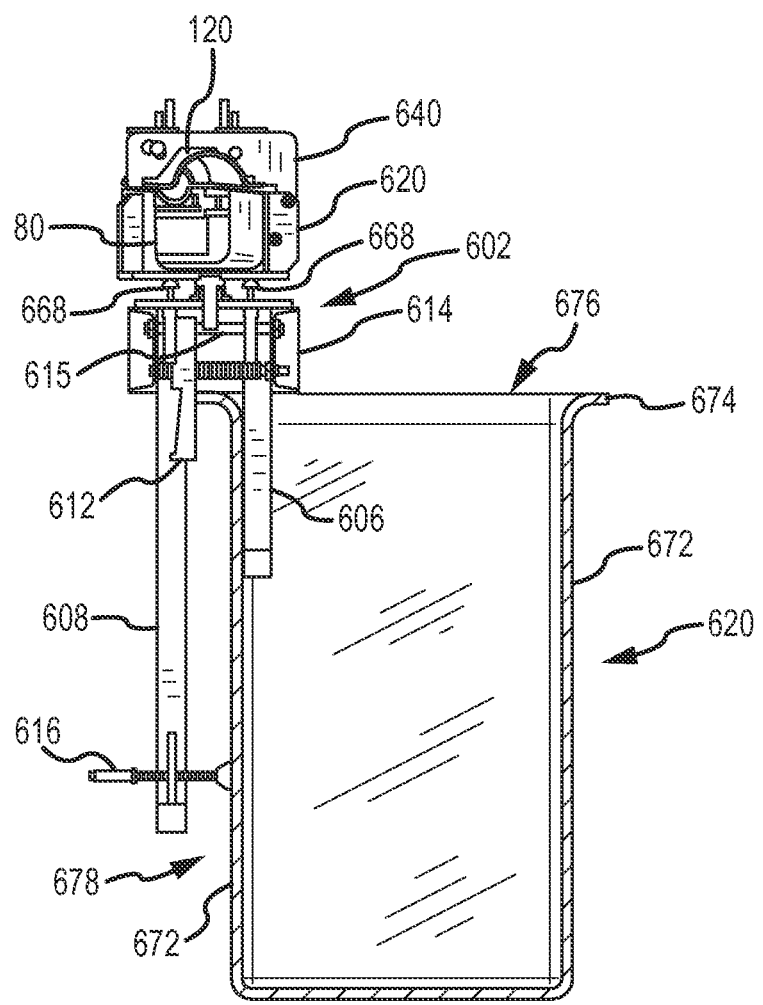
FIG. 14F is a cutaway view of the installation fixture and worker carrier of FIG. 14E.

FIGS. 14E and 14F illustrate the installation fixture 600 being installed on one type of worker carrier. Initially, it should be noted that the lower cradle 620 (along with the upper cradle 640) will typically be rotated 180° (about a vertical axis in the view shown in FIGS. 14E and 14F) from the position shown in FIGS. 14E and 14F when the worker carrier 670 is disposed in position to install a reactance module 30 on a power line 16. That is, the installation fixture 600 will typically be oriented relative to the worker carrier 670 such that the upper cradle 640 will pivot at least generally away from the worker carrier 670 when moving from the closed position to the open position (e.g., such that the upper cradle 640 will be disposed beyond the worker carrier 670 when the upper cradle 640 is in the open position shown in FIG. 14B). As such, a worker within the worker carrier 670 would then pull the upper cradle 640 at least generally back toward the worker carrier 670 to dispose the installation fixture 600 in its closed position (by pivoting the upper cradle 640 relative to the lower cradle 620).

The worker carrier 670 of FIGS. 14E and 14F is in the form of a bucket or basket having four sidewalls 672 that define a closed perimeter. The installation fixture 600 is positioned over the top edge 674 of one of the sidewalls 672, with the first frame section 606 being positioned within an interior 676 of the worker carrier 670 and with the second frame section 608 being positioned on the exterior 678 of the worker carrier 670. Each tightening fixture 612 may be positioned on the exterior 678 of the worker carrier 670 to engage the top edge 674 of the sidewall 672 on which the installation fixture 600 is being installed. Each tightening fixture 612 may be slidably mounted on a slide rod 615 and may threadably engage a lead screw 614. Each lead screw 614 may be rotated to move its corresponding tightening fixture 612 along the lead screw 614 and into the desired position. The screw clamps 616 may also be adjusted to dispose the installation fixture 600 in a desired position relative to the worker carrier 670 and/or to assist in securing the installation fixture 600 to the worker carrier 670. Once the tightening fixtures 612 and screw clamps 616 are in the proper position, the first frame section 606 of the installation fixture 600 should be at least substantially flush with a side of the sidewall 672 that is within the interior 676 of the worker carrier 670 so that the sidewall 672 is clamped between the first frame section 606 and the tightening fixtures 612/screw clamps 616. Note that the second frame section 608 is spaced from the sidewall 672 for this installation. Also, the screw clamps 616 are disposed at a lower elevation than the tightening fixtures 612 in the installed position (e.g., the screw clamps 616 and tightening fixtures 612 are offset in the vertical dimension, with the tightening fixtures 612 being between the screw clamps 616 and the lower cradle 620 in the vertical dimension).

Figure 14H:
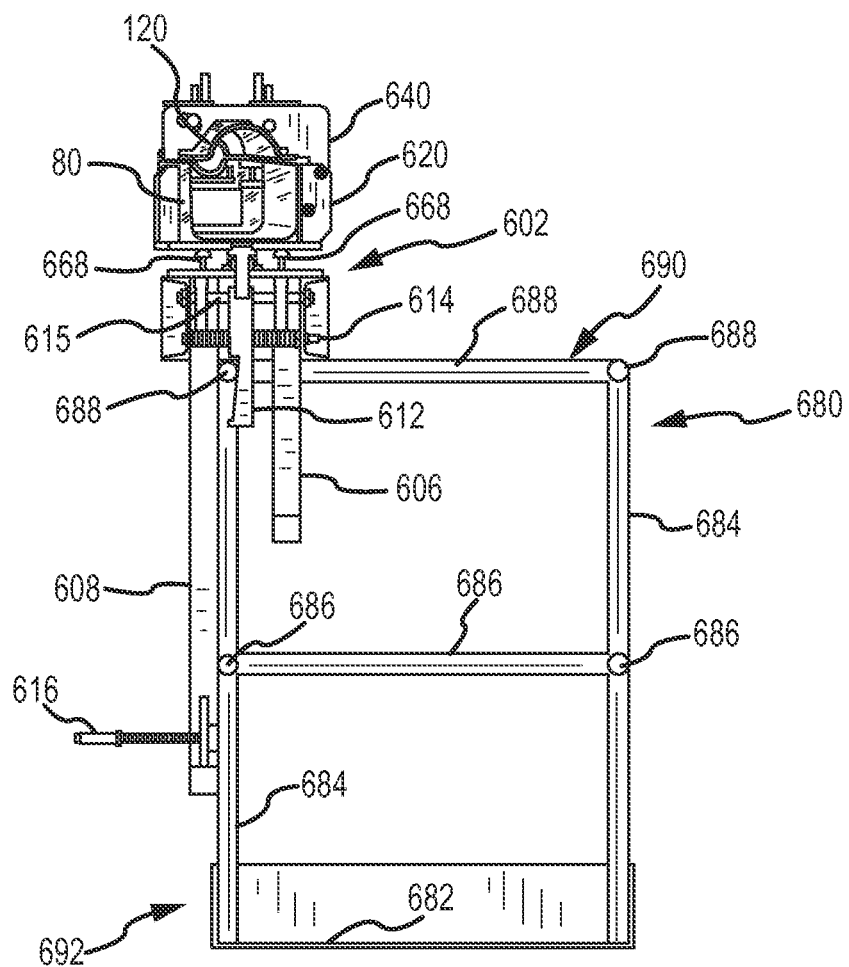
FIG. 14H is a cutaway view of the installation fixture and worker carrier of FIG. 14G.

FIGS. 14G and 14H illustrate the installation fixture 600 being installed on another type of worker carrier. The worker carrier 680 of FIGS. 14G and 14H is in the form of a bucket or basket having a base 682, four corner rails 685, four top rails 688 that collectively define a closed perimeter, and four mid rails 686 that collectively define a closed perimeter. Each top rail 688 and its corresponding mid rail 686 may be characterized as defining a sidewall for the worker carrier 680. More than one mid rail 686 could be provided for each of the four sidewalls of the worker carrier 680.

As in the case of the worker carrier 670 discussed above, it should be noted that the lower cradle 620 (along with the upper cradle 640) will typically be rotated 180° (about a vertical axis in the view shown in FIGS. 14G and 14H) from the position shown in FIGS. 14G and 14H when the worker carrier 680 is disposed in position to install a reactance module 30 on a power line 16. That is, the installation fixture 600 will typically be oriented relative to the worker carrier 680 such that the upper cradle 640 will pivot at least generally away from the worker carrier 680 when moving from the closed position to the open position (e.g., such that the upper cradle 640 will be disposed beyond the worker carrier 680 when the upper cradle 640 is in the open position shown in FIG. 14B). As such, a worker within the worker carrier 680 would then pull the upper cradle 640 at least generally back toward the worker carrier 680 to dispose the installation fixture 600 in its closed position (by pivoting the upper cradle 640 relative to the lower cradle 620).

The installation fixture 600 is positioned over one of the top rails 688 of one of the sidewalls of the worker carrier 680, with the first frame section 606 being positioned within an interior 690 of the worker carrier 680 and with the second frame section 608 being positioned on an exterior 692 of the worker carrier 680. In this case, each tightening fixture 612 may be positioned in the interior 690 of the worker carrier 680 to engage the top rail 688 of the sidewall on which the installation fixture 600 is being installed. Again, each tightening fixture 612 may be slidably mounted on a slide rod 615 and may threadably engage a lead screw 614. Each lead screw 614 may be rotated to move its corresponding tightening fixture 612 along the lead screw 614 and into the desired position. The screw clamps 616 may be fully retracted for this installation (e.g., so as to be flush with the second frame section 608). Once the tightening fixtures 612 and screw clamps 616 are in the proper position, the second frame section 608 of the installation fixture 600 should be at least substantially flush with a side of the sidewall that is on the exterior 692 of the worker carrier 680 (e.g., the second frame section 608 should be engaging a top rail 688 and at least one mid rail 686, all on the exterior 692 of the worker carrier 680) so that the sidewall is clamped between the second frame section 608/screw clamps 616 and the tightening fixtures 612.

Figure 15:
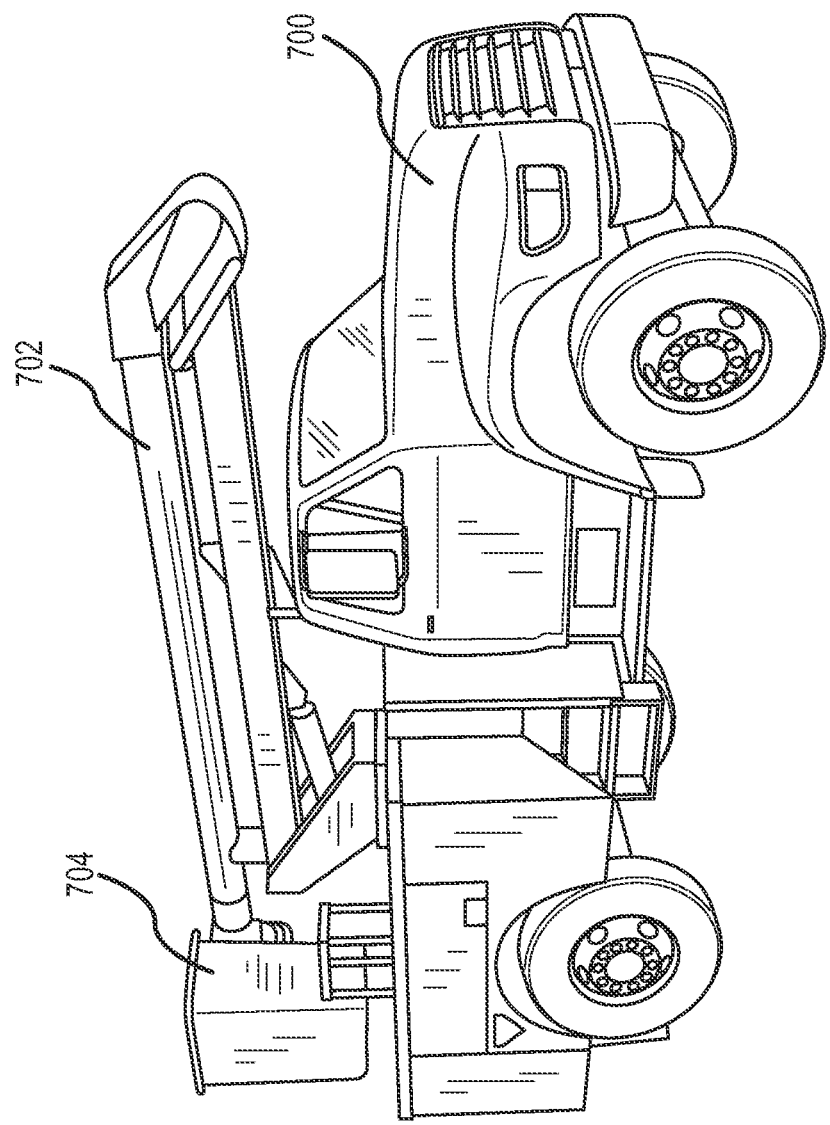
FIG. 15 is a perspective view of one embodiment of a bucket truck.

FIG. 15 illustrates one embodiment of what is commonly referred to as a bucket truck 700. The bucket truck has a boom 702 that may be raised/lowered. A bucket 704 (e.g., in the form of the worker carrier 670 or worker carrier 680) is disposed at or toward a free end of the boom 702. When the installation fixture 600 is installed on the bucket 704, the boom 702 may be raised to position the lower cradle 620 at least generally under the power line 16 on which a DSR 30 is to be installed. A lower housing section 80 may be installed and secured in the lower cradle 620 of the installation fixture 600 in the above-noted manner, and an upper housing section 120 may be installed and secured in the upper cradle 640 of the installation fixture 600 in the above-noted manner, prior to raising the boom 700 or at any other appropriate time in the installation process. In any case, once the lower cradle 620 is at least generally under the power line 16, the orientation of the lower cradle 620 may be adjusted relative to the base 602 in the above-noted manner (e.g., so as to match the "sag" or orientation of the power line 16 on which the DSR 30 is being installed; so that the orientation of the lower cradle 620 at least generally matches the orientation of the section of the power line 16 on which the DSR 30 is to be installed). Once in the desired orientation, the position of the lower cradle 620 may be locked or fixed relative to the base 602. The upper cradle 640 may then be pivoted from an open position (e.g., FIG. 14B) to a closed position (e.g., FIG. 14C) to capture the power line 16 between the lower housing section 80 and the upper housing section 120. The upper housing section 120 may then be secured to the lower housing section 80 (e.g., using one or more fasteners of any appropriate type). Thereafter, the installation fixture 600 may be disengaged from the now installed DSR 30 and then moved away from the installed DSR 30. Generally, the tabs 654 for the upper cradle 640 may be moved via their corresponding handle 652 to a disengaged position with the upper housing section 120, and the upper cradle 640 may be pivoted away from the upper housing section 120 and the lower cradle 620 (e.g. to an open position, for instance as shown in FIG. 14B). Fasteners that join the upper housing section 120 and the lower housing section 80 may be torqued after the upper cradle 640 has been moved away from the upper housing section 120 (but before the lower cradle 620 is moved away from the lower housing section 80). The lower retention members 636 for the lower cradle 620 may be disengaged from the lower housing section 80 at the appropriate time. Once the upper cradle 640 has been unlocked from the upper housing section 120 and the lower cradle 620 has been unlocked from the lower housing section 80, the position of the bucket 704 may be adjusted to move the installation fixture 600 away from the DSR 30, which is now installed on and supported by the power line 16.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed is:

1. An installation fixture for installing a device on a power line, comprising:
   a base;
   a lower cradle movably interconnected with said base and comprising a lower receptacle that is configured to receive a lower section of a first device to be mounted on a power line;
   an upper cradle comprising an upper receptacle that is configured to receive an upper section of a first device to be mounted on a power line, wherein said upper cradle is movable between open and closed positions, wherein said upper receptacle of said upper cradle is offset from said lower receptacle of said lower cradle when said upper cradle is in said open position, and wherein said upper receptacle of said upper cradle is aligned with and above said lower receptacle of said lower cradle when said upper cradle is in said closed position; and
   a connector between said base and said lower cradle, wherein said connector provides at least 3 degrees of freedom, wherein said connector allows said lower cradle to be tilted relative to said base about a first reference axis, wherein said connector allows said lower cradle to be tilted relative to said base about a second reference axis that is perpendicular to said first reference axis, and wherein said connector allows said lower cradle to be rotated relative to said base about a third reference axis that is perpendicular to a plane that contains said first reference axis and said second reference axis.

2. The installation fixture of claim 1, wherein said connector is a spherical radial bearing.

3. The installation fixture of claim 1, wherein said base comprises at least one base connector for detachably mounting said base to a worker carrier.

4. The installation fixture of claim 1, wherein said base comprises first and second frame sections and a platform, wherein said lower cradle is movably interconnected with said platform, wherein said first and second frame sections extend from said platform and are spaced from one another to define a mounting receptacle, wherein said first and second frame sections are disposed on one side of said platform, and wherein said lower cradle is disposed on an opposite side of said platform.

5. The installation fixture of claim 4, wherein a sidewall of a worker carrier is disposable in said mounting receptacle of said base, wherein said first frame section of said base is disposed on an interior side of said sidewall of said worker carrier, wherein said second frame section of said base is disposed on an exterior side of said sidewall of said worker carrier, and wherein said second frame section extends further away from said platform than said first frame section.

6. The installation fixture of claim 5, wherein said second frame section comprises at least one tightening fixture and at least one screw clamp, and wherein each said screw clamp is at a lower elevation than each said tightening fixture.

7. The installation fixture of claim 1, wherein said lower cradle is rotatable relative to said base and is tiltable relative to said base in any direction.

8. The installation fixture of claim 7, wherein a range of motion between said lower cradle and said base is at least 3° measured relative to a reference plane.

9. The installation fixture of claim 1, wherein said lower cradle comprises a base section and a first sidewall and a second sidewall that each extend upwardly from said base section and that are spaced from one another, wherein said base section and said first sidewall and second side wall collectively define said lower receptacle.

10. The installation fixture of claim 9, wherein said first sidewall comprises first and second side sections on one side of said lower receptacle, wherein said second sidewall comprises third and fourth side sections on an opposite side of said lower receptacle, wherein said first and second side sections are spaced along a length dimension of said lower receptacle, and wherein said third and fourth side sections are spaced along said length dimension of said lower receptacle.

11. The installation fixture of claim 9, wherein each surface of each of said base section, said first sidewall, and said second sidewall that collectively define said lower receptacle is flat.

12. The installation fixture of claim 9, wherein said base section comprises at least one lower cradle pad, wherein each of said first and second sidewalls comprises at least one said lower cradle pad, and wherein contact between said lower cradle and a lower section of a first device, positionable within said lower receptacle, is limited to each said lower cradle pad.

13. The installation fixture of claim 1, wherein said lower cradle comprises a plurality of lower retention members that are each extendable into said lower receptacle.

14. The installation fixture of claim 13, wherein each said lower retention member comprises a threaded member that is threadably connected with said lower cradle and that comprises a free end that is disposable within said lower receptacle.

15. The installation fixture of claim 1, further comprising:
a positioning mechanism between said base and said lower cradle, said positioning mechanism being disposable in a first configuration to allow an orientation of said lower cradle to be adjusted relative to said base, said positioning mechanism being disposable in a second configuration to maintain said lower cradle in a fixed orientation relative to said base.

16. The installation fixture of claim 15, wherein said positioning mechanism comprises a hydraulic circuit.

17. The installation fixture of claim 16, wherein said first configuration for said positioning mechanism accommodates flow throughout said hydraulic circuit, and wherein said second configuration for said positioning mechanism at least substantially precludes flow throughout said hydraulic circuit.

18. The installation fixture of claim 1, wherein said upper cradle is movably interconnected with said lower cradle.

19. The installation fixture of claim 1, wherein said upper cradle is pivotally connected to said lower cradle.

20. The installation fixture claim 1, wherein said lower receptacle of said lower cradle and said upper receptacle of said upper cradle each project at least generally upwardly when said upper cradle is in said open position, and wherein said upper receptacle of said upper cradle projects toward said lower receptacle of said lower cradle when said upper cradle is in said closed position.

21. The installation fixture of claim 1, wherein said upper and lower cradles collectively define an enclosure when said upper cradle is in said closed position.

22. The installation fixture of claim 1, wherein said upper cradle comprises first and second cradle sections that are spaced along a length dimension of said upper receptacle.

23. The installation fixture of claim 22, wherein contact between said upper cradle and an upper section of a first device, positionable within said upper receptacle, is limited to said first and second cradle sections.

24. The installation fixture of claim 22, wherein each of said first and second cradle sections comprises at least one upper cradle pad, wherein contact between said upper cradle and an upper section of a first device, positionable within said upper receptacle, is limited to each said upper cradle pad.

25. The installation fixture of claim 1, further comprising:
at least one upper retention member associated with said upper receptacle.

26. The installation fixture of claim 25, wherein each said upper retention member comprises a clamp, wherein each said clamp is movably interconnected with said upper cradle, wherein each said clamp is disposable in a locking position where said clamp extends into said upper receptacle, and wherein each said clamp is disposable in a loading position where said clamp is disposed outside of said upper receptacle.

27. An assembly comprising an installation fixture for installing a device on a power line, comprising: a base; a lower cradle movably interconnected with said base and comprising a lower receptacle that is configured to receive a lower section of a first device to be mounted on a power line; an upper cradle comprising an upper receptacle that is configured to receive an upper section of a first device to be mounted on a power line, wherein said upper cradle is movable between open and closed positions, wherein said upper receptacle of said upper cradle is offset from said lower receptacle of said lower cradle when said upper cradle is in said open position, and wherein said upper receptacle of said upper cradle is aligned with and above said lower receptacle of said lower cradle when said upper cradle is in said closed position; and a connector between said base and said lower cradle, wherein said connector provides at least 3 degrees of freedom, wherein said connector allows said lower cradle to be tilted relative to said base about a first reference axis, wherein said connector allows said lower cradle to be tilted relative to said base about a second reference axis that is perpendicular to said first reference axis, and wherein said connector allows of said lower cradle to be rotated relative to said base about a third reference axis that is perpendicular to a plane that contains said first reference axis and said second reference axis; of claim 1 and a reactance module, wherein said reactance module comprises a lower housing section retained within said lower receptacle of said lower cradle, and an upper housing section retained within said upper receptacle of said upper cradle.

28. The installation fixture of claim 1, further comprising:
a first configuration where said base is maintained in a fixed orientation, where said lower cradle is disposable in each of a plurality of different orientations relative to said base, and where said lower cradle is maintainable in each orientation of said plurality of different orientations.

29. An installation fixture for installing a device on a power line, comprising:
a base;
a lower cradle comprising a lower receptacle that is configured to receive a lower section of a first device to be mounted on a power line;
an upper cradle comprising an upper receptacle that is configured to receive an upper section of a first device to be mounted on a power line, wherein said upper cradle is movable between open and closed positions, wherein said upper receptacle of said upper cradle is offset from said lower receptacle of said lower cradle when said upper cradle is in said open position, and wherein said upper receptacle of said upper cradle is aligned with and above said lower receptacle of said lower cradle when said upper cradle is in said closed position; and
a spherical radial bearing disposed between and interconnecting said base with said lower cradle, wherein said spherical radial bearing allows said lower cradle to move relative to said base in at least 3 different dimensions.

30. The installation fixture of claim 29, further comprising:
a first configuration where said base is maintained in a fixed orientation, where said lower cradle is disposable in each of a plurality of different orientations relative to said base, and where said lower cradle is maintainable in each orientation of said plurality of different orientations.

\* \* \* \* \*

UNITED STATES PATENT AND TRADEMARK OFFICE
CERTIFICATE OF CORRECTION

PATENT NO. : 9,843,176 B2
APPLICATION NO. : 14/732992
DATED : December 12, 2017
INVENTOR(S) : Gibson et al.

Page 1 of 1

It is certified that error appears in the above-identified patent and that said Letters Patent is hereby corrected as shown below:

In the Claims

Column 44, Line 52 (Line 5 of Claim 9), delete "and second" and insert therefore --and said second--

Signed and Sealed this
Eighth Day of May, 2018

Andrei Iancu
*Director of the United States Patent and Trademark Office*